(12) United States Patent
Mirkin et al.

(10) Patent No.: US 7,524,534 B2
(45) Date of Patent: Apr. 28, 2009

(54) METHODS UTILIZING SCANNING PROBE MICROSCOPE TIPS AND PRODUCTS THEREFOR OR PRODUCED THEREBY

(75) Inventors: Chad A. Mirkin, Wilmette, IL (US); Richard Piner, Des Plaines, IL (US); Seunghun Hong, Chicago, IL (US)

(73) Assignee: Northwestern University, Evanston, IL (US)

( * ) Notice: Subject to any disclaimer, the term of this patent is extended or adjusted under 35 U.S.C. 154(b) by 192 days.

(21) Appl. No.: 10/937,877

(22) Filed: Sep. 10, 2004

(65) Prior Publication Data

US 2005/0181132 A1 Aug. 18, 2005

Related U.S. Application Data

(63) Continuation of application No. 10/212,217, filed on Aug. 6, 2002, now abandoned, which is a continuation of application No. 09/866,533, filed on May 24, 2001, now Pat. No. 6,827,979, which is a continuation-in-part of application No. 09/477,997, filed on Jan. 5, 2000, now Pat. No. 6,635,311.

(60) Provisional application No. 60/207,711, filed on May 26, 2000, provisional application No. 60/207,713, filed on May 26, 2000, provisional application No. 60/157,633, filed on Oct. 4, 1999, provisional application No. 60/115,133, filed on Jan. 7, 1999.

(51) Int. Cl.
*B05D 1/26* (2006.01)

(52) U.S. Cl. .................. 427/258; 427/301; 427/333; 977/857; 977/884; 977/885; 977/886

(58) Field of Classification Search ...................... None
See application file for complete search history.

(56) References Cited

OTHER PUBLICATIONS

Jaschke et al., "Deposition of Organic Material by the Tip of a Scanning Force Microscope," Langmuir, 1995, 11 (4), 1061-1064.*
Mirkin et al., "Effect of Water on Lateral Force Microscopy in Air," Langmuir, 1997, 13 (26), 6864-6868.*

* cited by examiner

*Primary Examiner*—William Phillip Fletcher, III
(74) *Attorney, Agent, or Firm*—Foley & Lardner LLP

(57) ABSTRACT

The invention provides a lithographic method referred to as "dip pen" nanolithography (DPN), which utilizes a scanning probe microscope (SPM) tip (e.g., an atomic force microscope (AFM) tip) as a "pen," a solid-state substrate (e.g., gold) as "paper," and molecules with a chemical affinity for the solid-state substrate as "ink." Capillary transport of molecules from the SPM tip to the solid-state substrate is used in DPN to directly write patterns consisting of a relatively small collection of molecules in submicrometer dimensions, making DPN useful in the fabrication of a variety of microscale and nanoscale devices. The invention also provides substrates patterned by DPN, including submicrometer combinatorial arrays, and kits, devices and software for performing DPN. The invention further provides a method of performing AFM imaging in air. The method comprises coating an AFM tip with a hydrophobic compound, the hydrophobic compound being selected so that AFM imaging performed using the coated AFM tip is improved compared to AFM imaging preformed using an uncoated AFM tip. Finally, the invention provides AFM tips coated with the hydrophobic compounds.

12 Claims, 29 Drawing Sheets

FIG. 2A
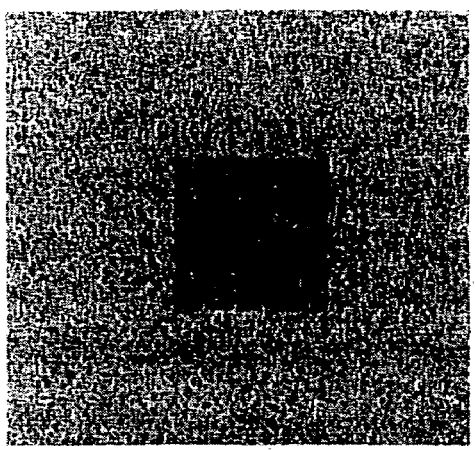
0        μm        3
FIG. 2B
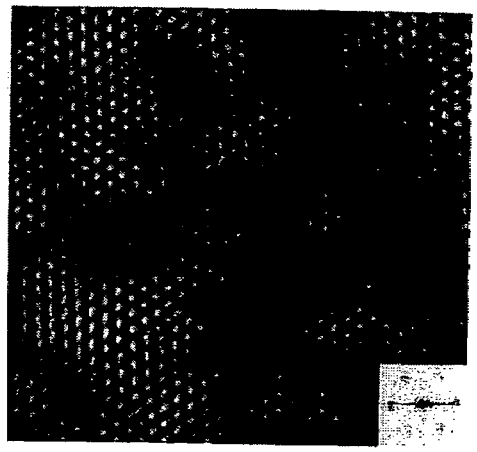
0        Å        150
0        μm        1
FIG. 2C
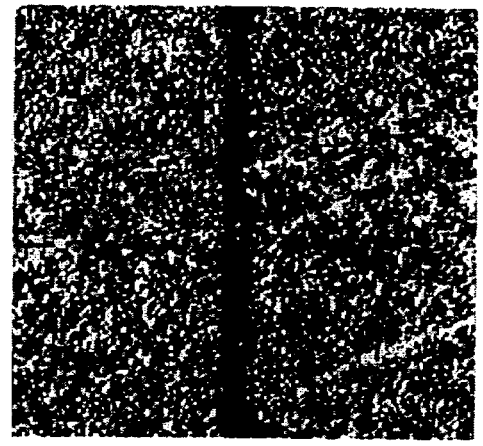
0        μm        2
FIG. 2D FIG. 3A
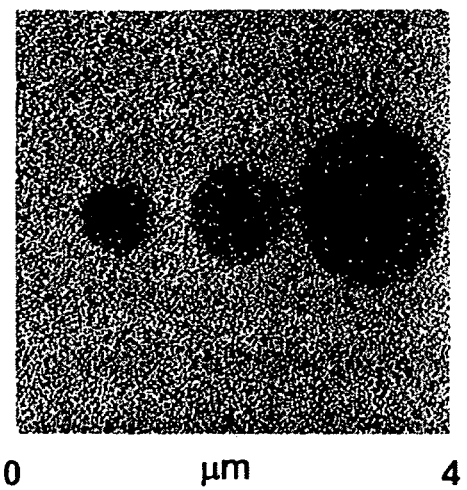
0    μm    4
FIG. 3B
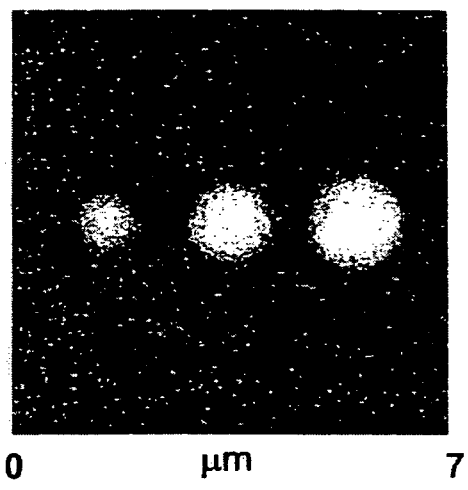
0    μm    7
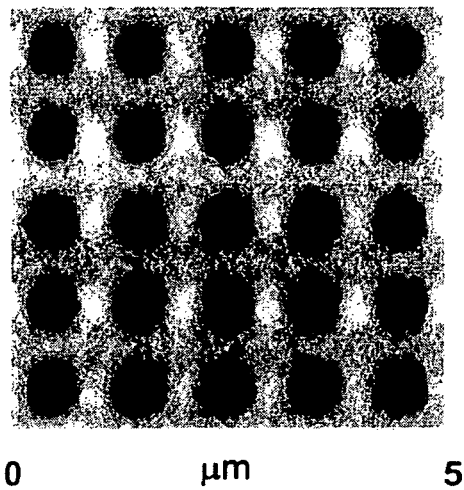
0    μm    5
FIG. 3C
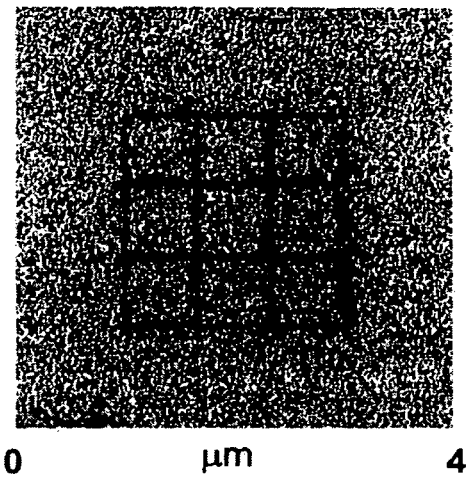
0    μm    4
FIG. 3D 0    µm    10

0    µm    10

FIG. 7A
FIG. 7B
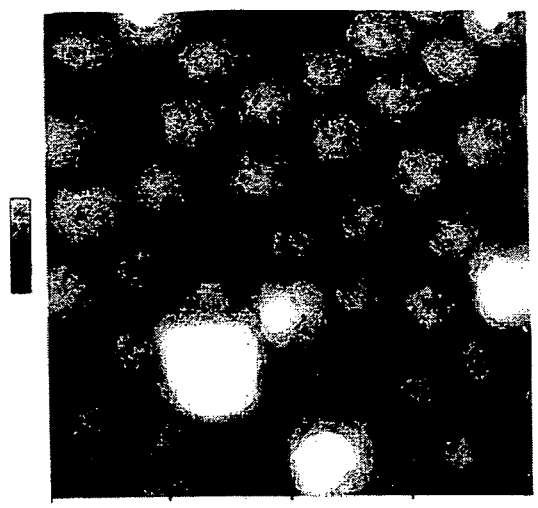
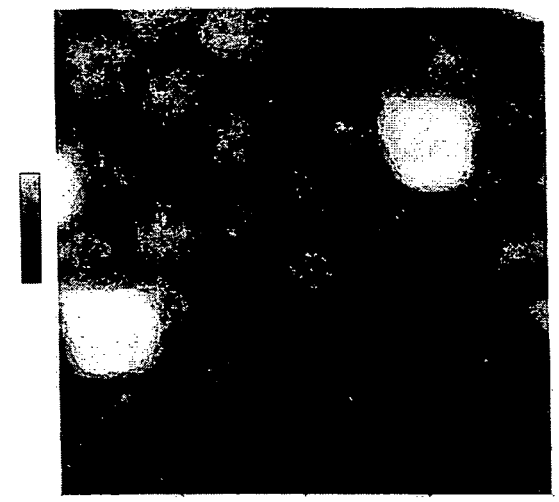

(a)

(b)

(c)

Mounted Single Tip

**A Wafer of
Unmounted AFM Tips**

**An Imaging Tip with
Laser Force Feedback**

**Writing Tips without
Laser Force Feedback**

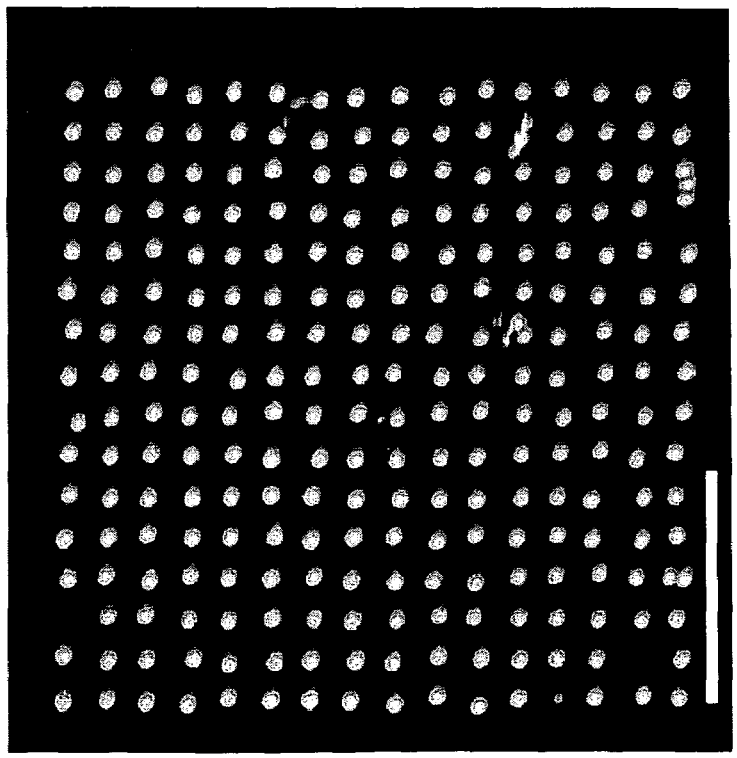
FIG. 27A
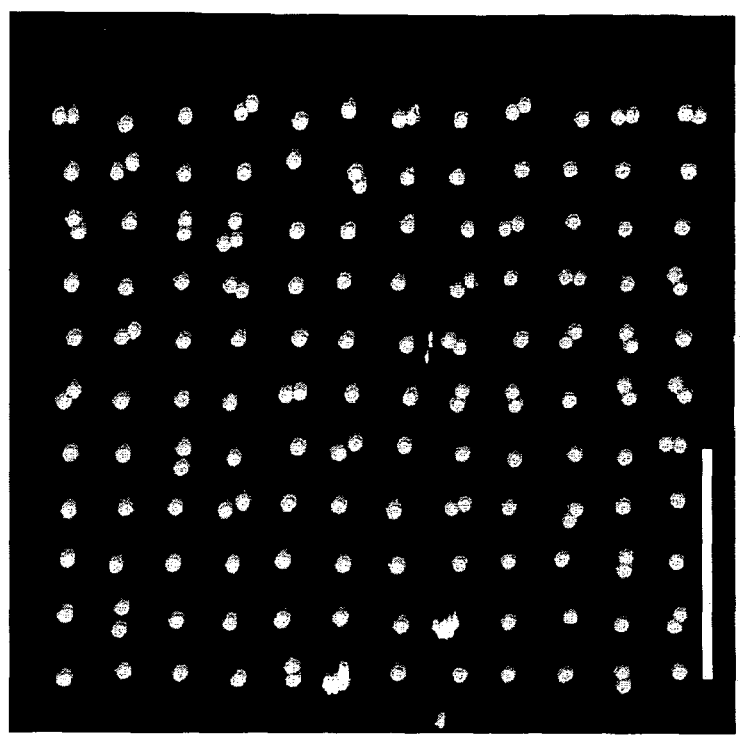
FIG. 27B
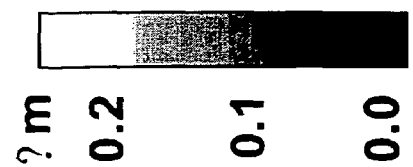

METHODS UTILIZING SCANNING PROBE MICROSCOPE TIPS AND PRODUCTS THEREFOR OR PRODUCED THEREBY

This application is a continuation application of Ser. No. 10/212,217 filed Aug. 6, 2002, the complete disclosure of which is incorporated by reference in its entirety; which is a continuation application of Ser. No. 09/866,533 filed May 24, 2001, the complete disclosure of which is incorporated by reference in its entirety; which claims priority to provisional applications 60/207,711 and 60/207,713 filed May 26, 2000, the complete disclosures of which are incorporated by reference in their entirety; Ser. No. 09/866,533 also is a continuation-in-part of Ser. No. 09/477,997 filed Jan. 5, 2000, the complete disclosure of which is incorporated by reference in its entirety; which claims priority to provisional applications 60/115,133 filed Jan. 7, 1999 and 60/157,633 filed Oct. 4, 1999, the complete disclosures of which are incorporated by reference in their entirety.

This invention was made with government support under grant F49620-96-1-055 from the Air Force Office Of Science Research. The government has rights in the invention.

FIELD OF THE INVENTION

This invention relates to methods of microfabrication and nanofabrication. The invention also relates to methods of performing atomic force microscope imaging.

BACKGROUND OF THE INVENTION

Lithographic methods are at the heart of modern day microfabrication, nanotechnology and molecular electronics. These methods often rely on patterning a resistive film, followed by a chemical etch of the substrate.

Dip pen technology, where ink on a sharp object is transported to a paper substrate by capillary forces, is approximately 4000 years old. Ewing, *The Fountain Pen: A Collector's Companion* (Running Press Book Publishers, Philadelphia, 1997). It has been used extensively throughout history to transport molecules on macroscale dimensions.

By the present invention, these two related but, with regard to scale and transport mechanism, disparate concepts have been merged to create "dip pen" nanolithography (DPN). DPN utilizes a scanning probe microscope (SPM) tip (e.g., an atomic force microscope (AFM) tip) as a "nib" or "pen," a solid-state substrate (e.g., gold) as "paper," and molecules with a chemical affinity for the solid-state substrate as "ink." Capillary transport of molecules from the tip to the solid substrate is used in DPN to directly write patterns consisting of a relatively small collection of molecules in submicrometer dimensions.

DPN is not the only lithographic method that allows one to directly transport molecules to substrates of interest in a positive printing mode. For example, microcontact printing, which uses an elastomer stamp, can deposit patterns of thiol-functionalized molecules directly onto gold substrates. Xia et al., *Angew. Chem. Int. Ed. Engl.*, 37:550 (1998); Kim et al., *Nature*, 376:581 (1995); Xia et al., *Science*, 273:347 (1996); Yan et al., *J. Am. Chem. Soc.*, 120:6179 (1998); Kumar et al., *J. Am. Chem. Soc.*, 114:9188 (1992). This method is a parallel technique to DPN, allowing one to deposit an entire pattern or series of patterns on a substrate of interest in one step. In contrast, DPN allows one to selectively place different types of molecules at specific sites within a particular type of nanostructure. In this regard, DPN complements microcontact printing and many other existing methods of micro- and nano-fabrication.

There are also a variety of negative printing techniques that rely on scanning probe instruments, electron beams, or molecular beams to pattern substrates using self-assembling monolayers and other organic materials as resist layers (i.e., to remove material for subsequent processing or adsorption steps). Bottomley, *Anal. Chem.*, 70:425R (1998); Nyffenegger et al., *Chem. Rev.*, 97:1195 (1997); Berggren et al., *Science*, 269:1255 (1995); Sondag-Huethorst et al., *Appl. Phys. Lett.*, 64:285 (1994); Schoer et al., *Langmuir*, 13:2323 (1997); Xu et al., *Langmuir*, 13:127 (1997); Perkins et al., *Appl. Phys. Lett.*, 68:550 (1996); Carr et al., *J. Vac. Sci. Technol. A*, 15:1446 (1997); Lercel et al., *Appl. Phys. Lett.*, 68:1504 (1996); Sugimura et al., *J. Vac. Sci. Technol. A*, 14:1223 (1996); Komeda et al., *J. Vac. Sci. Technol. A*, 16:1680 (1998); Muller et al., *J. Vac. Sci. Technol. B*, 13:2846 (1995); Kim et al., *Science*, 257:375 (1992). However, DPN can deliver relatively small amounts of a molecular substance to a substrate in a nanolithographic fashion that does not rely on a resist, a stamp, complicated processing methods, or sophisticated noncommercial instrumentation.

A problem that has plagued AFM since its invention is the narrow gap capillary formed between an AFM tip and sample when an experiment is conducted in air which condenses water from the ambient and significantly influences imaging experiments, especially those attempting to achieve nanometer or even angstrom resolution. Xu et al., *J. Phys. Chem. B*, 102:540 (1998); Binggeli et al., *Appl. Phys. Lett*, 65:415 (1994); Fujihira et al., *Chem. Lett.*, 499 (1996); Piner et al., *Langmuir*, 13:6864 (1997). It has been shown that this is a dynamic problem, and water, depending upon relative humidity and substrate wetting properties, will either be transported from the substrate to the tip or vice versa. In the latter case, metastable, nanometer-length-scale patterns, could be formed from very thin layers of water deposited from the AFM tip (Piner et al., *Langmuir*, 13:6864 (1997)). The present invention shows that, when the transported molecules can anchor themselves to the substrate, stable surface structures are formed, resulting in a new type of nanolithography, DPN.

The present invention also overcomes the problems caused by the water condensation that occurs when performing AFM. In particular, it has been found that the resolution of AFM is improved considerably when the AFM tip is coated with certain hydrophobic compounds prior to performing AFM.

SUMMARY OF THE INVENTION

As noted above, the invention provides a method of lithography referred to as "dip pen" nanolithography, or DPN. DPN is a direct-write, nanolithography technique by which molecules are delivered to a substrate of interest in a positive printing mode. DPN utilizes a solid substrate as the "paper" and a scanning probe microscope (SPM) tip (e.g., an atomic force microscope (AFM) tip) as the "pen". The tip is coated with a patterning compound (the "ink"), and the coated tip is contacted with the substrate so that the patterning compound is applied to the substrate to produce a desired pattern. The molecules of the patterning compound are delivered from the tip to the substrate by capillary transport. DPN is useful in the fabrication of a variety of microscale and nanoscale devices. The invention also provides substrates patterned by DPN, including combinatorial arrays, and kits, devices and software for performing DPN.

The invention further provides a method of performing AFM imaging in air. The method comprises coating an AFM tip with a hydrophobic compound. Then, AFM imaging is performed in air using the coated tip. The hydrophobic compound is selected so that AFM imaging performed using the coated AFM tip is improved compared to AFM imaging performed using an uncoated AFM tip. Finally, the invention provides AFM tips coated with the hydrophobic compounds.

BRIEF DESCRIPTION OF THE DRAWINGS

FIG. 2A. Lateral force image of a 1 µm by 1 µm square of ODT deposited onto a Au substrate by DPN. This pattern was generated by scanning the 1 µm$^2$ area at a scan rate of 1 Hz for a period of 10 mm at a relative humidity of 39%. Then the scan size was increased to 3 µm. and the scan rate was increased to 4 Hz while recording the image. The faster scan rate prevents ODT transport.

FIG. 2B. Lattice resolved, lateral force image of an ODT self-assembling monolayer (SAM) deposited onto a Au(111)/mica substrate by DPN. The image has been filtered with a fast fourier transform (FFT), and the FFT of the raw data is shown in the lower right insert. The monolayer was generated by scanning a 1000 Å square area of the Au(111)/mica substrate five times at a rate of 9 Hz under 39% relative humidity.

FIG. 2C. Lateral force image of 30 nm wide line (3 µm long) deposited onto a Au/mica substrate by DPN. The line was generated by scanning the tip in a vertical line repeatedly for five minutes at a scan rate of 1 Hz.

FIG. 2D. Lateral force image of a 100 nm line deposited on a Au substrate by DPN. The method of depositing this line is analogous to that used to generate the image in FIG. 2C, but the writing time was 1.5 minutes. Note that in all images (FIGS. 2A-2D), darker regions correspond to areas of relatively lower friction.

FIG. 3A. Lateral force image of a Au substrate after an AFM tip, which has been coated with ODT, has been in contact with the substrate for 2, 4, and 16 min (left to right). The relative humidity was held constant at 45%, and the image was recorded at a scan rate of 4 Hz.

FIG. 3B. Lateral force image of 16-mercaptohexadecanoic acid (MHDA) dots on a Au substrate. To generate the dots, a MHDA-coated AFM tip was held on the Au substrate for 10, 20, and 40 seconds (left to right). The relative humidity was 35%. Note that the transport properties of MHDA and ODT differ substantially.

FIG. 3C. Lateral force image of an array of dots generated by DPN. Each dot was generated by holding an ODT-coated tip in contact with the surface for ~20 seconds. Writing and recording conditions were the same as in FIG. 3A.

FIG. 3D. Lateral force image of a molecule-based grid. Each line, 100 nm in width and 2 µm in length, required 1.5 minutes to write.

FIG. 7A-B. Topographic images of latex spheres, showing no changes before and after modifying tip with 1-dodecylamine. Height bars are 0.1 µm. FIG. 7A was recorded with a clean tip, and FIG. 7B was recorded with the same tip coated with 1-dodecylamine.

FIG. 8A shows the topography of a $Si_3N_4$ wafer surface that has been coated with the 1-dodecylamine molecules, which has similar features as before coating. Height bar is 700 Å. FIG. 8B shows the same area recorded in lateral force mode, showing no distinctive friction variation.

FIG. 9A shows a first pattern of 15 nm diameter 1,16-mercaptohexadecanoic acid (MHA) dots on Au (111) imaged by LFM with the MHA-coated tip used to make the dots. FIG. 9B shows a second pattern written by DPN using a coordinate for the second pattern calculated based on the LFM image of the first pattern shown in FIG. 9A. FIG. 9C shows the final pattern comprising both the first and second patterns. The elapsed time between forming the two patterns was 10 minutes.

FIG. 10A shows a first pattern comprised of 50 nm width lines and alignment marks generated with MHA molecules by DPN. FIG. 10B shows a second pattern generated with ODT molecules. The coordinates of the second pattern were adjusted based on the LFM image of the MHA alignment pattern. The first line patterns were not imaged to prevent the possible contamination by the second molecules. FIG. 10C shows the final results comprising interdigitated 50 nm width lines separated by 70 nm.

FIG. 13A: AFM topography image after treatment of wafer patterned with 4 dots of 2 second deposition time. Pillar height is 55 nm. The identification letter and top diameter (nm) are the following: A, 65; B, 110; C, 75; D, 105. Recorded at a scan rate of 2 Hz. FIG. 13B: The AFM topography image of a pillar on the same chip. Pillar height is 55 nm. Recorded at a scan rate of 1 Hz. FIG. 13C: The cross-sectional trace of the AFM topography image through the pillar diameter.

FIG. 14A: AFM topography image after treatment of wafer patterned with 3 lines of ODT at a rate of 0.4 μm/second. Line height is 55 nm. Recorded at a rate of 0.5 Hz. FIG. 14B: AFM topography image of a line on the same chip. Line height is 55 mm. Recorded at a rate of 0.5 Hz. FIG. 14C: Cross-sectional topography trace of the line.

FIG. 15A: An ODT-coated AFM tip was held in contact with the surface for various times to generate ODT dots of increasing size. Three-dimensional features with a height of 80 nm were yielded after etching. The identification letter, time of ODT deposition (seconds), estimated diameter of ODT dot (nm), top diameter after etching (nm), and base diameter after etching (nm) are the following: A, 0.062, 90, 147, 514; B, 0.125, 140, 176, 535; C, 0.25, 195, 253, 491; D, 0.5, 275, 314, 780; E, 1, 390, 403, 892; F, 2, 555, 517, 982; G, 4, 780, 770, 1120; H, 8, 1110, 1010, 1430; I, 16, 1565, 1470, 1910. FIG. 15B: SEM of same pillars. FIG. 15C: Top diameter plotted as a function of ODT deposition time.

FIG. 16A: The AFM topography image of lines on the same chip as used for preparation of the pillars shown in FIG. 15. An ODT-coated AFM tip was used to generate lines on the surface with various speeds to generate various sized ODT lines. The three-dimensional features shown in FIG. 16A with a height of 80 nm were yielded after etching. The identification letter, speed of ODT deposition (μm/second), top line width after etching (nm), and base width are the following: A, 2.8, 45, 45, 213; B, 50, 2.4, 70, 402; C, 60, 2.0, 75, 420; D, 1,6, 75, 90, 430; F, 1.2, 100, 120, 454; F, 150, 0.8, 150, 488; G, 0.4, 300, 255, 628, H, 0.2, 600, 505, 942. FIG. 16B: SEM of the same lines.

FIG. 20A: Two nearly identical ODT patterns generated on Au in parallel fashion with a two pen cantilever. FIG. 20B: Two nearly identical patterns generated on Au in parallel fashion with a two pen cantilever, each pen being coated with a different ink. The pattern on the left is generated from an MHA-coated tip and exhibits a higher lateral force than the Au substrate. The pattern on the right was generated with an ODT coated tip and exhibits a lower lateral force than the Au substrate.

FIG. 21A: Two-ink, cross-shaped pattern (ODT vertical lines and MHA horizontal lines) with an MHA dot in the center of the pattern (note the circular shape of the dot). FIG. 21B: A molecular cross-shaped corral made of ODT. MHA molecules introduced into the center of the corral diffuse from the center of the corral but are blocked when they reach the 80 nm-wide ODT walls. Note the convex shape of the MHA ink within the molecular corral due to the different wetting properties of the gold substrate and hydrophobic corral. FIG. 21C: A molecular cross-shaped corral, where the horizontal lines are comprised of MHA and the vertical lines are comprised of ODT. Note that the MHA, which is introduced in the center of the corral, diffuses over the walls of the corral comprised of MHA but remains confined within the walls comprised of ODT. Also, note that the MI-IA structure within the corral assumes a concave shape where the sidewalls are made of MHA (horizontal black arrow) and a convex shape where the sidewalls are made of ODT (vertical black arrow).

FIGS. 27A-B: Two regions of a gold substrate with 190 nm amidine-modified polystyrene particles selectively organized on MHA regions of the patterned surface, imaged by intermittent-contact AFM. FIG. 27A—single particle array formed on 300 nm MHA dots. FIG. 27B single particle array formed on 700 nm diameter MHA dots. Also, note that the AFM tip in some case drags the particles from their preferred locations.

DETAILED DESCRIPTION OF THE PRESENTLY PREFERRED EMBODIMENTS

Figure 1:
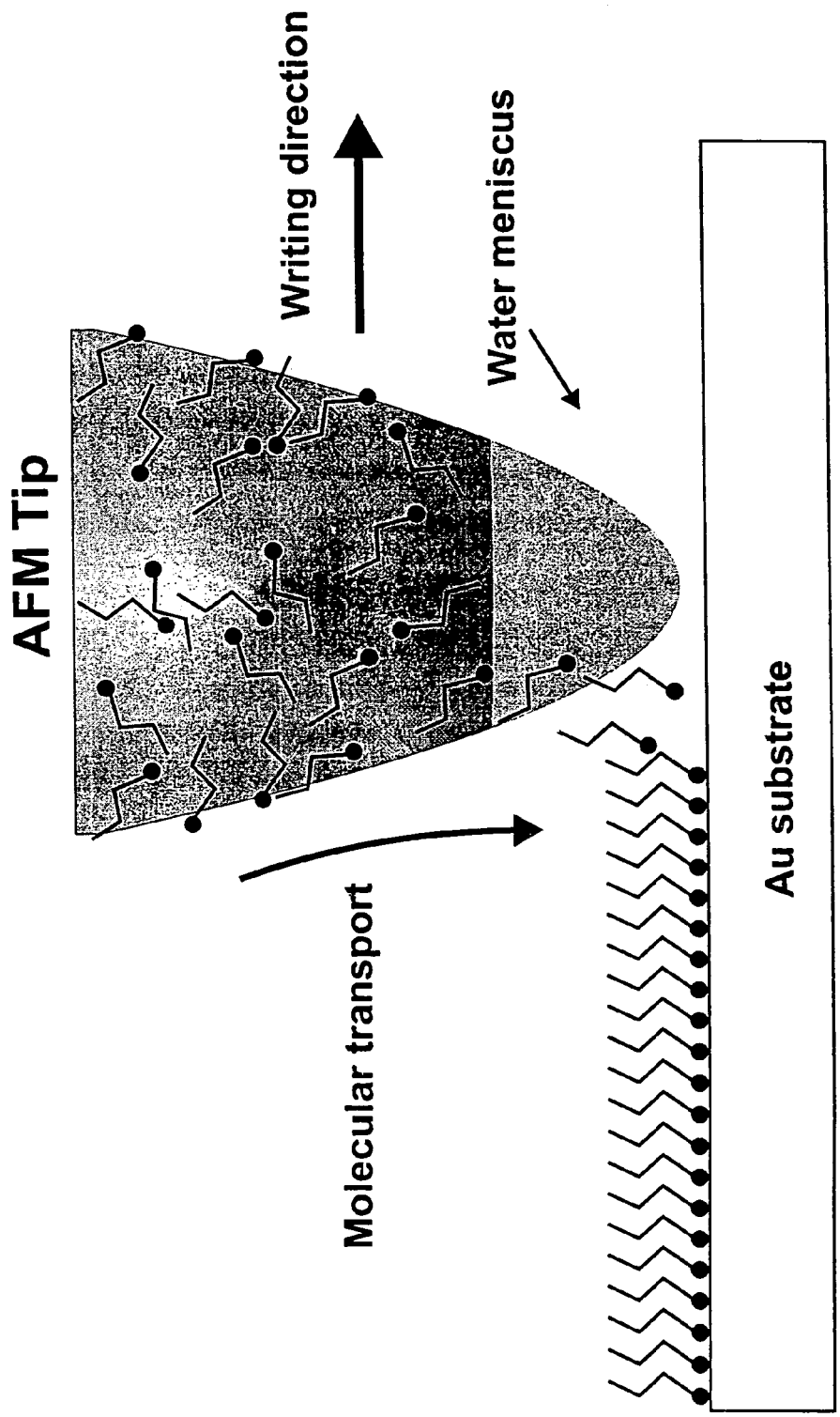
FIG. 1. Schematic representation of "dip pen" nanolithography (DPN). A water meniscus forms between the atomic force microscope (AFM) tip coated with 1-octadecanethiol (ODT) and the gold (Au) substrate. The size of the meniscus, which is controlled by relative humidity, affects the ODT transport rate, the effective tip substrate contact area, and DPN resolution.

DPN utilizes a scanning probe microscope (SPM) tip. As used herein, the phrases "scanning probe microscope tip" and "SPM tip" are used to mean tips used in atomic scale imaging, including atomic force microscope (AFM) tips, near field scanning optical microscope (NSOM) tips, scanning tunneling microscope (STM) tips, and devices having similar properties, including devices made especially for DPN using the guidelines provided herein. Many SPM tips are available commercially (e.g., from Park Scientific, Digital Instruments, Molecular Imaging, Nanonics Ltd. and Topometrix. Alternatively, SPM tips can be made by methods well known in the art. For instance, SPM tips can be made by e-beam lithography (e.g., a solid tip with a hole bored in it can be fabricated by e-beam lithography).

Most preferably, the SPM tip is an AFM tip. Any AFM tip can be used, and suitable AFM tips include those that are available commercially from, e.g., Park Scientific, Digital Instruments and Molecular Imaging. Also preferred are NSOM tips usable in an AFM. These tips are hollow, and the patterning compounds accumulate in the hollows of the NSOM tips which serve as reservoirs of the patterning compound to produce a type of "fountain pen" for use in DPN. Suitable NSOM tips are available from Nanonics Ltd. and Topometrix. STM tips usable in an AFM are also suitable for DPN, and such tips can be fabricated (see, e.g. Giessibl et al., *Science*, 289, 422 (2000)) or can be obtained commercially (e.g., from Thermomicroscopes, Digital Instruments, or Molecular Imaging).

The tip is also preferably one to which the patterning compound physisorbs only. As used herein "physisorb" means that the patterning compound adheres to the tip surface by a means other than as a result of a chemical reaction (i.e., no chemisorption or covalent linkage) and can be removed from the tip surface with a suitable solvent. Physisorption of the patterning compounds to the tip can be enhanced by coating the tip with an adhesion layer and by proper choice of solvent (when one is used) for the patterning compound. The adhesion layer is a uniform, thin (<10 nm) layer of material deposited on the tip surface which does not significantly change the tip's shape. It should also be strong enough to tolerate AFM operation (force of about 10 nN). Titanium and chromium form very thin uniform layers on tips without changing tip shape significantly, and are well-suited to be used to form the adhesion layer. The tips can be coated with an adhesion layer by vacuum deposition (see Holland, *Vacuum Deposition Of Thin Films* (Wiley, New York, N.Y., 1956)), or any other method of forming thin metal films. By "proper solvent" is meant a solvent that adheres to (wets) the tip well. The proper solvent will vary depending on the patterning compound used, the type of tip used, whether or not the tip is coated with an adhesion layer, and the material used to form the adhesion layer. For example, acetonitrile adheres well to uncoated silicon nitride tips, making the use of an adhesion layer unnecessary when acetonitriles used as the solvent for a patterning compound. In contrast, water does not adhere to uncoated silicon nitride tips. Water does adhere well to titanium-coated silicon nitride tips, and such coated tips can be used when water is used as the solvent. Physisorption of aqueous solutions of patterning compounds can also be enhanced by increasing the hydrophilicity of the tips (whether coated or uncoated with an adhesion layer). For instance, hydrophilicity can be increased by cleaning the tips (e.g., with a piranha solution, by plasma cleaning, or with UV ozone cleaning) or by oxygen plasma etching. See Lo et al., *Langmuir*, 15, 6522-6526 (1999); James et al., *Langmuir*, 14, 741-744 (1998). Alternatively, a mixture of water and another solvent (e.g., 1:3 ratio of water:acetonitrile) may adhere to uncoated silicon nitride tips, making the use of an adhesion layer or treatment to increase hydrophilicity unnecessary. The proper solvent for a particular set of circumstances can be determined empirically using the guidance provided herein.

The substrate may be of any shape and size. In particular, the substrate may be flat or curved. Substrates may be made of any material which can be modified by a patterning compound to form stable surface structures (see below). Substrates useful in the practice of the invention include metals (e.g., gold, silver, aluminum, copper, platinum, and palladium), metal oxides (e.g., oxides of Al, Ti, Fe, Ag, Zn, Zr, In, Sn and Cu), semiconductor materials (e.g., Si, CdSe, CdS and CdS coated with ZnS), magnetic materials (e.g., ferromagnetite), polymers or polymer-coated substrates, superconductor materials ($YBa_2Cu_3O_{7-\delta}$), Si, $SiO_2$, glass, AgI, AgBr, $HgI_2$, PbS, PbSe, ZnSe, ZnS, ZnTe, CdTe, InP, $In_2O_3/SnO_2$, $In_2S_3$, $In_2Se_3$, $In_2Te_3$, $Cd_3P_2$, $Cd_3As_2$, InAs, AlAs, GaP, and GaAs.

Methods of making such substrates are well-known in the art and include evaporation and sputtering (metal films), crystal semiconductor growth (e.g., Si, Ge, GaAs), chemical vapor deposition (semiconductor thin films), epitaxial growth (crystalline semiconductor thin films), and thermal shrinkage (oriented polymers). See, e.g., Alcock et al., *Canadian Metallurgical Quarterly*, 23, 309 (1984); Holland, *Vacuum Deposition of Thin Films* (Wiley, New York 1956); Grove, *Philos. Trans. Faraday Soc.*, 87(1852); Teal, *IEEE Trans. Electron Dev.* ED-23, 621(1976); Sell, *Key Eng. Materials*, 58, 169 (1991); Keller et al., *Float-Zone Silicon* (Marcel Dekker, New York, 1981); Sherman, *Chemical Vapor Deposition For Microelectronics: Principles, Technology And Applications* (Noyes, Park Ridges, N.J., 1987); *Epitaxial Silicon Technology* (Baliga, ed., Academic Press, Orlando, Fla., 1986); U.S. Pat. No. 5,138,174; Hidber et al., *Langmuir*, 12, 5209-5215 (1996). Suitable substrates can also be obtained commercially from, e.g., Digital Instruments (gold), Molecular Imaging (gold), Park Scientific (gold), Electronic Materials, Inc. (semiconductor wafers), Silicon Quest, Inc. (semiconductor wafers), MEMS Technology Applications Center, Inc. (semiconductor wafers), Crystal Specialties, Inc. (semiconductor wafers), Siltronix, Switzerland (silicon wafers), Aleene's, Buellton, Calif. (biaxially-oriented polystyrene sheets), and Kama Corp., Hazelton, Pa. (oriented thin films of polystyrene).

The SPM tip is used to deliver a patterning compound to a substrate of interest. Any patterning compound can be used, provided it is capable of modifying the substrate to form stable surface structures. Stable surface structures are formed by chemisorption of the molecules of the patterning compound onto the substrate or by covalent linkage of the molecules of the patterning compound to the substrate.

Many suitable compounds which can be used as the patterning compound, and the corresponding substrate(s) for the compounds are known in the art. For example:

a. Compounds of the formula $R_1SH$, $R_1SSR_2$, $R_1SR_2$, $R_1SO_2H$, $(R_1)_3P$, $R_1NC$, $R_1CN$, $(R_1)_3N$, $R_1COOH$, or ArSH can be used to pattern gold substrates;

b. Compounds of formula $R_1SH$, $(R_1)_3N$, or ArSH can be used to pattern silver, copper, palladium and semiconductor substrates;

c. Compounds of the formula $R_1NC$, $R_1SH$, $R_1SSR_2$, or $R_1SR_2$ can be used to pattern platinum substrates;

d. Compounds of the formula $R_1SH$ can be used to pattern aluminum, $TiO_2$, $SiO_2$, GaAs and InP substrates;

e. Organosilanes, including compounds of the formula $R_1SiCl_3$, $R_1Si(OR_2)_3$, $(R_1COO)_2$, $R_1CH=CH_2$, $R_1Li$ or $R_1MgX$, can be used to pattern Si, $SiO_2$ and glass substrates;

f. Compounds of the formula $R_1COOH$ or $R_1CONHR_2$ can be used to pattern metal oxide substrates;

g. Compounds of the formula $R_1SH$, $R_1NH_2$, $ArNH_2$ pyrrole, or pyrrole derivatives wherein $R_1$ is attached to one of the carbons of the pyrrole ring, can be used to pattern cuprate high temperature superconductors;

h. Compounds of the formula $R_1PO_3H_2$ can be used to pattern $ZrO_2$ and $In_2O_3/SnO_2$ substrates;

i. Compounds of the formula $R_1COOH$ can be used to pattern aluminum, copper, silicon and platinum substrates;

j. Compounds that are unsaturated, such as azoalkanes ($R_3NNR_3$) and isothiocyanates ($R_3NCS$), can be used to pattern silicon substrates;

k. Proteins and peptides can be used to pattern, gold, silver, glass, silicon, and polystyrene; and l. Silazanes can be used to pattern $SiO_2$ and oxidized GaAs.

In the above formulas:

$R_1$ and $R_2$ each has the formula $X(CH_2)n$ and, if a compound is substituted with both $R_1$ and $R_2$, then $R_1$ and $R_2$ can be the same or different;

$R_3$ has the formula $CH_3(CH_2)n$;

n is 0-30;

Ar is aryl;

X is —$CH_3$, —$CHCH_3$, COOH, $CO_2(CH_2)_mCH_3$, —OH, —$CH_2OH$, ethylene glycol, hexa(ethylene glycol), —$O(CH_2)_mCH_3$, $NH_2$, $NH(CH_2)_mNH_2$, halogen, glucose, maltose, fullerene C60, a nucleic acid (oligonucleotide, DNA, RNA, etc.), a protein (e.g., an antibody or enzyme) or a ligand (e.g., an antigen, enzyme substrate or receptor); and m is 0-30.

For a description of patterning compounds and their preparation and use, see Xia and Whitesides, *Angew. Chem. Int. Ed.*, 37, 550-575 (1998) and references cited therein; Bishop et al., *Curr. Opinion Colloid & Interface Sci.*, 1, 127-136 (1996); Calvert, *J. Vac. Sci. Technol.* B, 11, 2155-2163 (1993); Ulman, *Chem. Rev.*, 96:1533 (1996) (alkanethiols on gold); Dubois et al., *Annu. Rev. Phys. Chem.*, 43:437 (1992) (alkanethiols on gold); Ulman, *An Introduction to Ultrathin Organic Films: From Langmuir-Blodgett to Self-Assembly* (Academic, Boston, 1991) (alkanethiols on gold); Whitesides, *Proceedings of the Robert A. Welch Foundation 39th Conference On Chemical Research Nanophase Chemistry*, Houston, Tex., pages 109-121 (1995) (alkanethiols attached to gold); Mucic et al. *Chem. Commun.* 555-557 (1996) (describes a method of attaching 3' thiol DNA to gold surfaces); U.S. Pat. No. 5,472,881 (binding of oligonucleotide-phosphorothiolates to gold surfaces); Burwell, *Chemical Technology*, 4, 370-377(1974) and Matteucci and Caruthers, *J. Am. Chem. Soc.*, 103, 3185-3191 (1981) (binding of oligonucleotide-alkylsiloxanes to silica and glass surfaces); Grabar et al., *Anal. Chem.*, 67, 735-743 (binding of aminoalkylsiloxanes and for similar binding of mercaptoalkylsiloxanes); Nuzzo et al., *J. Am. Chem. Soc.*, 109, 2358 (1987) (disulfides on gold); Allara and Nuzzo, *Langmuir*, 1,45 (1985) (carboxylic acids on aluminum); Allara and Tompkins, *J. Colloid Interface Sci.*, 49, 410-421(1974) (carboxylic acids on copper); Iler, *The Chemistry Of Silica*, Chapter 6, (Wiley 1979) (carboxylic acids on silica); Timmons and Zisman, *J. Phys. Chem.*, 69, 984-990 (1965) (carboxylic acids on platinum); Soriaga and Hubbard, *J. Am. Chem. Soc.*, 104, 3937 (1982) (aromatic ring compounds on platinum); Hubbard, *Acc. Chem. Res.*, 13, 177 (1980) (sulfolanes, sulfoxides and other functionalized solvents on platinum); Hickman et al., *J. Am. Chem. Soc.*, 111, 7271 (1989) (isonitriles on platinum); Maoz and Sagiv, *Langmuir*, 3, 1045 (1987) (silanes on silica); Maoz and Sagiv, *Langmuir*, 3, 1034 (1987) (silanes on silica); Wasserman et al., *Langmuir*, 5, 1074(1989) (silanes on silica); Eltekova and Eltekov, *Langmuir*, 3, 951 (1987) (aromatic carboxylic acids, aldehydes, alcohols and methoxy groups on titanium dioxide and silica); and Lec et al., *J. Phys. Chem.*, 92, 2597 (1988) (rigid phosphates on metals); Lo et al., *J. Am. Chem. Soc.*, 118, 11295-11296 (1996) (attachment of pyrroles to superconductors); Chen et al., *J. Am. Chem. Soc.*, 117, 6374-5 (1995) (attachment of amines and thiols to superconductors); Chen et al., *Langmuir*, 12, 2622-2624 (1996) (attachment of thiols to superconductors); McDevitt et al., U.S. Pat. No. 5,846,909 (attachment of amines and thiols to superconductors); Xu et al., *Langmuir*, 14, 6505-6511 (1998) (attachment of amines to superconductors); Mirkin et al., *Adv. Mater. (Weinheim, Ger.)*, 9, 167-173 (1997) (attachment of amines to superconductors); Hovis et al., *J. Phys. Chem. B*, 102, 6873-6879 (1998) (attachment of olefins and dienes to silicon); Hovis et al., *Surf Sci.*, 402-404, 1-7 (1998) (attachment of olefins and dienes to silicon); Hovis et al., *J. Phys. Chem. B*, 101, 9581-9585 (1997) (attachment of olefins and dienes to silicon); Hamers et al., *J. Phys. Chem. B*, 101, 1489-1492 (1997) (attachment of olefins and dienes to silicon); Hamers et al., U.S. Pat. No. 5,908,692 (attachment of olefins and dienes to silicon); Ellison et al., *J. Phys. Chem. B*, 103, 6243-6251 (1999) (attachment of isothiocyanates to silicon); Ellison et al., *J. Phys. Chem. B*, 102, 8510-8518 (1998) (attachment of azoalkanes to silicon); Ohno et al., *Mol. Cryst. Liq. Cryst. Sci. Technol., Sect. A*, 295, 487-490 (1997) (attachment of thiols to GaAs); Reuter et al., *Mater. Res. Soc. Symp. Proc.*, 380, 119-24 (1995) (attachment of thiols to GaAs); Bain, *Adv. Mater. (Weinheim, Fed. Repub. Ger.)*, 4, 591-4 (1992) (attachment of thiols to GaAs); Sheen et al., *J. Am. Chem. Soc.*, 114, 1514-15 (1992) (attachment of thiols to GaAs); Nakagawa et al., *Jpn. J. Appl. Phys., Part 1*, 30, 3759-62 (1991) (attachment of thiols to GaAs); Lunt et al., *J. Appl. Phys.*, 70, 7449-67 (1991) (attachment of thiols to GaAs); Lunt et al., *J. Vac. Sci. Technol., B*, 9, 2333-6 (1991) (attachment of thiols to GaAs); Yamamoto et al., *Langmuir* ACS ASAP, web release number Ia990467r (attachment of thiols to InP); Gu et al., *J. Phys. Chem. B*, 102, 9015-9028 (1998) (attachment of thiols to InP); Menzel et al., *Adv. Mater. (Weinheim, Ger.)*, 11, 131-134 (1999) (attachment of disulfides to gold); Yonezawa et al., *Chem. Mater.*, 11, 33-35 (1999) (attachment of disulfides to gold); Porter et al., *Langmuir*, 14, 7378-7386 (1998) (attachment of disulfides to gold); Son et al., *J. Phys. Chem.*, 98, 8488-93 (1994) (attachment of nitrites to gold and silver); Steiner et al., *Langmuir*, 8, 2771-7 (1992) (attachment of nitrites to gold and copper); Solomun et al., *J. Phys. Chem.*, 95, 10041-9 (1991) (attachment of nitrites to gold); Solomun et al. *Ber. Bunsen-Ges. Phys. Chem.*, 95,95-8(1991) (attachment of nitriles to gold); Henderson et al., *Inorg. Chim. Acta*, 242, 115-24 (1996) (attachment of isonitriles to gold); Huc et al., *J. Phys. Chem. B*, 103, 10489-10495 (1999) (attachment of isonitriles to gold); Hickman et al., *Langmuir*, 8, 357-9 (1992) (attachment of isonitriles to platinum); Steiner et al., *Langmuir*, 8, 90-4 (1992) (attachment of amines and phosphines to gold and attachment of amines to copper); Mayya et al., *J. Phys. Chem. B*, 101, 9790-9793 (1997) (attachment of amines to gold and silver); Chen et al., *Langmuir*, 15, 1075-1082 (1999) (attachment of carboxylates to gold); Tao, *J. Am. Chem. Soc.*, 115, 4350-4358 (1993) (attachment of carboxylates to copper and silver); Laibinis et al., *J. Am. Chem. Soc.*, 114, 1990-5 (1992) (attachment of thiols to silver and copper); Laibinis et al., *Langmuir*, 7, 3167-73 (1991) (attachment of thiols to siher); Fenter et al., *Langmuir*, 7, 2013-16 (1991) (attachment of thiols to silver); Chang et al., *Am. Chem. Soc.*, 116, 6792-805 (1994) (attachment of thiols to silver); Li et al., *J. Phys. Chem.*, 98, 11751-5 (1994) (attachment of thiols to silver); Li et al., *Report*, [24]pp (1994) (attachment of thiols to silver); Tarlov et al., U.S. Pat. No. 5,942,397 (attachment of thiols to silver and copper); Waldeck, et al., PCT application WO/99/48682 (attachment of thiols to silver and copper); Gui et al., *Langmuir*, 7, 955-63 (1991) (attachment of thiols to silver); Walczak et al., *J. Am. Chem. Soc.*, 113, 2370-8(1991) (attachment of thiols to silver); Sangiorgi et al., *Gazz. Chim. Ital.*, 111,99-102 (1981) (attachment of amines to copper); Magallon et al., *Book of Abstracts, 215th ACS National Meeting*, Dallas, Mar. 29-Apr. 2, 1998, COLL-048 (attachment of amines to copper); Patil et al., *Langmuir*, 14,2707-2711 (1998) (attachment of amines to silver); Sastry et al., *J. Phys. Chem. B*, 101, 4954-4958 (1997) (attachment of amines to silver); Bansal et al., *J. Phys. Chem. B*, 102, 4058-4060 (1998) (attachment of alkyl lithium to silicon); Bansal et al., *J. Phys. Chem. B*, 102, 1067-1070 (1998) (attachment of alkyl lithium to silicon); Chidsey, *Book of Abstracts,* 214*th ACS National Meeting,* Las Vegas, Nev. Sep. 7-11, 1997, I&EC-027 (attachment of alkyl lithium to silicon); Song, J. H., Thesis, University of California at San Diego (1998) (attachment of alkyl lithium to silicon dioxide); Meyer et al., *J. Am. Chem. Soc.,* 110, 4914-18 (1988) (attachment of amines to semiconductors); Brazdil et al. *J. Phys. Chem.,* 85, 1005-14 (1981) (attachment of amines to semiconductors); James et al., *Langmuir,* 14, 741-744 (1998) (attachment of proteins and peptides to glass); Bernard et al., *Langmuir,* 14, 2225-2229 (1998) (attachment of proteins to glass, polystyrene, gold, silver and silicon wafers); Pereira et al., *J. Mater. Chem.,* 10, 259 (2000) (attachment of silazanes to $SiO_2$); Pereira et al., *J. Mater. Chem.,* 10, 259 (2000) (attachment of silazanes to $SiO_2$); Dammel, *Diazonaphthoquinone Based Resists* ($1^{st}$ ed., SPIE Optical Engineering Press, Bellingham, Wash., 1993) (attachment of silazanes to $SiO_2$); Anwander et al., *J. Phys. Chem. B,* 104, 3532 (2000) (attachment of silazanes to $SiO_2$); Slavov et al., *J. Phys. Chem.,* 104, 983 (2000) (attachment of silazanes to $SiO_2$).

Other compounds known in the art besides those listed above, or which are developed or discovered using the guidelines provided herein or otherwise, can also be used as the patterning compound. Presently preferred are alkanethiols and arylthiols on a variety of substrates and trichlorosilanes on $SiO_2$ substrates (see Examples 1 and 2).

To practice DPN, the SPM tip is coated with a patterning compound. This can be accomplished in a number of ways. For instance, the tip can be coated by vapor deposition, by direct contact scanning, or by bringing the tip into contact with a solution of the patterning compound.

The simplest method of coating the tips is by direct contact scanning. Coating by direct contact scanning is accomplished by depositing a drop of a saturated solution of the patterning compound on a solid substrate (e.g., glass or silicon nitride; available from Fisher Scientific or MEMS Technology Application Center). Upon drying, the patterning compound forms amicrocrystalline phase on the substrate. To coat the patterning compound on the SPM tip, the tip is scanned repeatedly across this microcrystalline phase. While this method is simple, it does not lead to the best loading of the tip, since it is difficult to control the amount of patterning compound transferred from the substrate to the tip.

The tips can also be coated by vapor deposition. See Sherman, *Chemical Vapor Deposition For Microelectronics: Principles, Technology And Applications* (Noyes, Park Ridges, N.J., 1987). Briefly, a patterning compound (in pure form, solid or liquid, no solvent) is placed on a solid substrate (e.g., glass or silicon nitride; obtained from Fisher Scientific or MEMS Technology Application Center), and the tip is position near (within about 1-20 cm, depending on chamber design) the patterning compound. The compound is then heated to a temperature at which it vaporizes, thereby coating the tip with the compound. For instance, 1-octadecanethiol can be vapor deposited at 60° C. Coating by vapor deposition should be performed in a closed chamber to prevent contamination of other areas. If the patterning compound is one which is oxidized by air, the chamber should be a vacuum chamber or a nitrogen-filled chamber. Coating the tips by vapor deposition produces thin, uniform layers of patterning compounds on the tips and gives very reliable results in DPN.

Preferably, however, the SPM tip is coated by dipping the tip into a solution of the patterning compound. The solvent is not critical; all that is required is that the compound be in solution. However, the solvent is preferably the one in which the patterning compound is most soluble. Also, the solution is preferably a saturated solution. In addition, the solvent is preferably one that adheres to (wets) the tip (uncoated or coated with an adhesion layer) very well (see above). The tip is maintained in contact with the solution of the patterning compound for a time sufficient for the compound to coat the tip. Such times can be determined empirically. Generally, from about 30 seconds to about 3 minutes is sufficient. Preferably, the tip is dipped in the solution multiple times, with the tip being dried between each dipping. The number of times a tip needs to be dipped in a chosen solution can be determined empirically. Preferably, the tip is dried by blowing an inert gas (such as carbon tetrafluoride, 1,2-dichloro-1,1,2,2,-tetrafluoroethane, dichlorodifluoromethane, octafluorocyclobutane, trichlorofluoromethane, difluoroethane, nitrogen, nitrogen, argon or dehumidified air) not containing any particles (i.e., purified) over the tip. Generally, about 10 seconds of blowing with the gas at room temperature is sufficient to dry the tip. After dipping (the single dipping or the last of multiple dippings), the tip may be used wet to pattern the substrate, or it may be dried (preferably as described above) before use. A dry tip gives a low, but stable, rate of transport of the patterning compound for a long time (on the order of weeks), whereas a wet tip gives a high rate of transport of the patterning compound for a short time (about 2-3 hours). A dry tip is preferred for compounds having a good rate of transport under dry conditions (such as the compounds listed above wherein X=—$CH_3$), whereas a wet tip is preferred for compounds having a low rate of transport under dry conditions (such as the compounds listed above wherein X=—COOH).

To perform DPN, the coated tip is used to apply a patterning compound to a substrate so as to form a desired pattern. The pattern may be any pattern and may be simple or complex. For instance, the pattern may be a dot, a line, a cross, a geometric shape (e.g. a triangle, square or circle), combinations of two or more of the foregoing, combinatorial arrays (e.g., a square array of rows and columns of dots), electronic circuits, or part of, or a step in, the formation of a three-dimensional structure.

A transport medium is preferably used in DPN since, as presently understood, the patterning compound is transported to the substrate by capillary transport. The transport medium forms a meniscus which bridges the gap between the tip and the substrate (see FIG. 1). Thus, the tip is "in contact" with the substrate when it is close enough so that this meniscus forms. The tip may be actually touching the substrate, but it need not be. The tip only needs to be close enough to the substrate so that a meniscus forms. Suitable transport media include water, hydrocarbons (e.g., hexane), and solvents in which the patterning compounds are soluble (e.g., the solvent used for coating the tip—see above). Faster writing with the tip can be accomplished by using the transport medium in which the patterning compound is most soluble. The possibility that the patterning compound can be deposited on the substrate without the use of a transport medium has not been completely ruled out, although it seems highly unlikely. Even under conditions of low, or even no humidity, there is likely some water on the substrate which could function as the transport medium.

DPN is performed using an AFM or a device performing similar functions and having similar properties, including devices developed especially for performing DPN using the guidelines provided herein, using techniques that are conventional and well known in AFM microscopy. Briefly, the substrate is placed in the sample holder of the device, the substrate is contacted with the SPM tip(s) coated with the patterning compound(s), and the substrate is scanned to pattern it with the patterning compound(s). An AFM can be operated in several modes, and DPN can be performed when the AFM or similar device is operated in any of these modes. For instance, DPN can be performed in (1) contact (constant force) mode wherein the tip is maintained in contact with (touching) the substrate surface, (2) non-contact (dynamic) mode wherein the tip is vibrated very close to the substrate surface, and/or (3) intermittent contact (tapping) mode which is very similar to the non-contact mode, except that the tip is allowed to strike (touch) the surface of the substrate.

Single tips can be to write a pattern utilizing an AFM or similar device. Two or more different patterning compounds can be applied to the same substrate to form patterns (the same or different) of the different compounds by: (1) removing a first tip coated with a first patterning compound and replacing it with another tip coated with a different patterning compound; or (2) rinsing the first tip coated with the first patterning compound so as to remove the patterning compound from the tip and then coating the tip with a different patterning compound. Suitable solvents for rinsing tips to remove patterning compounds are those solvents in which the patterning compound is soluble. Preferably, the rinsing solvent is the solvent in which the patterning compound is most soluble. Rinsing of tips can be accomplished by simply dipping the tip in the rinsing solvent.

Alternatively, a plurality of tips can be used in a single AFM or similar device to write a plurality of patterns (the same pattern or different patterns) on a substrate using the same or different patterning compounds (see, e.g., Example 6 below, U.S. Pat. Nos. 5,630,923, and 5,666,190, Lutwyche et al., *Sens. Actuators A,* 73:89 (1999), Vettiger et al., *Microelectron Eng.,* 46:11(1999), Minne et al., *Appl. Phys. Lett.,* 73:1742 (1998), and Tsukamoto et al., *Rev. Sci. Instrum.,* 62:1767 (1991) which describe devices comprising multiple cantilevers and tips for patterning a substrate). One or more of the plurality of tips can be rinsed as described above for single tips, if desired, to change the patterning compound coated on the tip(s).

The AFM or similar device used for DPN preferably comprises at least one micron-scale well positioned so that the well(s) will be adjacent the substrate when the substrate is placed in the sample holder. Preferably the AFM or similar device comprises a plurality of wells holding a plurality of patterning compounds or holding at least one patterning compound and at least one rinsing solvent. "Well" is used herein to mean any container, device, or material that can hold a patterning compound or rinsing solvent and includes depressions, channels and other wells which can be prepared by microfabrication (e.g, the same processes used to fabricate microelectronic devices, such as photolithograpy; see, e.g., PCT application WO 00/04390). The wells may also simply be pieces of filter paper soaked in a patterning compound or rinsing solvent. The wells can be mounted anywhere on the AFM or similar device which is adjacent the substrate and whereby they can be addressed by the SPM tip(s), such as on the sample holder or translation stage.

When two or more patterns and/or two or more patterning compounds (in the same or different patterns) are applied to a single substrate, a positioning (registration) system is used to align the patterns and/or patterning compounds relative to each other and/or relative to selected alignment marks. For instance, two or more alignment marks, which can be imaged by normal AFM imaging methods, are applied to the substrate by DPN or another lithographic technique (such as photolithography or e-beam lithography). The alignment marks may be simple shapes, such as a cross or rectangle. Better resolution is obtained by making the alignment marks using DPN. If DPN is used, the alignment marks are preferably made with patterning compounds which form strong covalent bonds with the substrate. The best compound for forming the alignment marks on gold substrates is 16-mercaptohexadecanoic acid. The alignment marks are imaged by normal AFM methods (such as lateral force AFM imaging, AFM topography imaging and non-contact mode AFM imaging), preferably using an SPM tip coated with a patterning compound for making a desired pattern. For this reason, the patterning compounds used to make the alignment marks should not react with the other patterning compounds which are to be used to make the desired patterns and should not be destroyed by subsequent DPN patterning. Using the imaging data, the proper parameters (position and orientation) can be calculated using simple computer programs (e.g., Microsoft Excel spreadsheet), and the desired pattern(s) deposited on the substrate using the calculated parameters. Virtually an infinite number of patterns and/or patterning compounds can be positioned using the alignment marks since the system is based on calculating positions and orientations relative to the alignment marks. To get the best results, the SPM tip positioning system which is used should be stable and not have drift problems. One AFM positioning system which meets these standards is the 100 micrometer pizoelectric tube scanner available from Park Scientific. It provides stable positioning with nanometer scale resolution.

DPN can also be used in a nanoplotter format by having a series of wells containing a plurality of different patterning compounds and rinsing solvents adjacent the substrate. One or more tips can be used. When a plurality of tips is used, the tips can be used serially or in parallel to produce patterns on the substrate.

In a nanoplotter format using a single tip, the tip is dipped into a well containing a patterning compound to coat the tip, and the coated tip is used to apply a pattern to the substrate. The tip is then rinsed by dipping it in a well containing a rinsing solvent or a series of such wells. The rinsed tip is then dipped into another well to be coated with a second patterning compound and is used to apply a pattern to the substrate with the second patterning compound. The patterns are aligned as described in the previous paragraph. The process of coating the tip with patterning compounds, applying a pattern to the substrate, and rinsing the tip, can be repeated as many times as desired, and the entire process can be automated using appropriate software.

Figure 17:
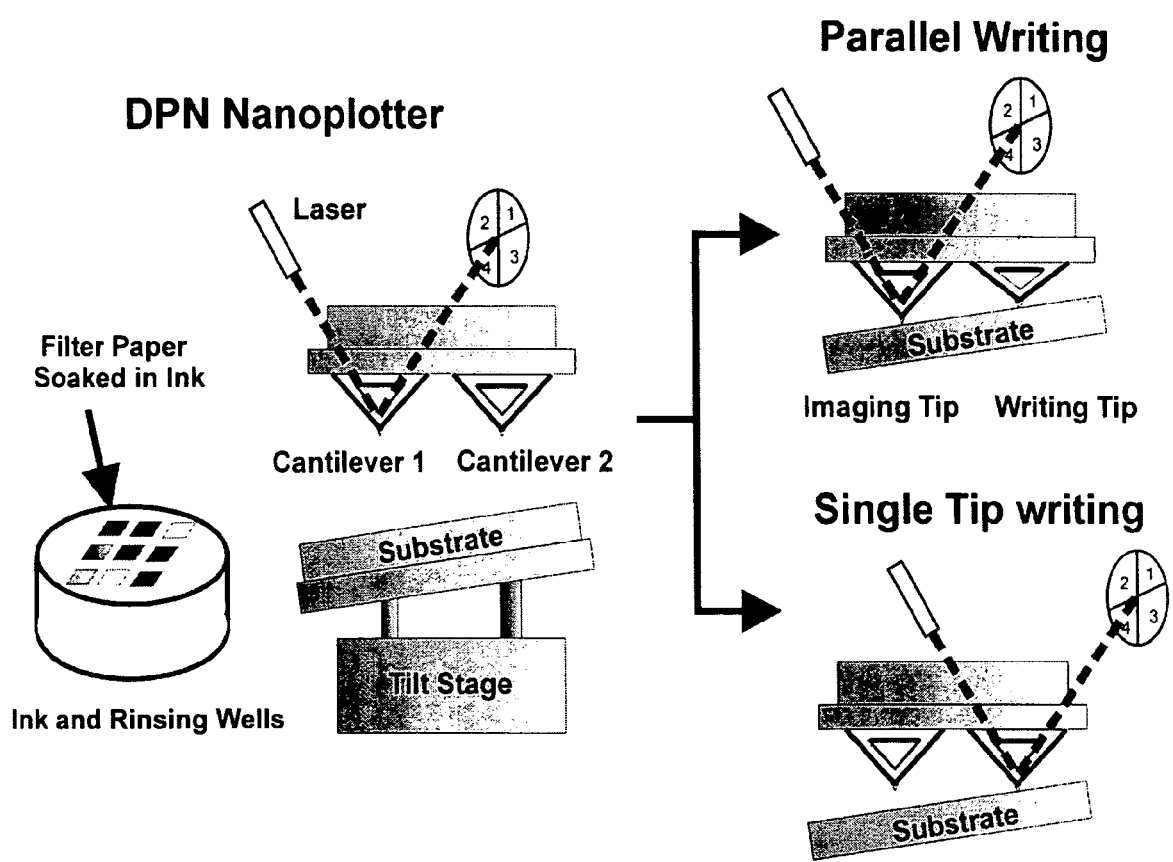
FIG. 17: Diagram illustrating the components of a DPN nanoplotter and parallel writing.
Figure 18:
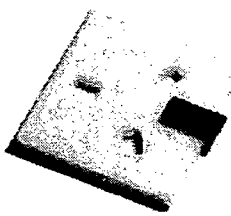
FIG. 18: Diagram of an array of AFM tips for parallel writing.
Figure 18:
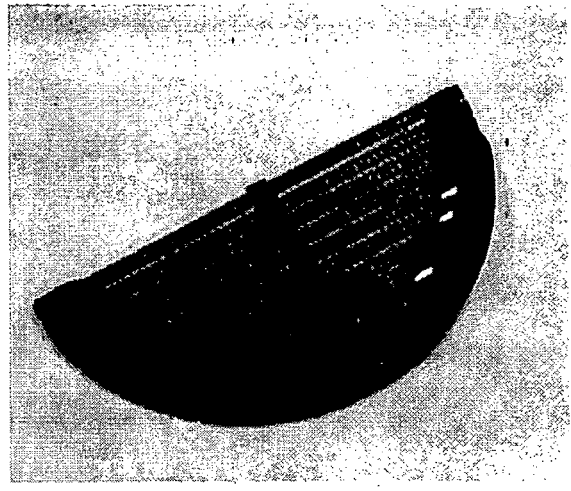
Figure 18:
Figure 18:
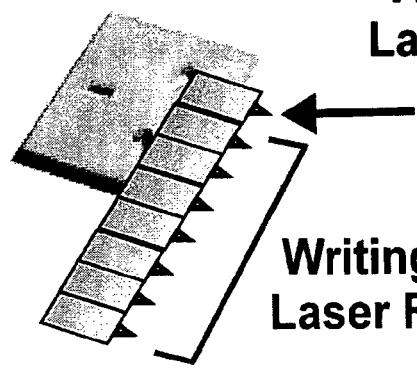

A particularly preferred nanoplotter format is described in Example 6 and illustrated in FIGS. 17 and 18. In this preferred format, a plurality of AFM tips are attached to an AFM. A multiple-tip array can be fabricated by simply physically separating an array of the desired number of cantilevers from a commercially-available wafer block containing a large number of individual cantilevers, and this array can be used as a single cantilever on the AFM. The array can be attached to the AFM tip holder in a variety of ways, e.g. with epoxy glue. Of course, arrays of tips of any spacing or configuration and adapted for attachment to an AFM tip holder can be microfabricated by methods known in the art. See, e.g., Minne et al., *Applied Physics Letters,* 72:2340 (1998). The plurality of tips in the array can be employed for serial or parallel DPN. When the plurality of tips is used for parallel DPN, only one of the tips needs to be connected to a feedback system (this tip is referred to as the "imaging tip"). The feedback system is a standard feedback system for an AFM and comprises a laser, photodiode and feedback electronics. The remaining tips (referred to as "writing tips") are guided by the imaging tip (i.e., all of the writing tips reproduce what occurs at the imaging tip in passive fashion). As a consequence, all of the writing tips will produce the same pattern on the substrate as produced by the imaging tip. Of course, each writing tip may be coated with a patterning compound which is the same or different than that coated on the imaging tip or on the other writing tips, so that the same pattern is produced using the same patterning compound or using different patterning compounds. When serial DPN is employed, each of the tips used in sequence must be connected to a feedback system (simultaneously or sequentially). The only adaptation of the AFM necessary to provide for a choice of serial or parallel DPN is to add a tilt stage to the AFM. The tilt stage is adapted for receiving and holding the sample holder, which in turn is adapted for receiving and holding the substrate. Tilt stages are included with many AFM's or can be obtained commercially (e.g., from Newport Corp.) and attached to the AFM according to the manufacturer's instructions. The AFM preferably also comprises a plurality of wells located adjacent the substrate and so that the AFM operator can individually address and coat the tips with patterning compounds or rinse the tips with rinsing solvents. Some AFM's are equipped with a translation stage which can move very large distances (e.g., the M5 AFM from Thermomicroscopes), and the wells can be mounted on this type of translation stage. For inking or rinsing, a well is moved below an AFM tip by the translation stage and, then, the tip is lowered by a standard coarse approach motor until it touches the ink or solvent in the well. The tip is held in contact with the ink or solvent in order to coat or rinse the tip. The wells could also be mounted on the sample holder or tilt stage.

DPN can also be used to apply a second patterning compound to a first patterning compound which has already been applied to a substrate. The first patterning compound can be applied to the substrate by DPN, microcontact printing (see, e.g, Xia and Whitesides, *Angew. Chem. Ind Ed.*, 37, 550-575 (1998); James et al., *Langmuir*, 14, 741-744 (1998); Bernard et al., *Langmuir*, 14, 2225-2229 (1998); Huck et al., *Langmuir*, 15, 6862-6867 (1999)), by self-assembly of a monolayer on a substrate immersed in the compound (see, e.g. Ross et al., *Langmuir*, 9, 632-636 (1993); Bishop and Nuzzo, *Curr. Opinion in Colloid & Interface Science*, 1, 127-136 (1996); Xia and Whitesides, *Angew. Chem. Ind. Ed.*, 37, 550-575 (1998);Yan et al., *Langmuir*, 15, 1208-1214 (1999); Lahiri et al., *Langmuir*, 15, 2055-2060 (1999); Huck et al., *Langmuir*, 15, 6862-6867 (1999)), or any other method. The second patterning compound is chosen so that it reacts chemically or otherwise stably combines (e.g., by hybridization of two complimentary strands of nucleic acid) with the first patterning compound. See, e.g., Dubois and Nuzzo, *Annu. Rev. Phys. Chem.*, 43, 437-63 (1992); Yan et al., *Langmuir*, 15, 1208-1214 (1999); Lahiri et al., *Langmuir*, 15, 2055-2060 (1999); and Huck et al., *Langmuir*, 15, 6862-6867 (1999). As with DPN performed directly on a substrate, both the second patterning compound and a transport medium are necessary, since the second patterning compound is transported to the first patterning compound by capillary transport (see above). Third, fourth, etc., patterning compounds can also be applied to the first patterning compound, or to other patterning compounds, already on the substrate. Further, additional patterning compounds can be applied to form multiple layers of patterning compounds. Each of these additional patterning compounds may be the same or different than the other patterning compounds, and each of the multiple layers may be the same or different than the other layers and may be composed of one or more different patterning compounds.

Further, DPN can be used in combination with other lithographic techniques. For instance, DPN can be used in conjunction with microcontact printing and the other lithographic techniques discussed in the Background section above.

DPN can also be used in conjunction with wet (chemical) etching techniques. In particular, an SPM tip can be used to deliver a patterning compound to a substrate of interest in a pattern of interest, all as described above, and the patterning compound functions as an etching resist in one or more subsequent wet etching procedures. The patterning compounds can be used to pattern the substrate prior to any etching or after one or more etching steps have been performed to protect areas exposed by the etching step(s). The wet etching procedures and materials used in them are standard and well known in the art. See, e.g., Xia et al., *Angew. Chem. Int. Ed.*, 37, 550 (1998); Xia et al., *Chem. Mater.*, 7, 2332 (1995); Kumar et al., *J. Am. Chem. Soc.*, 114, 9188-9189 (1992); Seidel et al., *J. Electrochem. Soc.*, 137, 3612 (1990). Wet etching procedures are used for, e.g., the preparation of three-dimensional architectures on or in substrates (e.g., Si wafers) of interest. See, e.g., Xia et al., *Angew. Chem. Int. Ed*, 37, 550 (1998); Xia et al., *Chem. Mater.*, 7, 2332 (1995). After etching, the patterning compound may be retained on the substrate or removed from it. Methods of removing the patterning compounds from the substrates are well known in the art. See, e.g., Example 5.

Several parameters affect the resolution of DPN, and its ultimate resolution is not yet clear. First, the grain size of the substrate affects DPN resolution much like the texture of paper controls the resolution of conventional writing. As shown in Example 1 below, DPN has been used to make lines 30 nm in width on a particular gold substrate. This size is the average grain diameter of the gold substrate, and it represents the resolution limit of DPN on this type of substrate: It is expected that better resolution will be obtained using smoother (smaller grain size) substrates, such as silicon. Indeed, using another, smoother gold substrate, the resolution was increased to 15 nm (see Example 4).

Second, chemisorption, covalent attachment and self-assembly all act to limit diffusion of the molecules after deposition. In contrast, compounds, such as water, which do not anchor to the substrate, form only metastable patterns of poor resolution (See Piner et al., *Langmuir*, 13:6864 (1997)) and cannot be used.

Third, the tip-substrate contact time and, thus, scan speed influence DPN resolution. Faster scan speeds and a smaller number of traces give narrower lines.

Fourth, the rate of transport of the patterning compound from the tip to the substrate affects resolution. For instance, using water as the transport medium, it has been found that relative humidity affects the resolution of the lithographic process. For example, a 30-nm-wide line (FIG. 2C) required 5 minutes to generate in a 34% relative humidity environment, whereas a 100-nm-line (FIG. 2D) required 1.5 minutes to generate in a 42% relative humidity environment. It is known that the size of the water meniscus that bridges the tip and substrate depends upon relative humidity (Piner et al., *Langmuir*, 13:6864 (1997)), and the size of the water meniscus affects the rate of transport of the patterning compound to the substrate. Further, when a wet tip is used, the water meniscus contains residual solvent is the transport medium, and the transport rate is also affected by the properties of the solvent.

Fifth, the sharpness of the tip also affects the resolution of DPN. Thus, it is expected that better resolution will be obtained using sharper tips (e.g., by changing the tips frequently, cleaning the tips before coating them, and attaching sharp structures (such as carbon nanotubes) to the ends of the tips).

In summary, DPN is a simple but powerful method for transporting molecules from SPM tips to substrates at resolutions comparable to those achieved with much more expensive and sophisticated competitive lithographic methods, such as electron-beam lithography. DPN is a useful tool for creating and functionalizing microscale and nanoscale structures. For instance, DPN can be used in the fabrication of microsensors, microreactors, combinatorial arrays, micromechanical systems, microarialytical systems, biosurfaces, biomaterials, microelectronics, microoptical systems, and nanoelectronic devices. See, e.g., Xia and Whitesides, *Angew. Chem. Int. Ed.,* 37,550-575 (1998). DPN should be especially useful for the detailed functionalization of nanoscale devices prepared by more-conventional lithographic methods. See Reed et al., *Science,* 278:252 (1997); Feldheim et al., *Chem. Soc. Rev.,* 27:1 (1998).

DPN, particularly parallel DPN, should also be especially useful for the preparation of arrays, particular combinatorial arrays. An "array" is an arrangement of a plurality of discrete sample areas in a pattern on a substrate. The sample areas may be any shape (e.g., dots, circles, squares or triangles) and maybe arranged in any pattern (e.g., rows and columns of discrete sample areas). Each sample area may contain the same or a different sample as contained in the other sample areas of the array. A "combinatorial array" is an array wherein each sample area or a small group of replicate sample areas (usually 2-4) contain(s) a sample which is different than that found in other sample areas of the array. A "sample" is a material or combination of materials to be studied, identified, reacted, etc.

DPN will be particularly useful for the preparation of combinatorial arrays on the submicrometer scale. An "array on the submicrometer scale" means that at least one of the dimensions (e.g, length, width or diameter) of the sample areas, excluding the depth, is less than 1 μm. At present, DPN can be used to prepare dots that are 10 nm in diameter. With improvements in tips (e.g., sharper tips), it should be possible to produce dots that approach 1 nm in diameter. Arrays on a submicrometer scale allow for faster reaction times and the use of less reagents than the currently-used microscale (i.e., having dimensions, other than depth, which are 1-999 μm) and larger arrays. Also, more information can be gained per unit area (i.e., the arrays are more dense than the currently-used micrometer scale arrays). Finally, the use of submicrometer arrays provides new opportunities for screening. For instance, such arrays can be screened with SPM's to look for physical changes in the patterns (e.g., shape, stickiness, height) and/or to identify chemicals present in the sample areas, including sequencing of nucleic acids (see below).

Each sample area of an array contains a single sample. For instance, the sample may be a biological material, such as a nucleic acid (e.g., an oligonucleotide, DNA, or RNA), protein or peptide (e.g., an antibody or an enzyme), ligand (e.g., an antigen, enzyme substrate, receptor or the ligand for a receptor), or a combination or mixture of biological materials (e.g., a mixture of proteins). Such materials may be deposited directly on a desired substrate as described above (see the description of patterning compounds above). Alternatively, each sample area may contain a compound for capturing the biological material. See, e.g. PCT applications WO 00/04382, WO 00/04389 and WO 00/04390, the complete disclosures of which are incorporated herein-by reference. For instance, patterning compounds terminating in certain functional groups (e.g., —COOH) can bind proteins through a functional group present on, or added to, the protein (e.g., —NH$_2$). Also, it has been reported that polylysine, which can be attached to the substrate as described above, promotes the binding cells to substrates. See James et al., *Langmuir,* 14, 741-744 (1998). As another example, each sample area may contain a chemical compound (organic, inorganic and composite materials) or a mixture of chemical compounds. Chemical compounds may be deposited directly on the substrate or may be attached through a functional group present on a patterning compound present in the sample area. As yet another example, each sample area may contain a type of microparticles or nanoparticles. See Example 7. From the foregoing, those skilled in the art will recognize that a patterning compound may comprise a sample or may be used to capture a sample.

Arrays and methods of using them are known in the art. For instance, such arrays can be used for biological and chemical screenings to identify and/or quantitate a biological or chemical material (e.g., immunoassays, enzyme activity assays, genomics, and proteomics). Biological and chemical libraries of naturally-occurring or synthetic compounds and other materials, including cells, can be used, e.g., to identify and design or refine drug candidates, enzyme inhibitors, ligands for receptors, and receptors for ligands, and in genomics and proteomics. Arrays of microparticles and nanoparticles can be used for a variety of purposes (see Example 7). Arrays can also be used for studies of crystallization, etching (see Example 5), etc. References describing combinatorial arrays and other arrays and their uses include U.S. Pat. Nos. 5,747,334, 5,962,736, and 5,985,356, and PCT applications WO 96/31625, WO 99/31267, WO 00/04382, WO 00/04389, WO 00/04390, WO 00/36 136, and WO 00/46406.

Results of experiments performed on the arrays of the invention can be detected by conventional means (e.g., fluorescence, chemiluminescence, bioluminescence, and radioactivity). Alternatively, an SPM can be used for screening arrays. For instance, an AFM can be used for quantitative imaging and identification of molecules, including the imaging and identification of chemical and biological molecules through the use of an SPM tip coated with a chemical or biomolecular identifier. See Frisbie et al., *Science,* 265,2071 2074 (1994); Wilbur et al., *Langmuir,* 11, 825-831 (1995); Noy et al., *J. Am. Chem. Soc.,* 117, 7943-7951(1995); Noy et al., *Langmuir,* 14, 1508-1511 (1998); and U.S. Pat. Nos. 5,363,697, 5,372,93, 5,472,881 and 5,874,668, the complete disclosures of which are incorporated herein by reference.

Figure 28A:
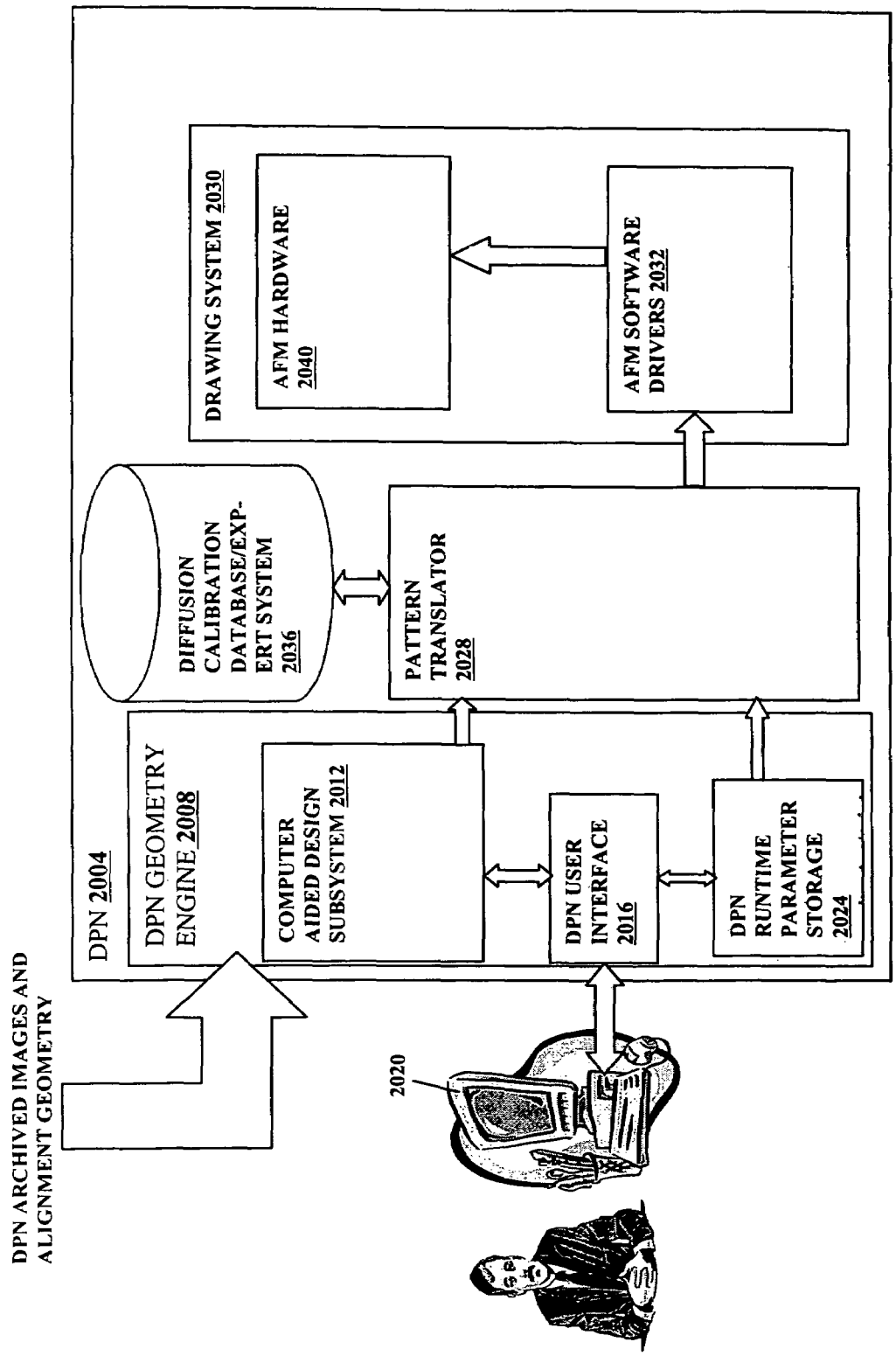
FIG. 28A: Block diagram illustrating DPN software.

The present invention also includes novel components for more precisely depositing patterns on a substrate by DPN. In particular, the present invention includes a component that receives as input dot sizes and line widths of the patterning compound to be deposited on the substrate, and subsequently determines the corresponding parameter values that can be used in controlling the lower level software and hardware that deposits the substance on the substrate, e.g., such lower level software and hardware includes AFM systems. That is, since such lower level software and hardware (also denoted herein as AFM software and AFM hardware) typically are controlled by inputs such as "holding time" or stationarily depositing a dot of a desired size (e.g., diameter), and/or substrate drawing speed for depositing a line having a desired line width, the present invention includes a component for translating between: (a) dot size and line width, and (b) holding time and drawing speed, respectively. Moreover, since it is has been determined that dot size and line width are each a function of the diffusion rate of the patterning compound onto the substrate, the component for translating (also denoted a "pattern translator" or merely "translator" herein) translates between (a) and (b) above by using such diffusion rates. In particular, the applicants have determined that:

(i) dot size may be determined according to the following equation:

$$R = \sqrt{C^* t/\pi},$$

where R is the radius of the dot, t is the holding time, and C is the diffusion constant, wherein C is, in turn, determined by the tip characteristics, the substrate, the patterning compound, and the contact force of the tip against the substrate; and (ii) line width may be determined according to the following equation:

$$W = C/s,$$

wherein W is the line width, s is the tip sweeping (e.g., drawing) speed, and C is as described above To more fully describe the components for performing the precision DPN of the present invention, reference is made to FIG. 28A which is a high level diagram of the DPN system 2004 of the present invention. Accordingly, this system includes a DPN geometry engine 2008 which provides a user interactive DNP application software components for allowing a user to interactively design DPN patterns. In one embodiment, the DNP application components are provided on a WINDOWS 2000 platform by Microsoft Corp. More specifically, the DPN geometry engine 2008 includes the following modules:

To more fully describe the components for performing the precision DPN of the present invention, reference is made to FIG. 28A which is a high level diagram of the DPN system 2004 of the present invention. Accordingly, this system includes a DPN geometry engine 2008 which provides a user interactive DNP application software components for allowing a user to interactively design DPN patterns. In one embodiment, the DNP application components are provided on a WINDOWS 2000 platform by Microsoft Corp. More specifically, the DPN geometry engine 2008 includes the following modules:

(a) A computer aided design system 2012 (CAD) for generating at least two dimensional patterns.

(b) A user interface 2016 for interacting with the computer aided design system, and for supplying information related specifically to the DPN process to be performed, such as, the identifications of the substrate, and the patterning compound to be deposited. Additionally, a user may be able to input tip characteristics such as tip shape, and tip materials, as well as an expected tip contact force against substrate. Note that the user interface 2016 may provide graphical presentations to the user's display 2020. Alternatively, the user interface may receive input from a non-interactive source such a networked database (not shown). In one embodiment, the user may have multiple concurrent window presentations of his/her pattern or design.

(c) A DPN runtime parameter storage 2024 for storing the DPN specific parameters such as the identification of the substrate and patterning compound, the tip characteristics, and contact force as in (b) immediately above.

Patterns are output from the CAD 2012 to the pattern translator 2028 for translating into specifications of dots and piecewise linear shapes that can then be output to the drawing system 2030 which, e.g., may be an atomic force microscope system. In particular, this output is provided to the AFM software drivers 2032, wherein as mentioned above these drivers accept commands having values of holding time and drawing speed rather than dot size and line width. Additionally, the pattern translator 2028 also receives input from the DPN runtime parameter storage 2024 providing the parameter values identified in (c) above. Note that upon receiving the inputs from the CAD 2012 and the parameter storage 2024, the pattern translator 2028 may query a diffusion calibration database/expert system 2036 for the diffusion constant(s) C as described hereinabove. That is, the pattern translator 2028 uses the parameter values obtained from the parameter storage 2024 to query the diffusion calibration database/expert system 2036 for the corresponding diffusion constant(s) C that are to be applied to corresponding input from the CAD 2012. Subsequently, the pattern translator 2028 generates AFM commands for output to the AFM software drivers 2032, wherein each of the AFM commands is typically one of the following tip movement commands:

(a) Keep the tip away from the substrate surface.

(b) Hold the tip in contact with the substrate surface at a fixed position for a given time (t) with a given force.

(c) Move the tip, while in contact with the substrate, in a line from a first point to a second point at a given (fixed or variable) speed.

Subsequently, the AFM software drivers 2032 direct the AFM hardware 2040 to apply the patterning compound to the substrate according to the commands received by the AFM software drivers 2032. Note that, for at least some of the AFM commands, the corresponding tip movement is in a range of approximately one nanometer to one hundred micrometers. However, dots provided by the present invention may be approximately one nanometer. Moreover, it is within the scope of the present invention that the AFM software drivers 2032 and the AFM hardware 2040 may utilize multiple drawing tips for drawing on the substrate. In particular, each drawing tip may use a different patterning compound (e.g., different ink). Note that the AFM software drivers 2032 may generate the tip controls for which of the multiple tips to use at any given time during a drawing of a pattern by the drawing system 2030.

Note that the AFM software drivers 2032 can be commercially obtained from Thermomicroscopes, 9830 S. 51st Street, Suite A 124 Phoenix, Ariz. 85044. Additionally, the AFM hardware can be obtained from Thermomicroscopes or one or more of the following companies: Veeco_Inc., 112 Robin Hill Road, Santa Barbara, Calif. 93117, or Molecular Imaging Inc., 1171 Borregas Avenue, Sunnyvale, Calif. 94089.

Additionally, note in an alternative embodiment, the diffusion rates may be empirically determined by the user, and accordingly, the diffusion calibration database/expert system 2036 maybe be unnecessary. Instead the user may enter the diffusion rates, e.g., via the user interface 2016.

Figure 28B:
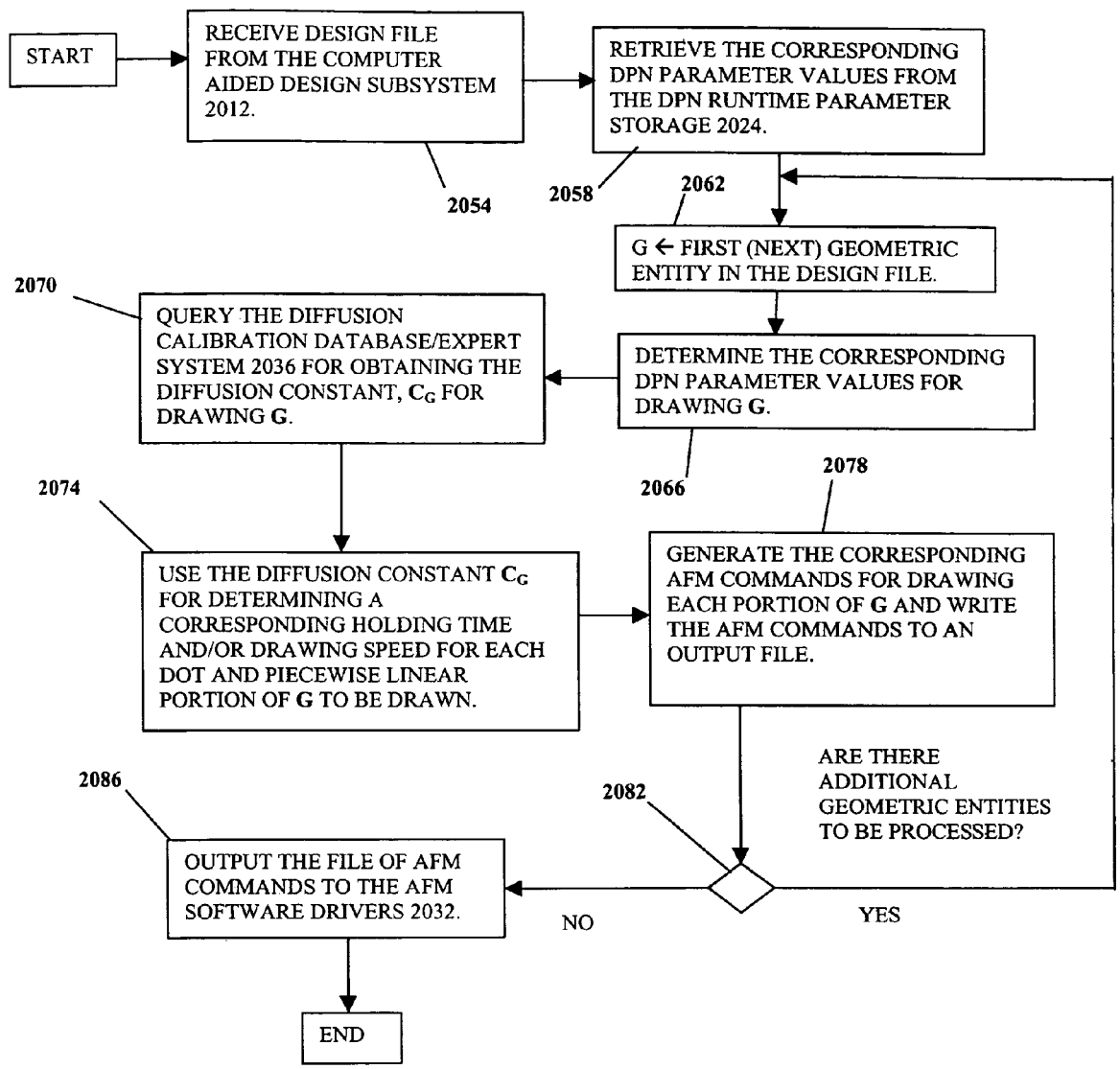
FIG. 28B: Flow chart illustrating pattern translator subroutine of DPN software.

In FIG. 28B a high level flowchart is provided of the steps performed by the pattern translator 2028. In step 2054, the pattern translator 2028 receives a design (CAD) file from the CAD 2012. In step 2058, the pattern translator 2028 retrieves all corresponding DPN parameters for the DPN runtime parameter storage 2024. Note that, in one embodiment, there may be different such parameter values for different geometric data entities in the CAD file. Additionally, note that in another embodiment, the DPN parameter values may be provided in the CAD file and associated with their corresponding geometric entities. Further, in a simple case where such DPN parameter values are the same for all geometric entities, the DPN parameter values may occur in the CAD file only once wherein this occurrence is applicable to all geometric entities therein. Following this, in step 2062, a first geometric entity in the design file is obtained (denoted herein as "G"). Thus, in step 2066, the corresponding DPN parameter values are determined for G. Subsequently, in step 2070, the diffusion constant, $C_0$, is obtained from the diffusion calibration database/expert system 2036. Note that as this database's name implies, it may be substantially a database (e.g., a relational database) that contains, e.g., a table associating a dot size, a patterning compound, a substrate, tip characteristics, and a contact force with a desired holding time for obtaining the dot size for the patterning compound on the substrate when the tip has the tip characteristics and the tip contacts the substrate surface with the contact force. Similarly, such a database will have a table associating a line width, a patterning compound, a substrate, tip characteristics, and a contact force with a desired holding time for obtaining the line width for a line of the patterning compound on the substrate when the tip has the tip characteristics and the tip contacts the substrate surface with the contact force. For example, the following is an illustration of entries in such a table:

| Patterning Compounds | Substrate | Tip | Contact force | Diffusion constant |
|---|---|---|---|---|
| 1-octadecanethiol | gold | Microlever A | 1 nano newton | 0.08 mm$^2$/sec |
| 16-mercaptohexadecanoic acid | gold | Microlever A | 1 nano newton | 0.04 mm$^2$/sec |
| Silazane | gold | Microlever A | 1 nano newton | 0.05 mm$^2$/sec |
| Silazane | gold | Microlever A | 1 nano newton | 0.03 mm$^2$/sec |

Note, however, in some embodiments, such tables may be very large and/or not all combinations will have been previously determined (i.e., calibrated). Accordingly, where the invention embodiment is used with, e.g., various combinations of patterning compounds (e.g., different inks, or etching mask substances), and/or on various substrates, and/or where various types of tips may be used, the diffusion calibration database/expert system 2036 may intelligently compute, infer or interpolate a likely holding time and/or drawing speed. For example, a rule based expert system may be one embodiment of the diffusion calibration database/expert system 2036 for determining a likely diffusion constant. Additionally, note that when such a new a dot size and/or line width is verified for a particular patterning compound, substrate, tip characteristics, and contact force, then such values may be associated and stored for subsequent use by the diffusion calibration database/expert system 2036.

In another alternative embodiment, instead of storing the diffusion constant, the holding times and drawing speeds may be associated with dot size and line width as well as the patterning compound, substrate, tip characteristics, and contact force.

Referring again to FIG. 28B, in step 2074, the diffusion constant $C_0$ is used to determine a corresponding holding time and/or drawing speed for, respectively, each dot and piecewise linear portion of G. Thus, in step 2078, the pattern translator 2028 generates the AFM commands for drawing each portion of G and writes the generated AFM commands to an output file. Note, the software for generating sequences of AFM commands for drawing geometric entities is known to those skilled in the art, and such software is used in, e.g., dot matrix printers. Consequently, in step 2082, a determination is made as to whether there are additional geometric entities in the CAD file that need to be translated into AFM drawing commands. If so, then step 2062 is again encountered. Alternatively, step 2086 is performed, wherein the output file of AFM commands is provided as input to the AFM software drivers 2032.

Note that further details regarding the pattern translator 2020 are provided in the APPENDIX hereinbelow.

The invention also provides kits for performing DPN. In one embodiment, the kit comprises a container holding a patterning compound and instructions directing that the patterning compound be used to coat a scanning probe microscope tip and that the coated tip should be used to apply the patterning compound to the substrate so as to produce a desired pattern. This kit may further comprise a container holding a rinsing solvent, a scanning probe microscope tip a substrate, or combinations thereof. In another embodiment, the kit comprises a scanning probe microscope tip coated with a patterning compound. This kit may further comprise a substrate, one or more containers, each holding a patterning compound or a rinsing solvent, or both. The substrates, tips, patterning compounds, and rinsing solvents are those described above. Any suitable container can be used, such as a vial, tube, jar, or a well or an array of wells. The kit may further comprise materials for forming a thin solid adhesion layer to enhance physisorption of the patterning compounds to the tips as described above (such as a container of titanium or chromium), materials useful for coating the tips with the patterning compounds (such as solvents for the patterning compounds or solid substrates for direct contact scanning), materials for performing lithography by methods other than DPN (see the Background section and references cited therein), and/or materials for wet etching. Finally, the kit may comprise other reagents and items useful for performing DPN or any other lithography method, such as reagents, beakers, vials, etc.

The invention further provides an AFM adapted for performing DPN. In one embodiment, this microscope comprises a sample holder adapted for receiving and holding a substrate and at least one well holding a patterning compound, the well being positioned so that it will be adjacent the substrate when the substrate is placed in the sample holder and and so that it can be addressed by an SPM tip mounted on the AFM. The sample holder, wells and tips are described above. In another embodiment, the microscope comprises a plurality of scanning probe microscope tips and a tilt stage adapted for receiving and holding a sample holder, the sample holder being adapted for receiving and holding a substrate. The plurality of scanning pr e microscope tips and the tilt stage are described above.

As noted above, when an AFM is operated in air, water condenses between the tip and surface and then is transported by means of the capillary as the tip is scanned across the surface. This filled capillary, and the capillary force associated with it, significantly impede the operation of the AFM and substantially affect the imaging process.

Quite surprisingly, it has been found that AFM tips coated with certain hydrophobic compounds exhibit an improved ability to image substrates in air by AFM as compared to uncoated tips. The reason for this is that the hydrophobic molecules reduce the size of the water meniscus formed and effectively reduce friction. As a consequence, the resolution of AFM in air is increased using a coated tip, as compared to using an uncoated tip. Accordingly, coating tips with the hydrophobic molecules can be utilized as a general pretreatment for AFM tips for performing AFM in air.

Hydrophobic compounds useful for coating AFM tips for performing AFM in air must form a uniform thin coating on the tip surface, must not bind covalently to the substrate being imaged or to the tip, must bind to the tip more strongly than to the substrate, and must stay solid at the temperature of AFM operation. Suitable hydrophobic compounds include those hydrophobic compounds described above for use as patterning compounds, provided that such hydrophobic patterning compounds are not used to coat AFM tips which are used to image a corresponding substrate for the patterning compound or to coat AFM tips which are made of, or coated with, materials useful as the corresponding substrate for the patterning compound. Preferred hydrophobic compounds for most substrates are those having the formula $R_4NH_2$, wherein $R_4$ is an alkyl of the formula $CH_3(CN_2)$ or an aryl, and n is 0-30, preferably 10-20 (see discussion of patterning compounds above). Particularly preferred is 1-dodecylamine for AFM temperatures of operation below 74° F. (about 23.3° C.).

AFM in air using any AFM tip may be improved by coating the AFM tip with the hydrophobic compounds described in the previous paragraph. Suitable AFM tips include those described above for use in DPN.

AFM tips can be coated with the hydrophobic compounds in a variety of ways. Suitable methods include those described above for coating AFM tips with patterning compounds for use in DPN. Preferably, the AFM tip is coated with a hydrophobic compound by simply dipping the tip into a solution of the compound for a sufficient time to coat the tip and then drying the coated tip with an inert gas, all as described above for coating a tip with a patterning compound.

After the tip is coated, AFM is performed in the same manner as it would be if the tip were not coated. No changes in AFM procedures have been found necessary.

EXAMPLES

Example 1

"Dip Pen" Nanolithography with Alkanethiols on a Gold Substrate

The transfer of 1-octadecanethiol (ODT) to gold (Au) surfaces is a system that has been studied extensively. See Bain et al., *Angew. Chem. Int. Ed. Engl*, 28:506 (1989); A. Ulman, *An Introduction to Ultrathin Organic Films: From Langmuir-Blodgett to Self-Assembly* (Academic Press, Boston, 1991); Dubois et al., *Annu. Rev. Phys. Chem.*, 43:437 (1992); Bishop et al., *Curr. Opin. Coll. Interf. Sci.*, 1:127(1996); Alves et al., *J. Am. Chem. Soc.*, 114:1222(1992). Au having this moderately-air-stable molecule immobilized on it can be easily differentiated from unmodified Au by means of lateral force microscopy (LFM).

When an AFM tip coated with ODT is brought into contact with a sample surface, the ODT flows from the tip to the sample by capillary action, much like a dip pen (FIG. 1). This process has been studied using a conventional AFM tip on thin film substrates that were prepared by thermally evaporating 300 Å of polycrystalline Au onto mica at room temperature. A Park Scientific Model CP AFM instrument was used to perform all experiments. The scanner was enclosed in a glass isolation chamber, and the relative humidity was measured with a hygrometer. All humidity measurements have an absolute error of ±5%. A silicon nitride tip (Park Scientific, Microlever A) was coated with ODT by dipping the cantilever into a saturated solution of ODT in acetonitrile for 1 minute. The cantilever was blown dry with compressed difluoroethane prior to use.

A simple demonstration of the DPN process involved raster scanning a tip that was prepared in this manner across a 1 μm by 1 μm section of a Au substrate (FIG. 2A). An LFM image of this section within a larger scan area (3 μm by 3 μm) showed two areas of differing contrast (FIG. 2A). The interior dark area, or region of lower lateral force, was a deposited monolayer of ODT, and the exterior lighter area was bare Au.

Formation of high-quality self-assembled monolayers (SAMs) occurred when the deposition process was carried out on Au(111)/mica, which was prepared by annealing the Au thin film substrates at 300° C. for 3 hours. Alves et al., *J Am. Chem. Soc.*, 114:1222 (1992). In this case, it was possible to obtain a lattice-resolved image of an ODT SAM (FIG. 2B). The hexagonal lattice parameter of 5.0±0.2 Å compares well with reported values for SAMs of ODT on Au(111) (Id.) and shows that ODT, rather than some other adsorbate (water or acetonitrile), was transported from the tip to the substrate.

Although the experiments performed on Au(111)/mica provided important information about the chemical identity of the transported species in these experiments, Au(111)/mica is a poor substrate for DPN. The deep valleys around the small Au(111) facets make it difficult to draw long (micrometer) contiguous lines with nanometer widths.

The nonannealed Au substrates are relatively rough (root-mean square roughness 2 nm), but 30 nm lines could be deposited by DPN (FIG. 2C). This distance is the average Au grain diameter of the thin film substrates and represents the resolution limit of DPN on this type of substrate. The 30-nm molecule-based line prepared on this type of substrate was discontinuous and followed the grain edges of the Au. Smoother and more contiguous lines could be drawn by increasing the line width to 100 nm (FIG. 2D) or presumably by using a smoother Au substrate. The width of the line depends upon tip scan speed and rate of transport of the alkanethiol from the tip to the substrate (relative humidity can change the transport rate). Faster scan speeds and a smaller number of traces give narrower lines.

DPN was also used to prepare molecular dot features to demonstrate the diffusion properties of the "ink" (FIGS. 3A and 3B). The ODT-coated tip was brought into contact (set point=1 nN) with the Au substrate for a set period of time. For example, 0.66 μm, 0.88 μm, and 1.6 μm diameter ODT dots were generated by holding the tip in contact with the surface for 2, 4, and 16 minutes, respectively (left to right, FIG. 3A). The uniform appearance of the dots likely reflects an even flow of ODT in all directions from the tip to the surface. Opposite contrast images were obtained by depositing dots of an alkanethiol derivative, 16-mercaptohexadecanoic acid in an analogous fashion (FIG. 3B). This not only provides additional evidence that the molecules are being transported from the tip to the surface but also demonstrates the molecular generality of DPN.

Arrays and grids could be generated in addition to individual lines and dots. An array of twenty-five 0.46-μm diameter ODT dots spaced 0.54 μm apart (FIG. 3C) was generated by holding an ODT-coated tip in contact with the surface (1 nM) for 20 seconds at 45% relative humidity without lateral movement to form each dot. A grid consisting of eight intersecting lines 2 μm in length and 100 nm wide (FIG. 3D) was generated by sweeping the ODT-coated tip on a Au surface at a 4 μm per second scan speed with a 1 nN force for 1.5 minutes to form each line.

Example 2

"Dip Pen" Nanolithography with a Variety of Substrates and "Inks"

A large number of compounds and substrates have been successfully utilized in DPN. They are listed below in Table 1, along with possible uses for the combinations of compounds and substrates.

AFM tips (Park Scientific) were used. The tips were silicon tips, silicon nitride tips, and silicon nitride tips coated with a 10 nm layer of titanium to enhance physisorption of patterning compounds. The silicon nitride tips were coated with the titanium by vacuum deposition as described in Holland, *Vacuum Deposition Of Thin Films* (Wiley, New York, N.Y., 1956). It should be noted that coating the silicon nitride tips with titanium made the tips dull and decreased the resolution of DPN. However, titanium-coated tips are useful when water is used as the solvent for a patterning compound. DPN performed with uncoated silicon nitride tips gave the best resolution (as low as about 10 nm).

Metal film substrates listed in Table 1 were prepared by vacuum deposition as described in Holland, *Vacuum Deposition Of Thin Films* (Wiley, New York, N.Y., 1956). Semiconductor substrates were obtained from Electronic Materials, Inc., Silicon Quest, Inc. MEMS Technology Applications Center, Inc., or Crystal Specialties, Inc.

The patterning compounds listed in Table 1 were obtained from Aldrich Chemical Co. The solvents listed in Table 1 were obtained from Fisher Scientific.

The AFM tips were coated with the patterning compounds as described in Example 1 (dipping in a solution of the patterning compound followed by drying with an inert gas), by vapor deposition or by direct contact scanning. The method of Example 1 gave the best results. Also, dipping and drying the tips multiple times further improved results.

The tips were coated by vapor deposition as described in Sherman, *Chemical Vapor Deposition For Microelectronics: Principles, Technology And Applications* (Noyes, Park Ridges, N.J., 1987). Briefly, a patterning compound in pure form (solid or liquid, no solvent) was placed on a solid substrate (e.g., glass or silicon nitride; obtained from Fisher Scientific or MEMS Technology Application Center) in a closed chamber. For compounds which are oxidized by air, a vacuum chamber or a nitrogen-filled chamber was used. The AFM tip was position about 1-20 cm from the patterning compound, the distance depending on the amount of material and the chamber design. The compound was then heated to a temperature at which it vaporizes, thereby coating the tip with the compound. For instance, 1-octadecanethiol can be vapor deposited at 60° C. Coating the tips by vapor deposition produced thin, uniform layers of patterning compounds on the tips and gave quite reliable results for DPN.

The tips were coated by direct contact scanning by depositing a drop of a saturated solution of the patterning compound on a solid substrate (e.g., glass or silicon nitride; obtained from Fisher Scientific or MEMS Technology Application Center). Upon drying, the patterning compound formed a microcrystalline phase on the substrate. To load the patterning compound on the AFM tip, the tip was scanned repeatedly (~5 Hz scan speed) across this microcrystalline phase. While this method was simple, it did not lead to the best loading of the tip, since it was difficult to control the amount of patterning compound transferred from the substrate to the tip.

DPN was performed as described in Example 1 using a Park Scientific AFM, Model CP, scanning speed 5-10 Hz. Scanning times ranged from 10 seconds to 5 minutes. Patterns prepared included grids, dots, letters, and rectangles. The width of the grid lines and the lines that formed the letters ranged from 15 nm to 250 nm, and the diameters of the individual dots ranged from 12 nm to 5 micrometers.

TABLE 1

| Substrate | Patterning Compound/ Solvent(s) | Potential Applications | Comments and References |
|---|---|---|---|
| Au | n-octadecanethiol/ acetonitrile, ethanol | Basic research | Study of intermolecular forces, Langmuir 10, 3315 (1994) |
| | | Etching resist for microfabrication | Etchant: KCN/O$_2$ (pH~14), J. Vac. Sci. Tech. B, 13, 1139 |
| | Dodecanethiol/ acetonitrile, ethanol | Molecular electronics | Insulating thin coating on nanometer scale gold clusters. Superlattices and Microstructures 18, 275 (1995) |
| | n-hexadecanethiol/ acetonitrile, ethanol | Etching resist for microfabrication | Etchant: KCN/O$_2$ (pH~14). Langmuir, 15, 300 (1999) |
| | n-docosanethiol/ acetonitrile, ethanol | Etching resist for microfabrication | Etchant: KCN/O$_2$ (pH~14). J. Vac. Sci. Technol. B, 13, 2846 (1995) |
| | 11-mercapto-1-undecanol/ acetonitrile, ethanol | Surface functionalization | Capturing SiO$_2$ clusters |
| | 16-mercapto-1-hexadecanoic acid/ acetonitrile, ethanol. | Basic research | Study of intermolecular forces. Langmuir 14, 1508 (1998) |
| | | Surface functionalization | Capturing SiO$_2$, SnO$_2$ clusters. J. Am. Chem. Soc., 114, 5221 (1992) |
| | Octanedithiol/ acetonitrile, ethanol | Basic research | Study of intermolecular forces. Jpn. J. Appl. Phys. 37, L299 (1998) |
| | Hexanedithiol/ acetonitrite, ethanol | Surface functionalization | Capturing gold clusters. J. Am. Chem. Soc., 114, 5221 (1992) |
| | Propariedithiol/ acetonitrile, ethanol | Basic research | Study of intermolecular forces. J. Am. Chem. Soc., 114, 5221 (1992) |
| | α,α'-p-xylyldithiol/ acetonitrile, ethanol | Surface functionalization | Capturing gold clusters. Science, 272, 1323 (1996) |
| | | Molecular electronics | Conducting nanometer scale Science, 272, 1323 (1996) |
| | 4,4'-biphenyldithiol/ acetonitrile, ethanol | Surface functionalization | Capturing gold and CdS clusters, Inorganica Chemica Acta 242, 115 (1996) |
| | Terphenyldithiol/ acetonitrile, ethanol | Surface functionalization | Capturing gold and CdS clusters, Inorganica Chemica Acta 242, 115 (1996) |
| | terphenyldiisocyanide/ acetonitrile, methylene chloride | Surface functionalization | Capturing gold and CdS clusters, Inorganica Chemica Acta 242, 115 (1996) |
| | | Molecular electronics | Conductive coating on nanometer scale gold clusters. Superlattices and Microstructures, 18, 275 (1995) |

TABLE 1-continued

| Sub-strate | Patterning Compound/ Solvent(s) | Potential Applications | Comments and References |
|---|---|---|---|
| | DNA/water: acetonitrile (1.3) | Gene detection | DNA probe to detect biological cells. J. Am. Chem. Soc. 119, 8916 (1997) |
| Ag | n-hexadecanethiol/ acetonitrile, ethanol | Etching resist for microfabrication | Etchant: $Fe(NO_3)_3$ (pH~6). Microlectron. Eng., 32, 255 (1996) |
| Al | 2-mercaptoacetic acid/ acetonitrile, ethanol | Surface functionalization | Capturing CdS clusters. J. Am. Chem. Soc., 114, 5221 (1992) |
| GaAs-100 | n-octadecanethiol/ acetonitrile ethanol | Basic research | Self assembled monolayer formation |
| | | Etching resist for microfabrication | $HCl/HNO_3$(pH~1). J. Vac. Sci. Technol. B, 11, 2823 (1993) |
| TiO2 | n-octadecanethiol/ acetonitrile, ethanol | Etching resist for microfabrication | |
| SiO2 | 16-mercapto-1-hexadecanoic acid/ acetonitrile, ethanol | Surface functionalization | Capturing gold and CdS clusters |
| | octadecyltrichlorosilane(OTS, $CH_3(ch_2)_{17}SiCl_3$) 1.2 nm thick SAM/ hexane | Etching resist for microfabrication | Etchant: $HF/NH_4F$ (pH~2). Appl. Phys. Lett., 70, 1593 (1997) |
| | APTS, 3-(2-Aminoethylamino)pro poltrimethoxysilane/ water | Surface functionalization | Capturing nanometer scale gold clusters Appl. Phys. Lett. 70, 2759 (1997) |

Example 3

Atomic Force Microscopy with Coated Tips

As noted above, when an AFM is operated in air, water condenses between the tip and surface and then is transported by means of the capillary as the tip is scanned across the surface. Piner et al., *Langmuir* 13, 6864-6868 (1997). Notably, this filled capillary, and the capillary force associated with it, significantly impede the operation of the AFM, especially when run in lateral force mode. Noy et al., *J. Am. Chem. Soc.* 117, 7943-7951 (1995); Wilbur et al., *Langmuir* 11, 825-831 (1995). In air, the capillary force can be 10 times larger than chemical adhesion force between tip and sample. Therefore, the capillary force can substantially affect the structure of the sample and the imaging process. To make matters worse, the magnitude of this effect will depend on many variables, including the relative hydrophobicities of the tip and sample, the relative humidity, and the scan speed. For these reasons, many groups have chosen to work in solution cells where the effect can be made more uniform and reproducible. Frisbie et al., *Science* 265, 2071-2074 (1994); Noy et al., *Langmuir* 14, 1508-1511(1998). This, however, imposes a large constraint on the use of an AFM, and solvent can affect the structure of the material being imaged. Vezenov et al., *J. Am. Chem. Soc.* 119, 2006-2015 (1997). Therefore, other methods that allow one to image in air with the capillary effect reduced or eliminated would be desirable.

This example describes one such method. The method involves the modification of silicon nitride AFM tips with a physisorbed layer of 1-dodecylamine. Such tips improve one's ability to do LFM in air by substantially decreasing the capillary force and providing higher resolution, especially with soft materials.

All data presented in this example were obtained with a Park Scientific Model CP AFM with a combined AFM/LFM head. Cantilevers (model no. MLCT-AUNM) were obtained from Park Scientific and had the following specifications: gold coated microlever, silicon nitride tip, cantilever A, spring constant=0.05 N/m. The AFM was mounted in a Park vibration isolation chamber which had been modified with a dry nitrogen purge line. Also, an electronic hygrometer, placed inside the chamber, was used for humidity measurements (±5% with a range of 12~100%). Muscovite green mica was obtained from Ted Pella, Inc. Soda lime glass microscope slides were obtained from Fisher. Polystyrene spheres with 0.23±0.002 μm diameters were purchased from Polysciences, and $Si_3N_4$ on silicon was obtained from MCNC MEMS Technology Applications Center. 1-Dodecylamine (99+%) was purchased from Aldrich Chemical Inc. and used without further purification. Acetonitrile (A.C.S. grade) was purchased from Fisher Scientific Instruments, Inc.

Two methods for coating an AFM tip with 1-dodecylamine were explored. The first method involved saturating ethanol or acetonitiile with 1-dodecylamine and then depositing a droplet of this solution on a glass substrate. Upon drying, the 1-dodecylamine formed a microcrystalline phase on the glass substrate. To load the 1-dodecylamine on the AFM tip, the tip was scanned repeatedly (~5 Hz scan speed) across this microcrystalline phase. While this method was simple, it did not lead to the best loading of the tip, since it was difficult to control the amount of 1-dodecylamine transferred from the substrate to the tip.

A better method was to transfer the dodecylamine directly from solution to the AFM cantilever. This method involved soaking the AFM cantilever and tip in acetonitrile for several minutes in order to remove any residual contaminants on the tip. Then the tip was soaked in a ~5 mM 1-dodecylamine/ acetonitrile solution for approximately 30 seconds. Next, the tip was blown dry with compressed freon. Repeating this procedure several times typically gave the best results. The 1-dodecylamine is physisorbed, rather than chemisorbed, onto the silicon nitride tips. Indeed, the dodecylamine can be rinsed off the tip with acetonitrile as is the case with bulk silicon nitride. Benoit et al. *Microbeam and Nanobeam Analysis*; Springer Verlag, (1996). Modification of the tip in this manner significantly reduced the capillary effects due to atmospheric water condensation as evidenced by several experiments described below.

Figure 4:
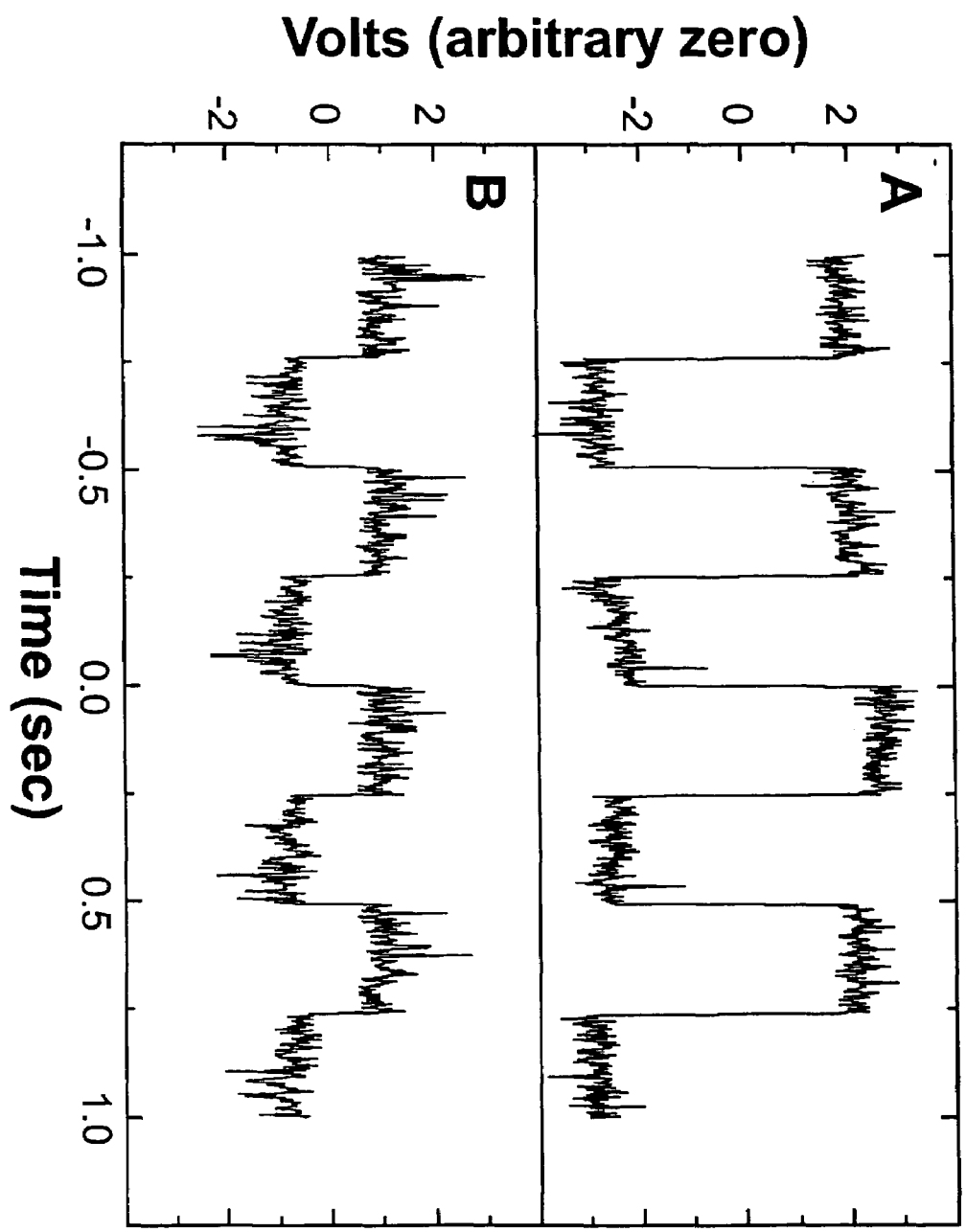
FIGS. 4A-B. Oscilloscope recordings of lateral force detector output before the AFM tip was coated with 1-dodecylamine (FIG. 4A) and after the tip had been coated with 1-dodecylamine (FIG. 4B). The time of the recording spans four scan lines. Since the signal was recorded during both left and right scans, the heights of the square waves are directly proportional to the friction. The Y-axis zero has been shifted for clarity.

First, a digital oscilloscope, directly connected to the lateral force detector of the AFM, was used to record the lateral force output as a function of time. In this experiment, the force of friction changed direction when the tip scanned left to right, as compared with right to left. Therefore, the output of the LFM detector switched polarity each time the tip scan direction changed. If one or more AFM raster scans were recorded, the output of the detector was in the form of a square wave, FIG. 4AB. The height of the square wave is directly proportional to the sliding friction of the tip on the sample and, therefore, one can compare the forces of friction between an unmodified tip and a glass substrate and between a modified tip and a glass substrate simply by comparing the height of the square waves under nearly identical scanning and environmental conditions. The tip/sample frictional force was at least a factor of three less for the modified tip than for the unmodified tip. This experiment was repeated on a mica substrate, and a similar reduction in friction was observed. In general, reductions in friction measured in this way and under these conditions ranged from a factor of three to more than a factor of ten less for the modified tips, depending upon substrate and environmental conditions, such as relative humidity.

Figure 5A:
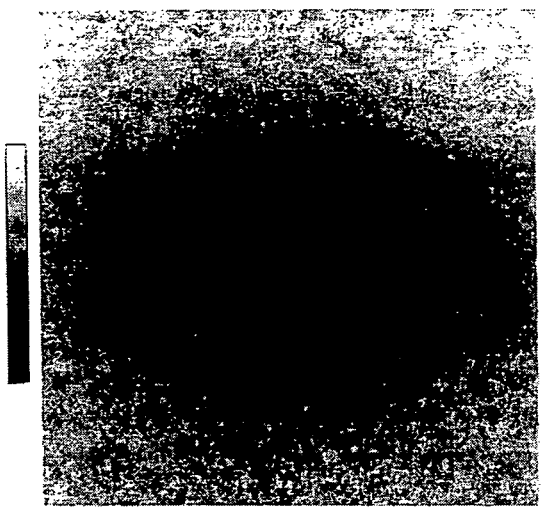
FIGS. 5A-B. Lateral force images showing water transported to a glass substrate (dark area) by an unmodified AFM tip (FIG. 5A) and the result of the same experiment performed with a 1-dodecylamine-coated tip (FIG. 5B). Height bars are in arbitrary units.
Figure 5B:
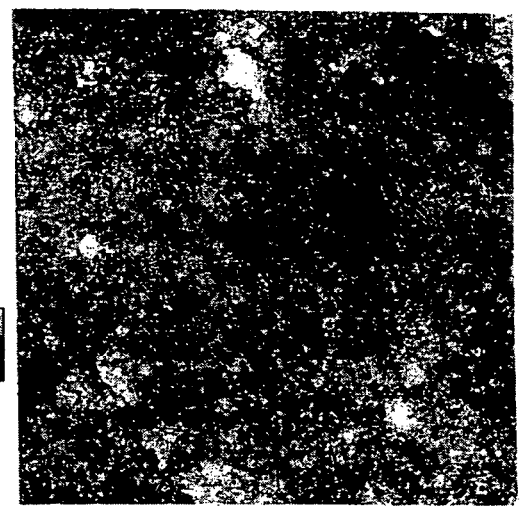

While this experiment showed that 1-dodecylamine treatment of an AFM tip lowered friction, it did not prove that water and the capillary force were the key factors. In another experiment, the effects of the 1-dodecylamine coating on the capillary transport of water was examined. Details of water transport involving unmodified tips have been discussed elsewhere. Finer et al., *Langmuir* 13, 6864-6868 (1997). When an AFM tip was scanned across a sample, it transported water to the sample by capillary action, FIG. 5A. After scanning a 4 μm×5 μm area of a soda glass substrate for several minutes, contiguous adlayers of water were deposited onto the substrate and imaged by LFM by increasing the scan size. Areas of lower friction, where water had been deposited, appeared darker than non-painted areas, FIG. 5A. The same experiment conducted with a tip coated with 1-dodecylamine did not show evidence of substantial water transport, FIG. 5B. Indeed, only random variations in friction were observed.

Figure 6A:
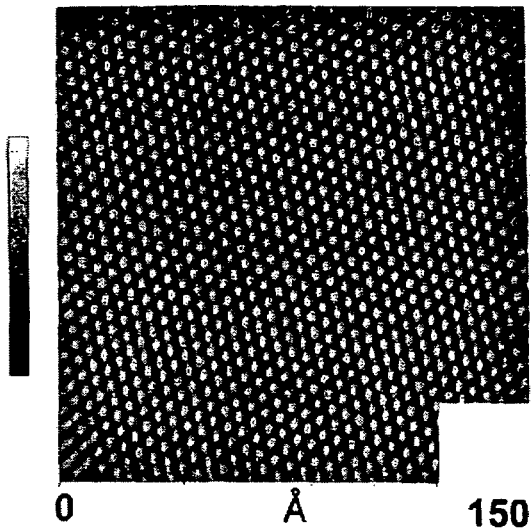
FIG. 6A. Lattice resolved, lateral force image of a mica surface with a 1-dodecylamine-coated tip. The 2D fourier transform is in the insert.

While these experiments showed that friction could be reduced and the transport of water from the tip to the substrate by capillary action could be inhibited by coating the tip with 1-dodecylamine, they did not provide information about the resolving power of the modified tip. Mica is an excellent substrate to evaluate this issue and, indeed, lattice resolved images could be routinely obtained with the modified tips, demonstrating that this modification procedure reduced the force of friction without blunting the tip, FIG. 6A. It was impossible to determine whether the portion of the tip that was involved in the imaging was bare or had a layer of 1-dodecylamine on it. In fact, it is likely that the 1-dodecylamine layer had been mechanically removed from this part of the tip exposing the bare $Si_3N_4$. In any event, the remainder of the tip must have had a hydrophobic layer of dodecylamine on it, since water was inhibited from filling the capillary surrounding the point of contact, thereby reducing the capillary effect (see above).

While the atomic scale imaging ability of the AFM was not adversely affected by the 1-dodecyl amine coating on the tip, the above experiment did not provide useful information about the suitability of the tip for obtaining morphology data on a larger scale. In order to obtain such information, a sample of monodisperse 0.23 μm diameter latex spheres was imaged with both modified and unmodified tips. Since the topography recorded by an AFM is a convolution of the shape of the tip and the shape of the sample, any change in the shape of the tip will be reflected in a change in the imaged topography of the latex spheres. No detectable difference was found in images taken with unmodified and modified tips, respectively, FIGS. 7A-B. This shows that the shape of the tip was not significantly changed as it would be if a metallic coating had been evaporated onto it. Moreover, it suggests that the 1-dodecylamine coating was fairly uniform over the surface of the tip and was sharp enough that it did not adversely affect atomic scale imaging.

Figure 6B:
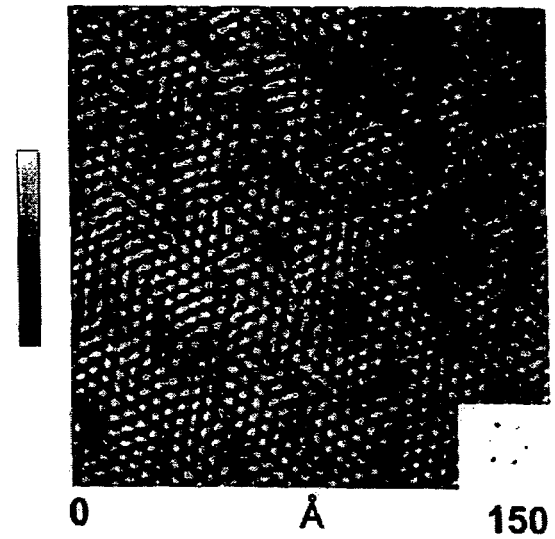
FIG. 6B. Lattice resolved, lateral force image of an self-assembled monolayer of 11-mercapto-1-undecanol. This image has been fourier transform filtered (FFT), and the FFT of the raw data is shown in lower right insert. Scale bars are arbitrary.

A significant issue pertains to the performance of the modified tips in the imaging of soft materials. Typically, it is difficult to determine whether or not a chemically-modified tip exhibits improved performance as compared with a bare tip. This is because chemical modification is often an irreversible process which sometimes requires the deposition of an intermediary layer. However, since the modification process reported herein was based upon physisorbed layers of 1-dodecylamine, it was possible to compare the performance of a tip before modification, after modification, and after the tip had been rinsed and the 1-dodecylamine had been removed. Qualitatively, the 1-dodecylamine-modified tips always provided significant improvements in the imaging of monolayers based upon alkanethiols and organic crystals deposited onto a variety of substrates. For example, a lattice resolved image of a hydrophilic self-assembled monolayer of 11-mercapto-1-undecanol on a Au(111) surface was routinely obtained with a modified tip, FIG. 6B. The lattice could not be resolved with the same unmodified AFM tip. On this surface, the coated tip showed a reduction in friction of at least a factor of five by the square wave analysis (see above). It should be noted, that the OH-terminated SAM is hydrophilic and, hence, has a strong capillary attraction to a clean tip. Reducing the capillary force by the modified tip allows one to image the lattice.

Figure 6C:
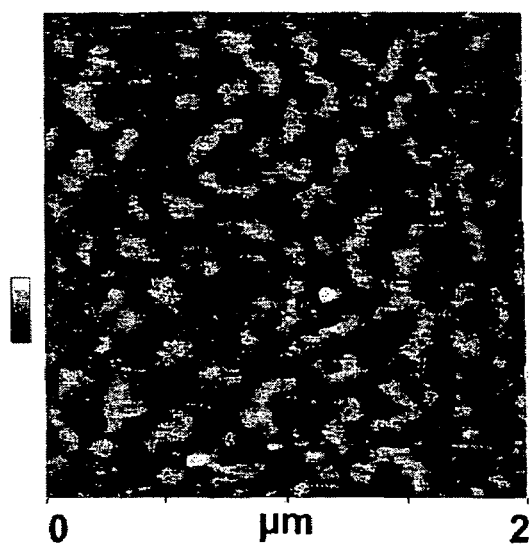
FIG. 6C. Topographic image of water condensation on mica at 30% relative humidity. The height bar is 5 Å.
Figure 6D:
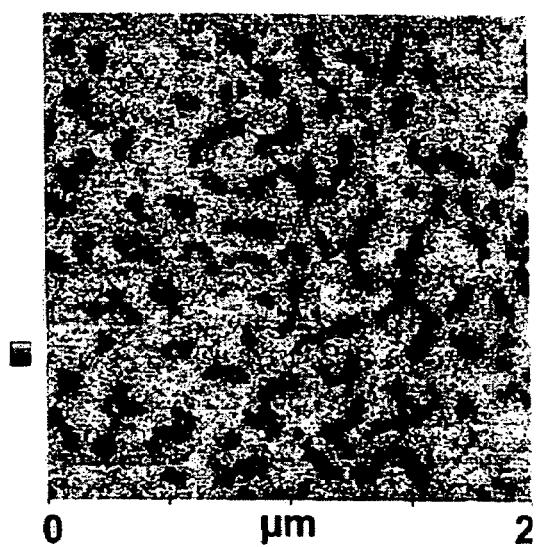
FIG. 6D. Lateral force image of water condensation on mica at 30% relative humidity (same spot as in FIG. 6C).
Figure 8A:
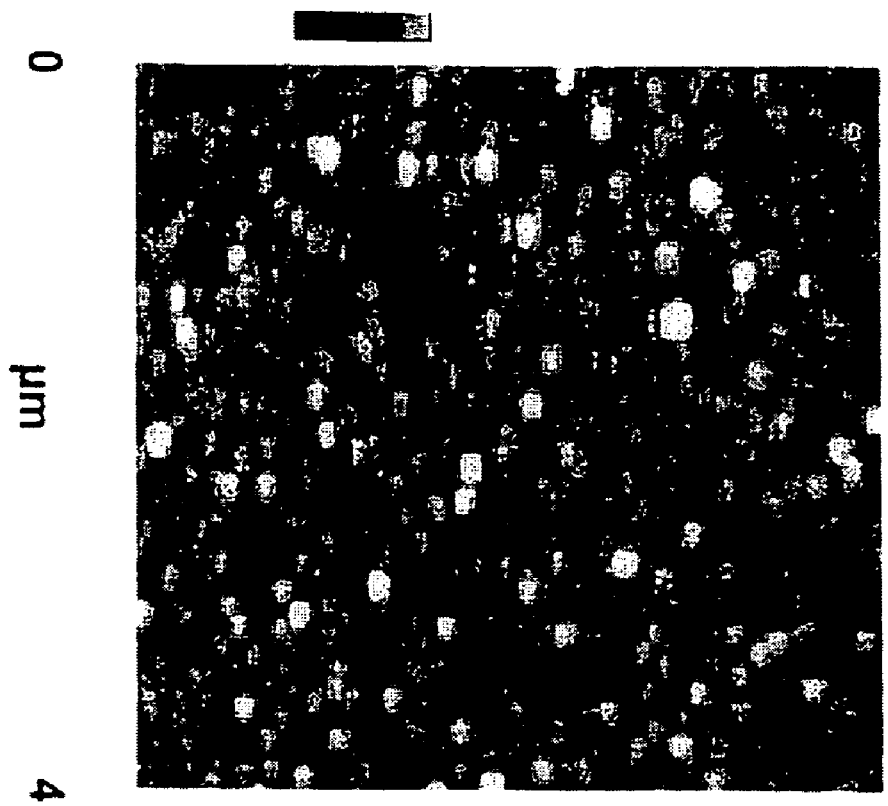
FIGS. 8A-B. Images of a $Si_3N_4$ surface coated with 1-dodecylamine molecules, showing uniform coating.
Figure 8B:
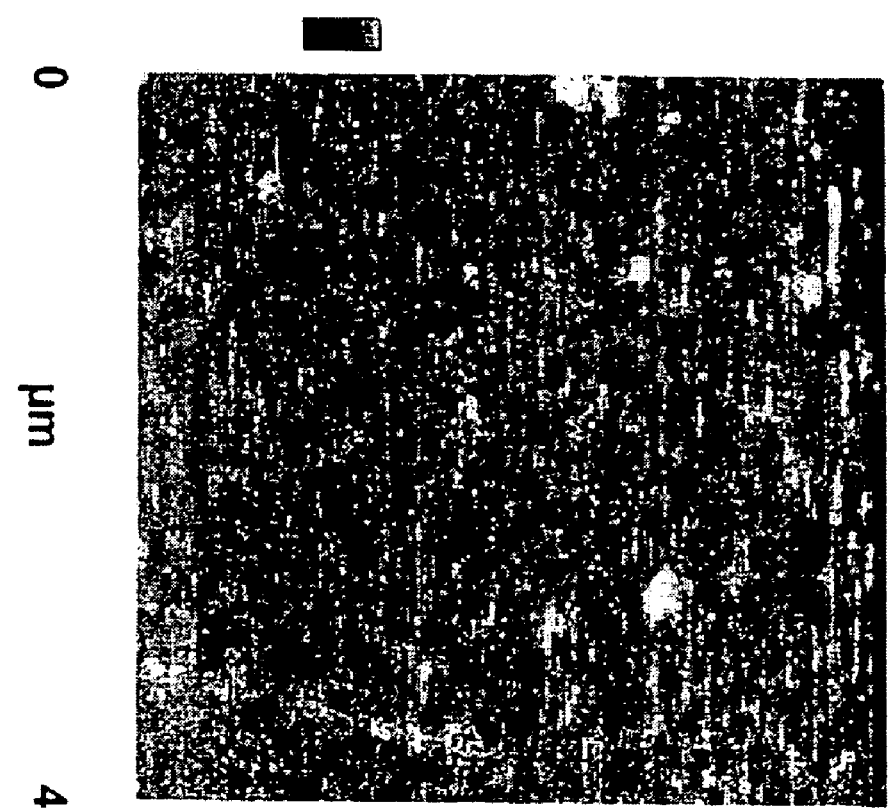

A second example of improved resolution involved imaging free standing liquid surfaces, such as water condensed on mica. It is well known that at humidities between 30 and 40 percent, water has two distinct phases on mica. Hu et al., *Science* 268, 267-269 (1995). In previous work by this group, a non-contact mode scanning polarization force microscope (SPFM) was used to image these phases. It was found that, when a probe tip came into contact with mica, strong capillary forces caused water to wet the tip and strongly disturbed the water condensate on the mica. To reduce the capillary effect so that two phases of water could be imaged, the tip was kept ~20 nm away from the surface. Because of this constraint, one cannot image such phases with a contact mode scanning probe technique. FIGS. 6C-D show images of the two phases of water on mica recorded at 30 percent humidity with a 1-dodecylamine modified tip in contact mode. The heights of the features (FIG. 6C) corresponded with the frictional map (FIG. 6D), with higher features having lower friction. The quality of the modified tip, which it is believed correlates with the uniformity of the 1-dodecylamine layer on the tip, was important. Only well modified tips made it possible to image the two phases of water, while less well modified ones resulted in poorer quality images. In fact, this was such a sensitive test that it could be used as a diagnostic indicator of the quality of the 1-dodecylamine-modified tips before proceeding to other samples.

In conclusion, this example describes a very simple, but extremely useful, method for making $Si_3N_4$ AFM tips hydrophobic. This modification procedure lowers the capillary force and improves the performance of the AFM in air. Significantly, it does not adversely affect the shape of the AFM tip and allows one to obtain lattice resolved images of hydrophilic substrates, including soft materials such as SAMs and even free-standing water, on a solid support. The development of methodology that allows one to get such information in air is extremely important because, although solution cells can reduce the effect of the capillary force, the structures of soft materials can be significantly affected by solvent. Vezenov et al., *J. Am. Soc.* 119, 2006-2015 (1997). Finally, although it might be possible to make an AFM tip more hydrophobic by first coating it with a metal layer and then derivatizing the metal layer with a hydrophobic chemisorbed organic monolayer, it is difficult to do so without concomitantly blunting the AFM tip.

Example 4

Multicomponent "Dip Pen" Nanolithography

The inability to align nanoscale lithographically generated patterns comprised of chemically distinct materials is an issue that limits the advancement of both solid-state and molecule-based nanoelectronics. Reed et al., *Science* 278, 252 (1997); Feldheim, et al., *Chem. Soc. Rev.* 27, 1 (1998). The primary reasons for this problem are that many lithographic processes: 1) rely on masking or stamping procedures, 2) utilize resist layers, 3) are subject to significant thermal drift problems, and 4) rely on optical-based pattern alignment. Campbell, *The Science and Engineering of Microelectronic Fabrication* (Oxford Press); Chou et al., *Appl. Phys. Lett.* 67, 3114 (1995); Wang et al., *Appl. Phys. Lett.* 70, 1593 (1997); Jackman et al., *Science* 269, 664(1995); Kim et al., *Nature* 376, 581(1995); Schoer et al., *Langmuir* 13,2323 (1997); Whelan et al., *Appl. Lett.* 69, 4245 (1996); Younkin et al., *Appl. Phys. Lett.* 71, 1261 (1997); Bottomley, *Anal. Chem.* 70, 425R. (1998); Nyffenegger and Penner, *Chem. Rev.* 97, 1195 (1997); Berggren, et al., *Science* 269, 1255 (1995); Sondag-Huethorst et al., *Appl. Phys. Lett.* 64, 285 (1994); Schoer and Crooks, *Langmuir* 13, 2323 (1997); Xu and Liu, *Langmuir* 13, 127 (1997); Perkins, et al., *Appl. Phys. Lett.* 68, 550 (1996); Carr, et al., *J. Vac. Sci. Technol. A* 15, 1446 (1997); Sugimura et al., *J. Vac. Sci. Technol. A* 14, 1223 (1996); Komeda et al., *J. Vac. Sci. Technol. A* 16, 1680 (1998); Muller et al., *J. Vac. Sci. Technol. B* 13, 2846 (1995); and Kim and M. Lieber, *Science* 257, 375 (1992).

With respect to feature size, resist-based optical methods allow one to reproducibly pattern many materials, soft or solid-state, in the >100 nm line width and spatial resolution regime, while e-beam lithography methods allow one to pattern in the 10-200 nm scale. In the case of soft-lithography, both e-beam lithography and optical methods rely on resist layers and the backfilling of etched areas with component molecules. This indirect patterning approach compromises the chemical purity of the structures generated and poses limitations on the types of materials that can be patterned. Moreover, when more than one material is being lithographically patterned, the optical-based pattern alignment methods used in these techniques limit their spatial resolution to approximately 100 nm.

This example describes the generation of multicomponent nanostructures by DPN, and shows that patterns of two different soft materials can be generated by this technique with near-perfect alignment and 10 nm spatial resolution in an arbitrary manner. These results should open many avenues to those interested in molecule-based electronics to generate, align, and interface soft structures with each other and conventional macroscopically addressable microelectronic circuitry.

Unless otherwise specified, DPN was performed on atomically flat Au(111) substrates using a conventional instrument (Park Scientific CP AFM) and cantilevers (Park Scientific Microlever A). The atomically flat Au(111) substrates were prepared by first heating a piece of mica at 120° C. in vacuum for 12 hours to remove possible water and then thermally evaporating 30 nm of gold onto the mica surface at 220° C. in vacuum. Using atomically flat Au(111) substrates, lines 15 nm in width can be deposited. To prevent piezo tube drift problems, a 100 µm scanner with closed loop scan control (Park Scientific) was used for all experiments. The patterning compound was coated on the tips as described in Example 1 (dipping in a solution) or by vapor deposition (for liquids and low-melting-point solids). Vapor deposition was performed by suspending the silicon nitride cantilever in a 100 ml reaction vessel 1 cm above the patterning compound (ODT). The system was closed, heated at 60° C. for 20 min, and then allowed to cool to room temperature prior to use of the coated tips. SEM analysis of tips before and after coating by dipping in a solution or by vapor deposition showed that the patterning compound uniformly coated the tips. The uniform coating on the tips allows one to deposit the patterning compound on a substrate in a controlled fashion, as well as to obtain high quality images.

Figure 9A:
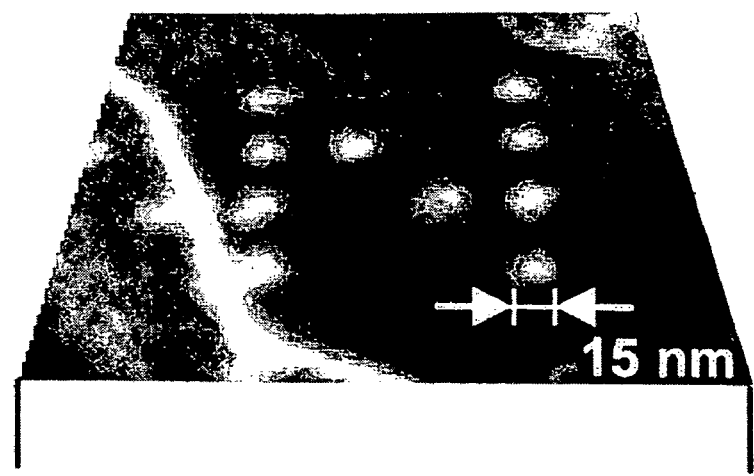
FIGS. 9A-C. Schematic diagrams with lateral force microscopy (LFM) images of nanoscale molecular dots showing the "essential factors" for nanometer scale multiple patterning by DPN. Scale bar is 100 nm.
Figure 9B:
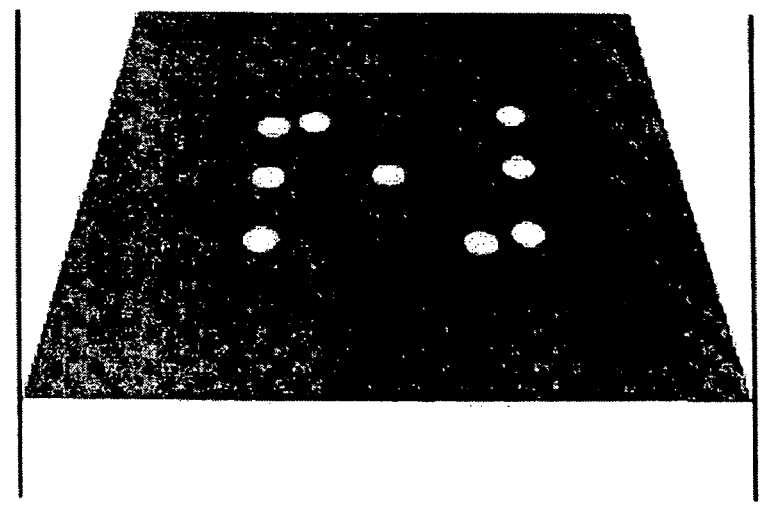
Figure 9C:

Since DPN allows one to image nanostructures with the same tool used to form them, there was the tantalizing prospect of generating nanostructures made of different soft materials with excellent registry. The basic idea for generating multiple patterns in registry by DPN is related to analogous strategies for generating multicomponent structures by e-beam lithography that rely on alignment marks. However, the DPN method has two distinct advantages, in that it does not make use of resists or optical methods for locating alignment marks. For example, using DPN, one can generate 15 nm diameter self-assembled monolayer (SAM) dots of 1,16-mercaptohexadecanoic acid (MHA) on a Au(111) faceted substrate (preparation same as described above for atomically flat Au(111) substrates) by holding an MHA-coated tip in contact (0.1 nN) with the Au(111) surface for ten seconds (see FIG. 9A). By increasing the scan size, the patterned dots are then imaged with the same tip by lateral force microscopy (LFM). Since the SAM and bare gold have very different wetting properties, LFM provides excellent contrast. Wilbur et al., *Langmuir* 11,825 (1995). Based upon the position of the first pattern, the coordinates of additional patterns can be determined (see FIG. 9B), allowing for precise placement of a second pattern of MHA dots. Note the uniformity of the dots (FIG. 9A) and that the maximum misalignment of the first pattern with respect to the second pattern is less than 10 nm (see upper right edge of FIG. 9C). The elapsed time between generating the data in FIGS. 9A and 9C was 10 minutes, demonstrating that DPN, with proper control over environment, can be used to pattern organic monolayers with a spatial and pattern alignment resolution better than 10 nm under ambient conditions.

Figure 10A:
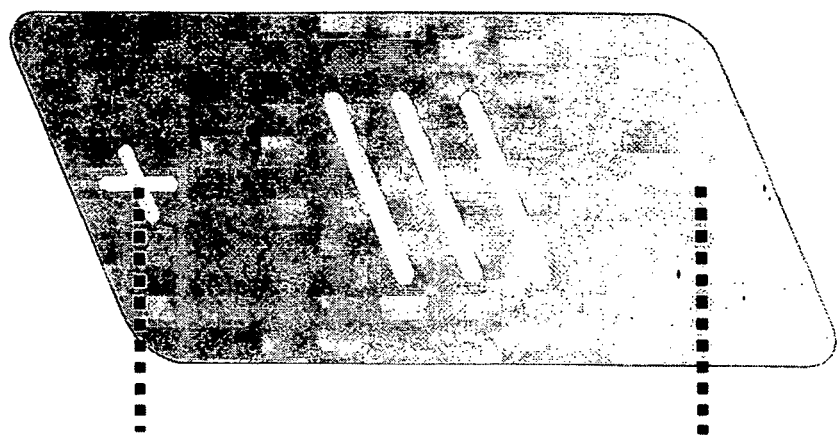
FIGS. 10A-C. For these figures, scale bar is 100 nm.
Figure 10B:
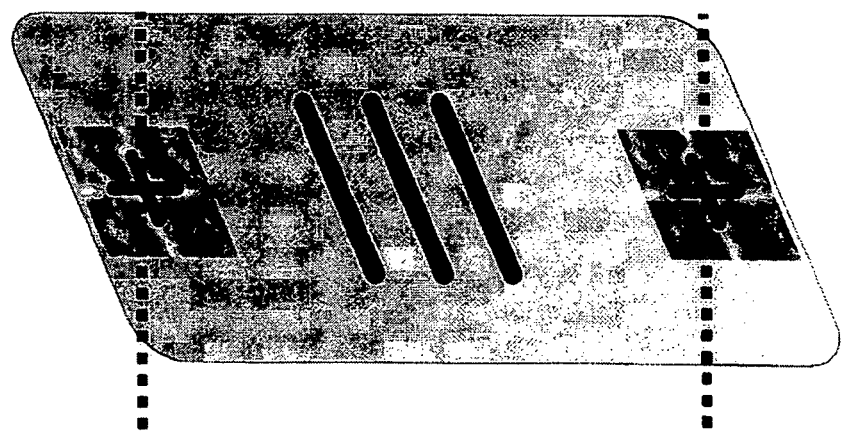
Figure 10C:
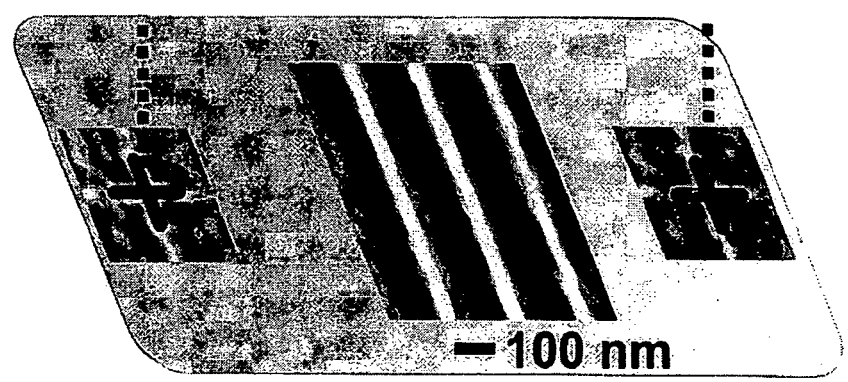

This method for patterning with multiple patterning compounds required an additional modification of the experiment described above. Since the MHA SAM dot patterns were imaged with an tip coated with a patterning compound, it is likely that a small amount of undetectable patterning compound was deposited while imaging. This could significantly affect some applications of DPN, especially those dealing with electronic measurements on molecule-based structures. To overcome this problem, micron-scale alignment marks drawn with an MHA-coated tip (cross-hairs on FIG. 10A) were used to precisely place nanostructures in a pristine area on the Au substrate. In a typical experiment, an initial pattern of 50 nm parallel lines comprised of MHA and separated by 190 nm was prepared (see FIG. 10A). This pattern was 2 µm away from the exterior alignment marks. Note that an image of these lines was not taken to avoid contamination of the patterned area. The MHA-coated tip was then replaced with an ODT-coated tip. This tip was used to locate the alignment marks, and then precalculated coordinates based upon the position of the alignment marks (FIG. 10B) were used to pattern the substrate with a second set of 50 nm parallel ODT SAM lines (see FIG. 10C). Note that these lines were placed in interdigitated fashion and with near-perfect registry with respect to the first set of MHA SAM lines (see FIG. 10C).

Figure 11A:
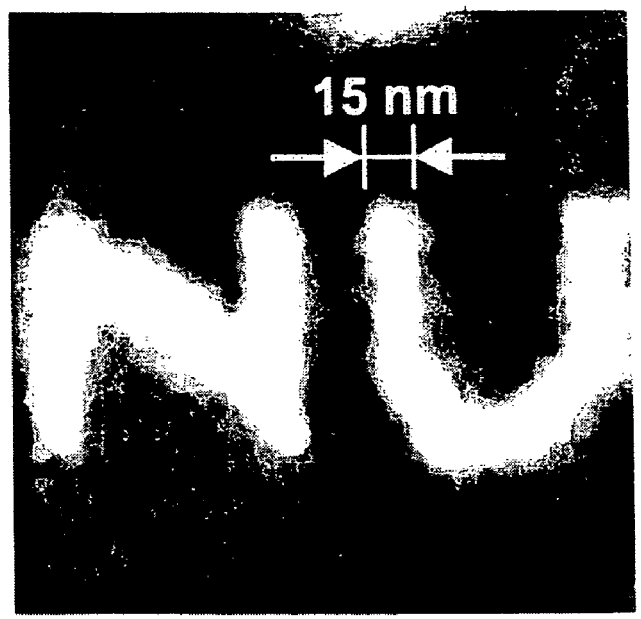
FIG. 11A. Letters drawn by DPN with MHA molecules on amorphous gold surface. Scale bar is 100 nm, and the line width is 15 nm.
Figure 11B:
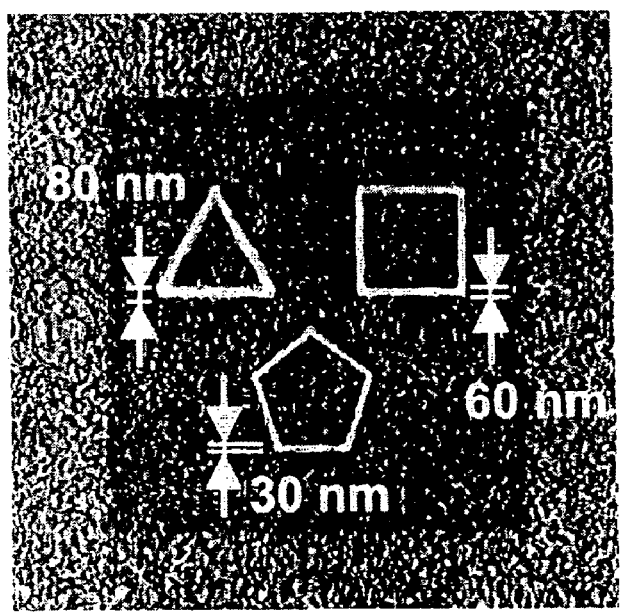
FIG. 11B. Polygons drawn by DPN with MHA molecules on amorphous gold surface. ODT molecules were overwritten around the polygons. Scale bar is 1 µm, and the line width is 100 nm.

There is one unique capability of DPN referred to as "overwriting." Overwriting involves generating one soft structure out of one type of patterning compound and then filling in with a second type of patterning compound by raster scanning across the original nanostructure. As a further proof-of concept experiment aimed at demonstrating the multiple-patterning-compound, high-registry, and overwriting capabilities of DPN over moderately large areas, a MHA-coated tip was used to generate three geometric structures (a triangle, a square, and a pentagon) with 100 nm line widths. The tip was then changed to an ODT-coated tip, and a 10 μm by 8.5 μm area that comprised the original nanostructures was overwritten with the ODT-coated tip by raster scanning 20 times across the substrate (contact force~0.1 nN) (dark areas of FIG. 11). Since water was used as the transport medium in these experiments, and the water solubilities of the patterning compounds used in these experiments are very low, there was essentially no detectable exchange between the molecules used to generate the nanostructure and the ones used to overwrite on the exposed gold (see FIG. 11).

In summary, the high-resolution, multiple-patterning-compound registration capabilities of DPN have been demonstrated. On an atomically flat Au(111) surface, 15 nm patterns were generated with a spatial resolution better than 10 nm. Even on a rough surface such as amorphous gold, the spatial resolution was better than conventional photolithographic and e-beam lithographic methods for patterning soft materials.

Example 5

Use of DPN to Generate Resists

Lithographic techniques such as photolithography (Wallraff and Hinsberg, *Chem. Rev.*, 99:1801(1999)), electron beam lithography (Wallraff and Hinsberg, *Chem. Rev.*, 99:1801 (1999); Xia et al., *Chem. Rev.*, 99:1823 (1999)), and microcontact printing (Xia et al., *Chem. Rev.*, 99:1823 (1999)) can be used with varying degrees of ease, resolution, and cost to generate three-dimensional features on silicon wafers. DPN is complementary to these other nanolithographic techniques and can be used with conventional laboratory instrumentation (an AFM) in routine fashion to generate patterns of, e.g., alkylthiols on polycrystalline gold substrates, under ambient conditions. Moreover, DPN offers 15 nm linewidth and 5 nm spatial resolution with conventional AFM cantilevers (see prior examples; Piner et al., *Science*, 283:661 (1999); Piner et al., *Langmuir*, 15:5457 (1999); Hong et al., *Langmuir*, 15:7897 (1999); Hong et al., *Science*, 286:523 (1999)).

Three-dimensional architectures on and in silicon are vital to the microelectronics industry and, increasingly, are being applied to other uses in microfabrication (Xia and Whitesides, *Angew, Chem. Int. Ed. Engl.*, 37:550 (1998)). For example, the anisotropic etching of silicon commonly yields narrow grooves, cantilevers, and thin membranes (Seidel et al., *J. Electrochem. Soc.*, 137:3612 (1990)), which have been used for sensors of pressure, actuators, micro-optical components, and masks for submicron lithography techniques (Seidel et al., *J. Electrochem. Soc.*, 137:3612 (1990)). For both the microeletronics applications and other microfabricated devices, significant advantages are expected from being able to make smaller feature sizes (Xia and Whitesides, *Angew, Chem. Int. Ed Engl.*, 37:550 (1998)). Additionally, the ability to fabricate smaller scale structures can lead to the discovery or realization of physical and chemical properties fundamentally different from those typically associated with larger structures. Examples include Coulomb blockades, single-electron tunneling, quantum size effects, catalytic response, and surface plasmon effects (Xia and Whitesides, *Angew, Chem. Int. Ed Engl.*, 37:550 (1998)). Therefore, a range of applications is envisioned for the custom-generated solid-state features potentially attainable through DPN and wet chemical etching.

Consequently, the suitability of DPN-generated nanostructures as resists for generating three-dimensional multilayered solid-state structures by standard wet etching techniques was evaluated in a systematic study, the results of which are reported in this example. In this study, DPN was used to deposit alkylthiol monolayer resists on Au/Ti/Si substrates. Subsequent wet chemical etching yielded the targeted three-dimensional structures. Many spatially separated patterns of the monolayer resists can be deposited by DPN on a single AU/Ti/Si chip and, thus, the effects of etching conditions can be examined on multiple features in combinatorial fashion.

Figure 12:
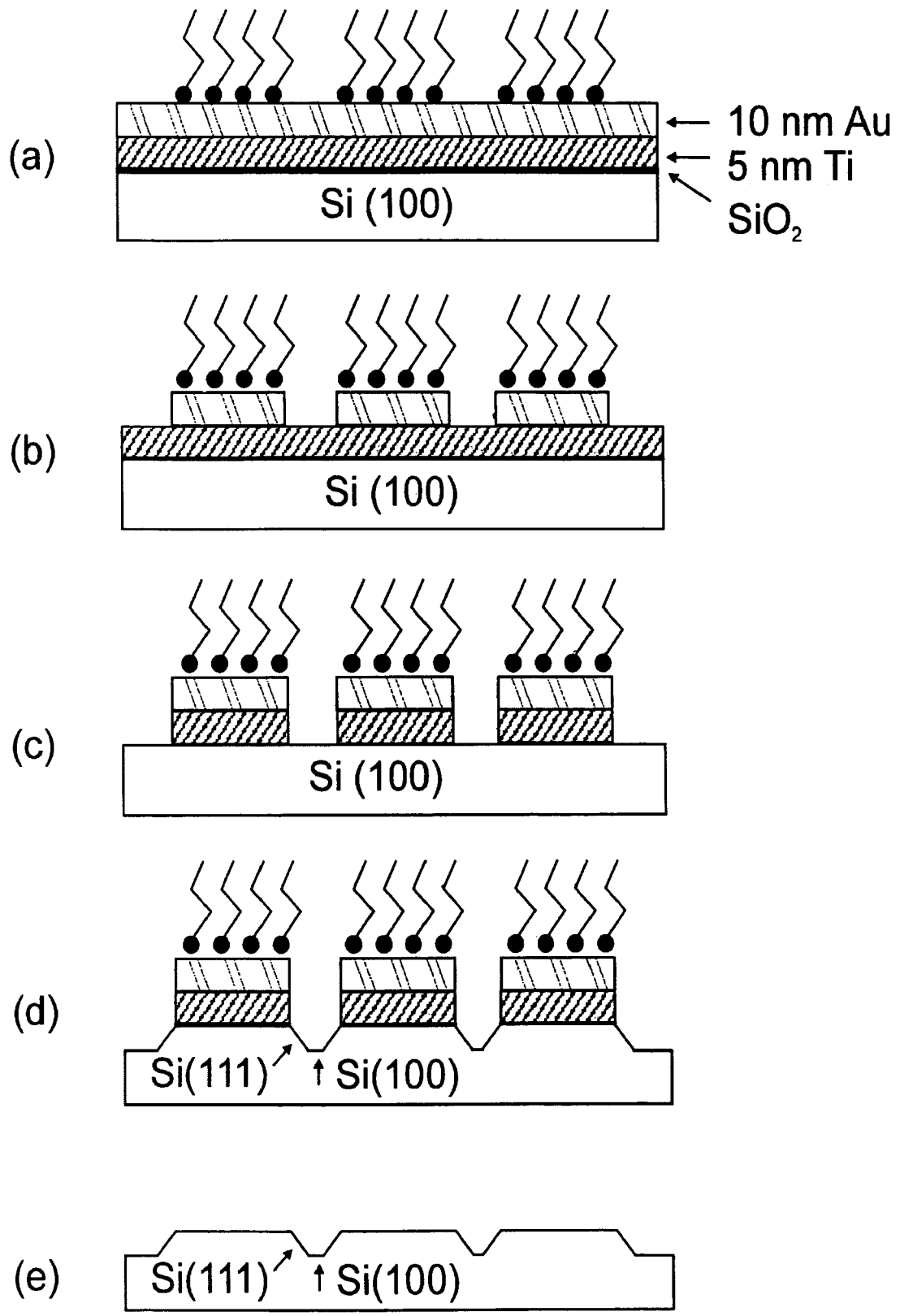
FIG. 12. A schematic representation of a DPN deposition and multi-stage etching procedure used to prepare three-dimensional architectures in Au/Ti/Si substrates. Panel (a): Deposition of ODT onto the Au surface of the multilayer substrate using DPN. Panel (b): Selective Au/Ti etching with ferri/ferrocyanide-based etchant. Panel (c): Selective Ti/SiO$_2$ etching and Si passivation with HF. Panel (d): Selective Si etching with basic etchant and passivation of Si surface with HF. Panel (e): Removal of residual Au and metal oxides with aqua regia and passivation of Si surface with HF.

As diagrammed in FIG. 12, in a typical experiment in this study, DPN was used to deposit alkylthiols onto an Au/Ti/Si substrate. It has been well established that alkyithiols form well-ordered mono layers on Au thin films that protect the underlying Au from dissolution during certain wet chemical etching procedures (Xia et al., *Chem. Mater.*, 7:23 32 (1995); Kumar et al., *J. Am. Chem. Soc.*, 114:9188 (1992)), and this appears to also hold true for DPN-generated resists (see below). Thus, the Au, Ti, and $SiO_2$ which were not protected by the monolayer could be removed by chemical etchants in a staged procedure (FIG. 12, panels b-e). This procedure yielded "first-stage" three-dimensional features: multilayer, Au-topped features on the Si substrate (FIG. 12, panel b). Furthermore, "second-stage" features were prepared by using the remaining Au as an etching resist to allow for selective etching of the exposed Si substrate (FIG. 12, panels c and d). Finally, the residual Au was removed to yield final-stage all-Si features, FIG. 12, panel e. Thus, DPN can be combined with wet chemical etching to yield three-dimensional features on Si(100) wafers with at least one dimension on the sub-100 nm length scale.

Specifically, FIG. 12 diagrams the procedure used to prepare nanoscale features on Si wafers. First, polished single-crystalline Si(100) wafers were coated with 5 nm of Ti, followed by 10 nm of Au by thermal evaporation. The Si(100) wafers (4" diameter (1-0-0) wafers; 3-4.9 ohm/cm resistivity; 500-550 μm thickness) were purchased from Silicon Quest International, Inc. (Santa Clara, Calif.). Thermal evaporation of 5 nm of Ti (99.99%; Alfa Aesar; Ward Hill, Mass.) followed by 10 nm of Au (99.99%; D.F. Goldsmith; Evanston, Ill.) was accomplished using an Edwards Auto 306 Turbo Evaporator equipped with a turbopump (Model EXT510) and an Edwards FTM6 quartz crystal microbalance to determine film thickness. Au and Ti depositions were conducted at room temperature at a rate of 1 nm/second and a base pressure of $<9 \times 10^{-7}$ mb.

After Au evaporation, the following procedure was performed on the substrates: a) DPN was used to deposit patterns of ODT, b) Au and Ti were etched from the regions not protected by the ODT monolayers using a previously reported ferri/ferrocyanide based etchant (Xia et al., *Chem. Mater.*, 7:2332 (1995)), c) residual Ti and $SiO_2$ were removed by immersing the sample into a 1% HF solution (note: this procedure also passivates the exposed Si surfaces with respect to native oxide growth) (Ohmi, *J. Electrochem. Soc.*, 143:2957 (1996)), and d) the remaining Si was etched anisotropically by minor modifications of a previously reported basic etchant (Seidel et al., *J. Electrochem. Soc.*, 137:3612 (1990)). The topography of the resulting wafers was evaluated by AFM and SEM.

All DPN and all AFM imaging experiments were carried out with a Thermomicroscopes CP AFM and conventional cantilevers (Thermomicroscopes sharpened Microlever A, force constant 0.05 N/m, $Si_3N_4$). A contact force of 0.5 nN was typically used for DPN patterning. To minimize piezo tube drift problems, a 100-μm scanner with closed loop scan control was used for all of the experiments. For DPN, the tips were treated with ODT in the following fashion: 1) tips were soaked in 30% $H_2O_2$:$H_2SO_4$ (3:7) (caution: this mixture reacts violently with organic material) for 30 minutes, 2) tips were rinsed with water, 3) tips were heated in an enclosed canister (approximately 15 $cm^3$ internal volume) with 200 mg ODT at 60° C. for 30 minutes, and 4) tips were blown dry with compressed difluoroethane prior to use. Typical ambient imaging conditions were 30% humidity and 23° C., unless reported otherwise. Scanning electron microscopy (SEM) was performed using a Hitachi SEM equipped with EDS detector.

A standard ferri/ferrocyanide etchant was prepared as previously reported (Xia et al., *Chem. Mater.*, 7:2332 (1995)) with minor modification: 0.1 M$Na_1S_2O_3$, 1.0 M KOH, 0.01 M $K_3Fe(CN)_5$, 0.001 M $K_4Fe(CN)_6$ in nanopure water. Au etching was accomplished by immersing the wafer in this solution for 2-5 minutes while stirring. The HF etchant (1% (v:v) solution in nanopure water) was prepared from 49% HF and substrates were agitated in this solution for 10 seconds. Silicon etching was accomplished by immersing the wafer in 4 M KOH in 15% (v:v) isopropanol in nanopure water at 55° C. for 10 seconds while stirring (Seidel et al., *J. Electrochem. Soc.*, 137:3612 (1990)). Final passivation of the Si substrate with respect to SiO, growth was achieved by immersing the samples in 1% HF for 10 seconds with mild agitation. Substrates were rinsed with nanopure water after each etching procedure. To remove residual Au, the substrates were cleaned in $O_2$ plasma for 3 minutes and soaked in aqua regia (3:1 HCl:$HNO_3$) for 1 minute, followed by immersing the samples in 1% HF for 10 seconds with mild agitation.

Figure 13:
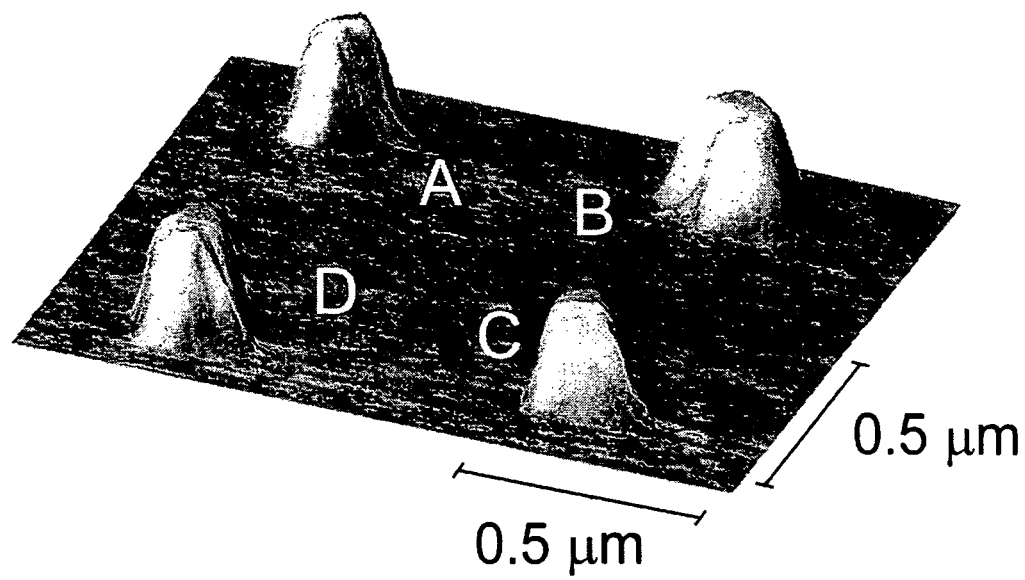
FIG. 13A-C. Nanometer scale pillars prepared according to FIG. 12, Panels a-d.
Figure 13:
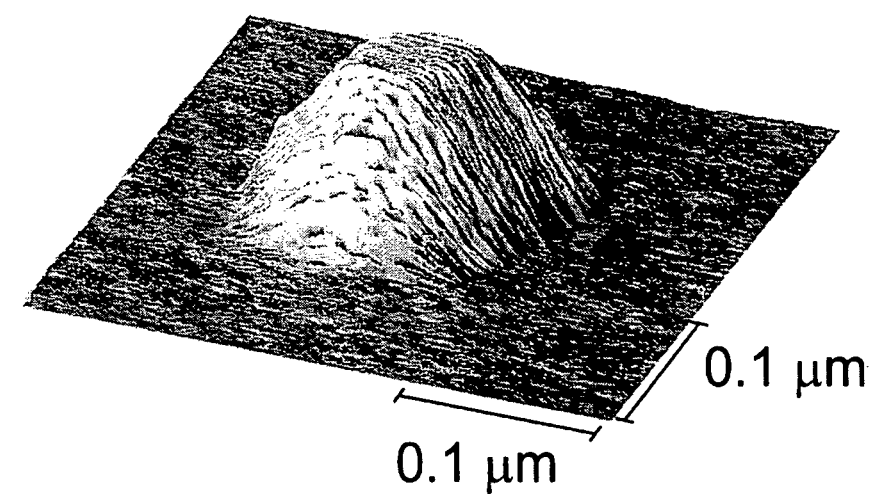
Figure 13:
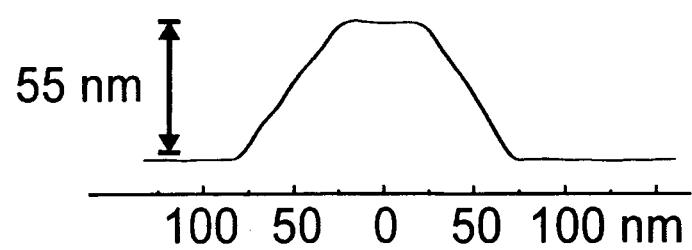

FIG. 13A shows the AFM topography images of an AU/Ti/Si chip patterned according to the procedure outlined in FIG. 12, panels a-d. This image shows four pillars with a height of 55 nm formed by etching an AU/Ti/Si chip patterned with four equal-sized dots of ODT with center-to-center distances of 0.8 μm. Each ODT dot was deposited by holding the AFM tip in contact with the Au surface for 2 seconds. Although the sizes of the ODT dots were not measured prior to etching, their estimated diameters were approximately 100 nm. This estimate is based upon the measured sizes of ODT "test" patterns deposited with the same tip on the same surface immediately prior to deposition of the ODT dots corresponding to the shown pillars. The average diameter of the shown pillar tops was 90 nm with average base diameter of 240 nm. FIG. 13B shows a pillar(55 nm height, 45 nm top diameter, and 155 nm base diameter) from a similarly patterned and etched region on the same Au/Ti/Si substrate. The cross-sectional topography trace across the pillar diameter showed a flat top and symmetric sidewalls, FIG. 13C. The shape of the structure may be convoluted by the shape of the AFM tip (approximately 10 nm radius of curvature), resulting in side widths as measured by AFM which may be larger than the actual widths.

Figure 14:
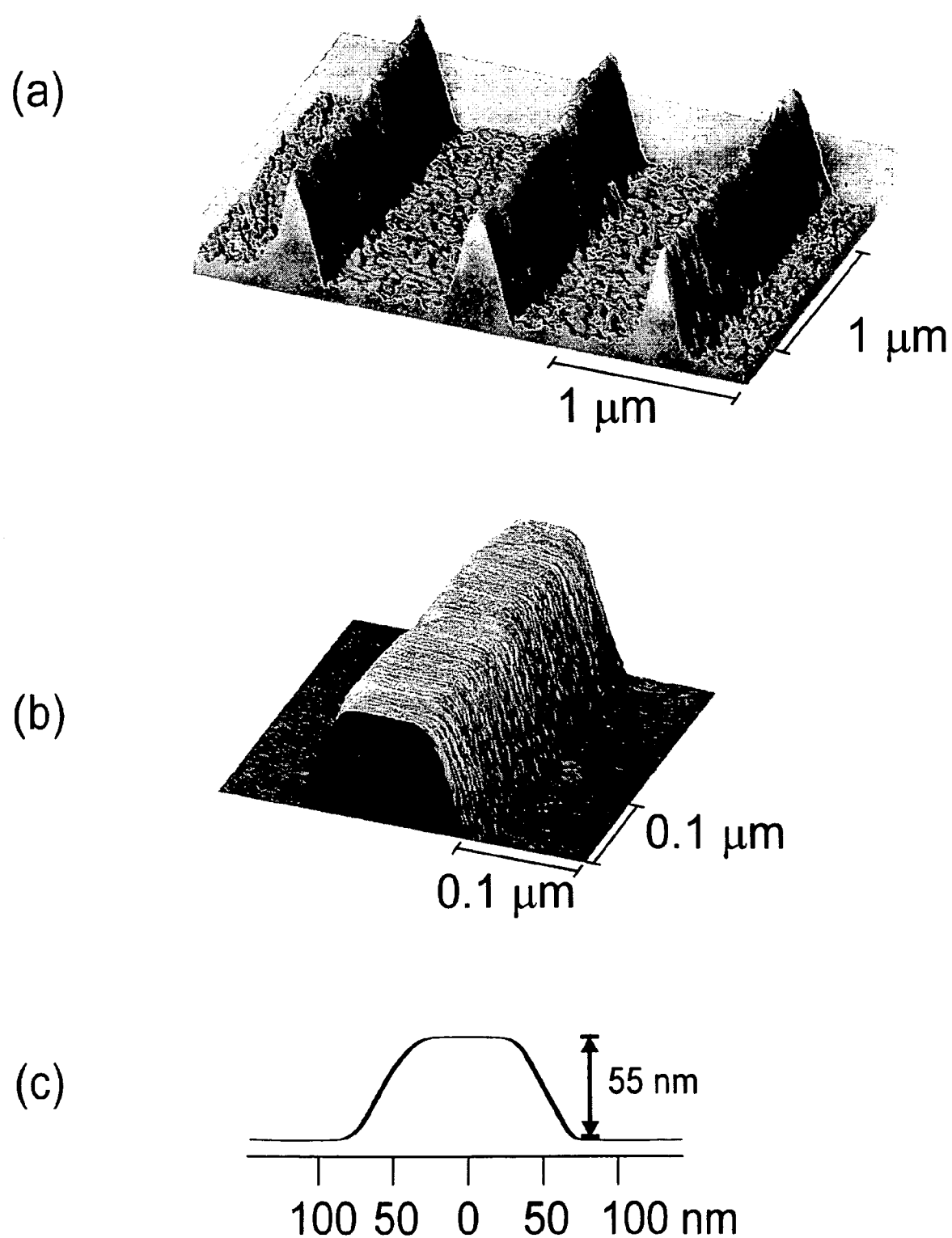
FIGS. 14A-C. Nanometer scale lines prepared according to FIG. 12, Panels a-d.

Additionally, an AU/Ti/Si substrate was patterned with three ODT lines drawn by DPN (0.4 μm/second, estimated width of each ODT line is 100 nm) with 1 μm center-to-center distances. FIG. 14A shows the AFM topography image after etching this substrate according to FIG. 12, panels a-d. The top and base widths are 65 nm and 415 nm, respectively, and line heights are 55 nm. FIG. 14B shows a line from a similarly patterned and etched region on the same Au/Ti/Si wafer, with a 50 nm top width, 155 nm base width, and 55 nm height. The cross-sectional topography trace across the line diameter shows a flat top and symmetric sidewalls (FIG. 14C).

Figure 15:
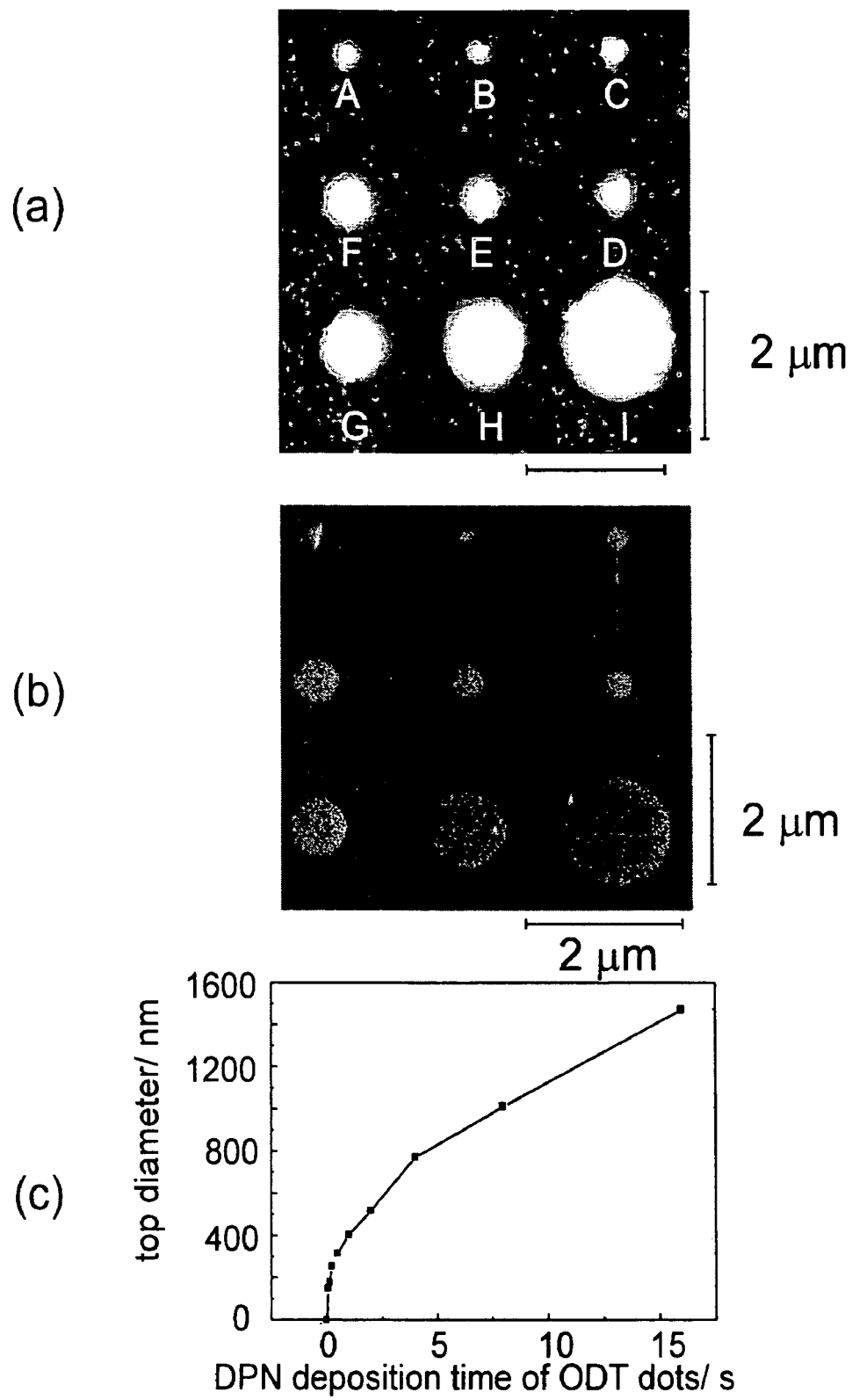
FIGS. 15A-C. Pillars prepared according to FIG. 12, Panels a-d.
Figure 16:
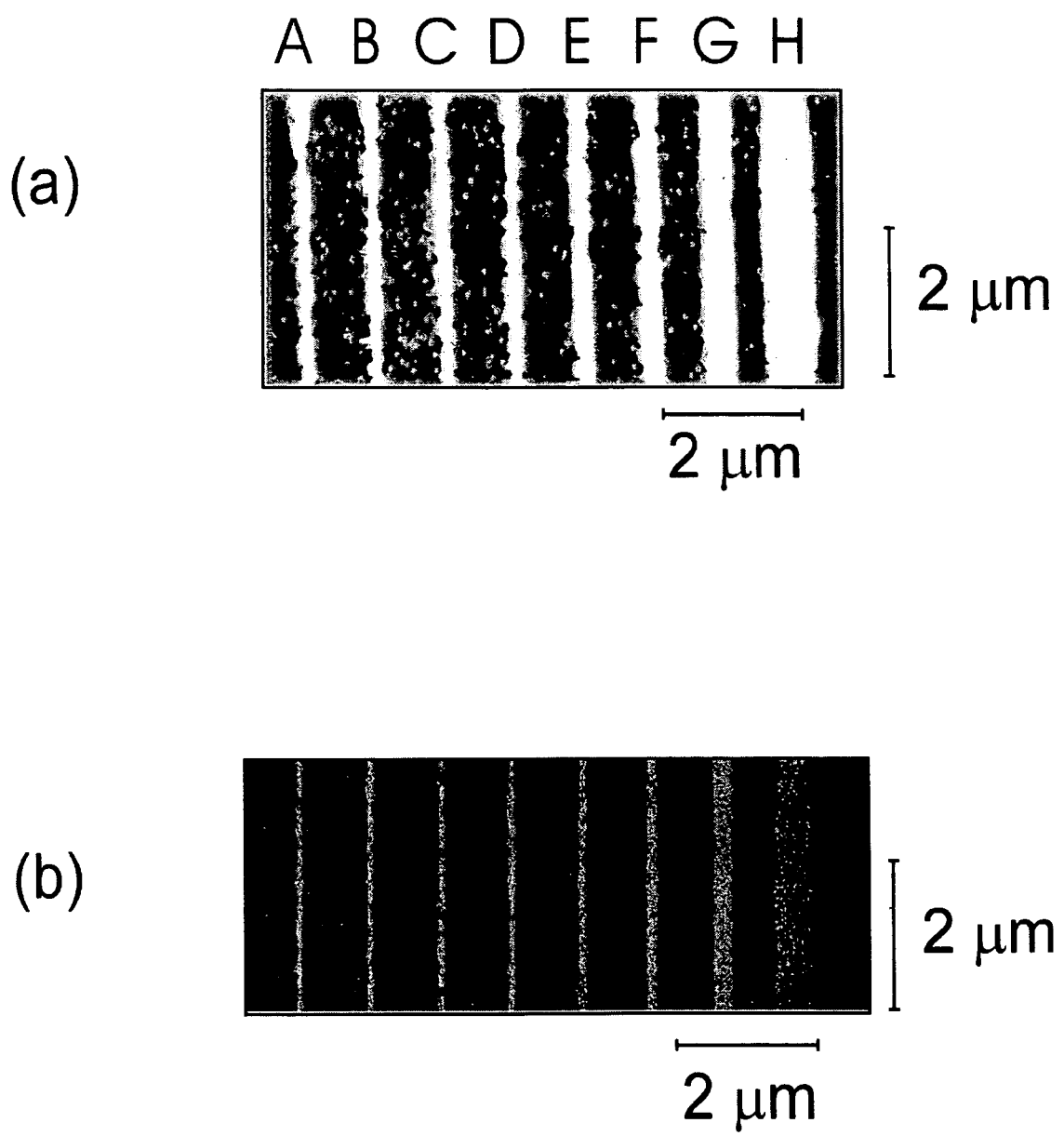
FIGS. 16A-B. Lines prepared according to FIG. 12, Panels a-d.

FIGS. 15 and 16 show the feature-size variation possible with this technique. In FIG. 15A, the ODT-coated AFM tip was held in contact with the surface for varying lengths of time (16-0.062 seconds) to generate various sized dots with 2 μm center-to-center distances which subsequently yielded etched three-dimensional structures with top diameters ranging from 1.47 μm to 147 nm and heights of 80 nm. The top diameters as measured by SEM differed by less than 15% from the diameters measured from the AFM images, compare FIGS. 15A and 15B. Additionally, energy dispersive spectroscopy (EDS) showed the presence of Au on the pillar tops whereas Au was not observed in the areas surrounding the elevated micro- and nanostructures. As expected, the diameters of the micro- and nano-trilayer structures correlated with the size of the DPN-generated resist features, which was directly related to tip-substrate contact time, FIG. 15C. Line structures were also fabricated in combinatorial fashion, FIG. 16. ODT lines were drawn at a scan rate varying from 0.2-2.8 μm/second with 1 μm center-to-center distances. After etching, these resists afforded trilayer structures, all with a height of 80 nm and top line widths ranging from 505 to 50 nm, FIG. 16. The field emission scanning electron micrograph of the patterned area looks comparable to the AFM image of the same area with the top widths as determined by the two techniques being within 15% of one another, compare FIGS. 16A and 16B.

In conclusion, it has been demonstrated that DPN can be used to deposit monolayer-based resists with micron to sub-100 nm dimensions on the surfaces of Au/Ti/Si trilayer substrates. These resists can be used with wet chemical etchants to remove the unprotected substrate layers, resulting in three-dimensional solid-state feature with comparable dimensions. It is important to note that this example does not address the ultimate resolution of solid-state nano structure fabrication by means of DPN. Indeed, it is believed that the feature size will decrease through the use of new "inks" and sharper "pens." Finally, this work demonstrates the potential of using DPN to replace the complicated and more expensive hard lithography techniques (e.g. e-beam lithography) for a variety of solid-state nanolithography applications.

Example 6

Multi-Pen Nanoplotter for Serial and Parallel DPN

The largest limitation in using scanning probe methodologies for doing ultra-high-resolution nanolithography over large areas derives from the serial nature of most of these techniques. For this reason, scanning probe lithography (SPL) methods have been primarily used as customization tools for preparing and studying academic curiosities (Snow et al., *Appl. Phys. Lett.*, 75:1476 (1999); Luthi et al., *Appl. Phys. Lett.*, 75:1314 (1999); Bottomley, *Anal. Chem.*, 70:425R (1998); Schoer and Crooks, *Langmuir*, 13:2323 (1997); Xu and Liu, *Langmuir*, 13:127 (1997); Nyffenegger and Penner, *Chem. Rev.*, 97:1195 (1997); Sugimur and Nakagiri, *J. Vac. Sci. Technol. A*, 14:1223 (1996); Muller et al., *J. Vac. Sci. Technol. B*, 13:2846 (1995); Jaschke and Butt, *Langmuir*, 11:1061 (1995); Kim and Lieber, *Science*, 257:375 (1992)). If SPL methodologies are ever to compete with optical or even stamping lithographic methods for patterning large areas (Xia et al., *Chem. Rev.*, 99:1823 (1999); Jackman et al., *Science*, 269:664(1995); Chou et al., *Appl. Phys. Lett.*, 67:3114(1995)), they must be converted from serial to parallel processes. Several important steps have been taken in this direction. For example, researchers have developed a variety of different scanning multiple probe instruments (Lutwyche et al., *Sens. Actuators A,* 73:89 (1999); Vettiger et al, *Microelectron Eng.,* 46:11 (1999); Mime et al., *Appl. Phys. Lett.,* 73:1742 (1998); Tsukamoto et al., *Rev. Sd. Instrum.,* 62:1767 (1991)), and some have begun to use these instruments for parallel SPL. In particular, Quate and coworkers have shown that as many as 50 tips could be used at once (Minne et al., *Appl. Phys. Lett.,* 73:1742 (1998)), and with such a strategy, both imaging and patterning speeds could be dramatically improved. However, a major limitation of all parallel SPL methods thus far developed is that each tip within the array needs a separate feedback system, which dramatically increases the instrumentation complexity and cost. One of the reasons separate feedback systems are required in such a process is that tip-substrate contact force influences the line width and quality of the patterned structure. Although parallel scanning tunneling microscope (STM) lithography has not yet been demonstrated, such a process would presumably require a feedback system for each tip that allows one to maintain constant tunneling currents. Like most other SPL methods, DPN thus far has been used exclusively in a serial format. Herein, a method for doing parallel or single pen soft nanolithography using an array of cantilevers and a conventional AFM with a single feed back system is reported.

Figure 19:
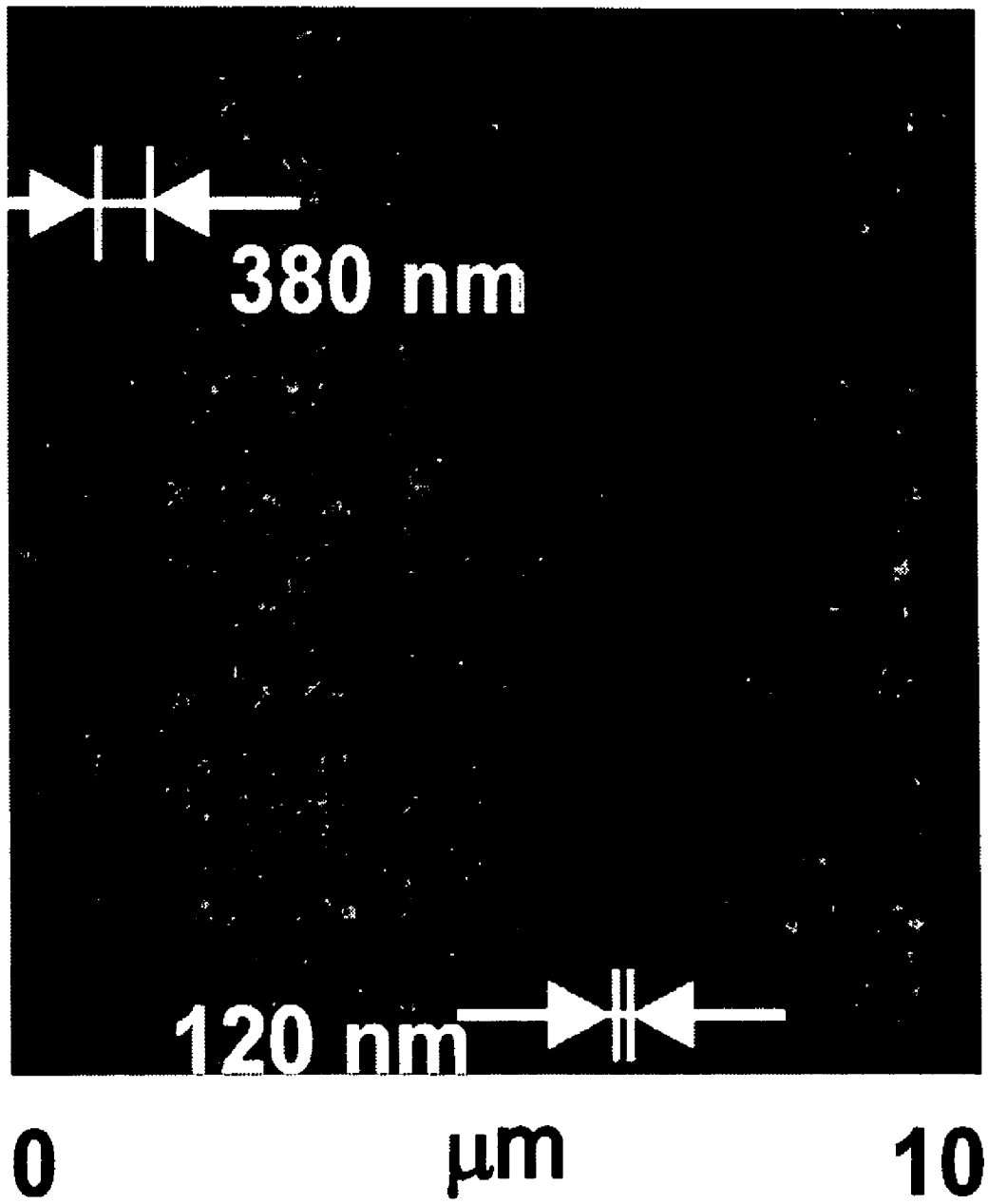
FIG. 19: ODT nanodot and line features on Au generated by the same tip but under different tip-substrate contact forces. There is less than 10% variation in feature size.

There is a key scientific observation that allows one to transform DPN from a serial to parallel process without substantially complicating the instrumentation required to do DPN. It has been discovered that features (e.g. dots and lines) generated from inks such as 1-octadecanethiol (ODT), under different contact forces that span a two-order of magnitude range, are virtually identical with respect to diameter and line-width, respectively. Surprisingly, even patterning experiments conducted with a small negative contact force, where the AFM tip bends down to the surface, exhibit ink transport rates that are comparable to experiments executed with the tip-substrate contact force as large as 4 nN (FIG. 19). These experiments clearly showed that, in DPN writing, the ink molecules migrate from the tip through the meniscus to the substrate by diffusion, and the tip is simply directing molecular flow.

The development of an eight pen nanoplotter capable of doing parallel DPN is described in this example. Significantly, since DPN line width and writing speed are independent of contact force, this has been accomplished in a configuration that uses a single tip feedback system to monitor a tip with dual imaging and writing capabilities (designated the "imaging tip"). In parallel writing mode, all other tips reproduce what occurs at the imaging tip in passive fashion. Experiments that demonstrate eight-pen parallel writing, ink and rinsing wells, and "molecular corralling" by means of a nanoplotter-generated structure are reported.

All experiments were performed on a Thermomicroscopes MS AFM equipped with a closed loop scanner that minimizes thermal drift. Custom DPN software (described above) was used to drive the instrument. The instrument has a 200 mm×200 mm sample holder and an automated translation stage.

The intention in transforming DPN into a parallel process was to create an SPL method that allows one to generate multiple single-ink patterns in parallel or a single multiple-ink pattern in series. This tool would be the nanotechnologist's equivalent of a multiple-pen nanoplotter with parallel writing capabilities. To accomplish this goal, several modifications of the AFM and DPN process were required (see FIGS. 17 and 18).

First, a tilt stage (purchased from Newport Corporation) was mounted on the translation stage of the AFM. The substrate to be patterned was placed in the sample holder, which was mounted on the tilt stage. This arrangement allows one to control the orientation of the substrate with respect to the ink coated tips which, in turn, allows one to selectively engage single or multiple tips during a patterning experiment (FIG. 17).

Second, ink wells, which allow one to individually address and ink the pens in the nanoplotter, were fabricated. Specifically, it has been found that rectangular pieces of filter paper soaked with different inks or solvents can be used as ink wells and rinsing wells, respectively (FIG. 17). The filter-paper ink and rinsing wells were located on the translation stage proximate the substrate. An AFM tip can be coated with a molecular ink of interest or rinsed with a solvent simply by making contact with the appropriate filter-paper ink or rinsing well for 30 seconds (contact force=1 nN).

Finally, a multiple tip array was fabricated simply by physically separating an array of cantilevers from a commercially available wafer block containing 250 individual cantilevers (Thermomicroscopes Sharpened Microlevers C, force constant=0.01 N/m), and then, using that array as a single cantilever (FIG. 18). The array was affixed to a ceramic tip carrier that comes with the commercially acquired mounted cantilevers and was mounted onto the AFM tip holder with epoxy glue (FIG. 18).

For the sake of simplicity, experiments involving only two cantilevers in the array will be described first. In parallel writing, one tip, designated "the imaging tip," is used for both imaging and writing, while the second tip is used simply for writing. The imaging tip is used the way a normal AFM tip is used and is interfaced with force sensors providing feedback; the writing tips do not need feedback systems. In a patterning experiment, the imaging tip is used to determine overall surface topology, locate alignment marks generated by DPN, and lithographically pattern molecules in an area with coordinates defined with respect to the alignment marks (Example 4 and Hong et al., *Science,* 286:523 (1999)). With this strategy, the writing tip(s) reproduce the structure generated with the imaging tip at a distance determined by the spacing of the tips in the cantilever array (600 μm in the case of a two pen experiment).

In a typical parallel, multiple-pen experiment involving a cantilever array, each tip was coated with an ink by dipping it into the appropriate ink well. This was accomplished by moving the translation stage to position the desired ink well below the tip to be coated and lowering the tip until it touched the filter paper. Contact was maintained for 30 seconds, contact force=1 nN. To begin parallel patterning, the tilt stage was adjusted so that the writing tip was 0.4 μm closer to the sample than the imaging tip. The tip-to-sample distances in an array experiment can be monitored with the Z-stepper motor counter. The laser was placed on the imaging tip so that during patterning both tips were in contact with the surface (FIG. 17).

Figure 20:
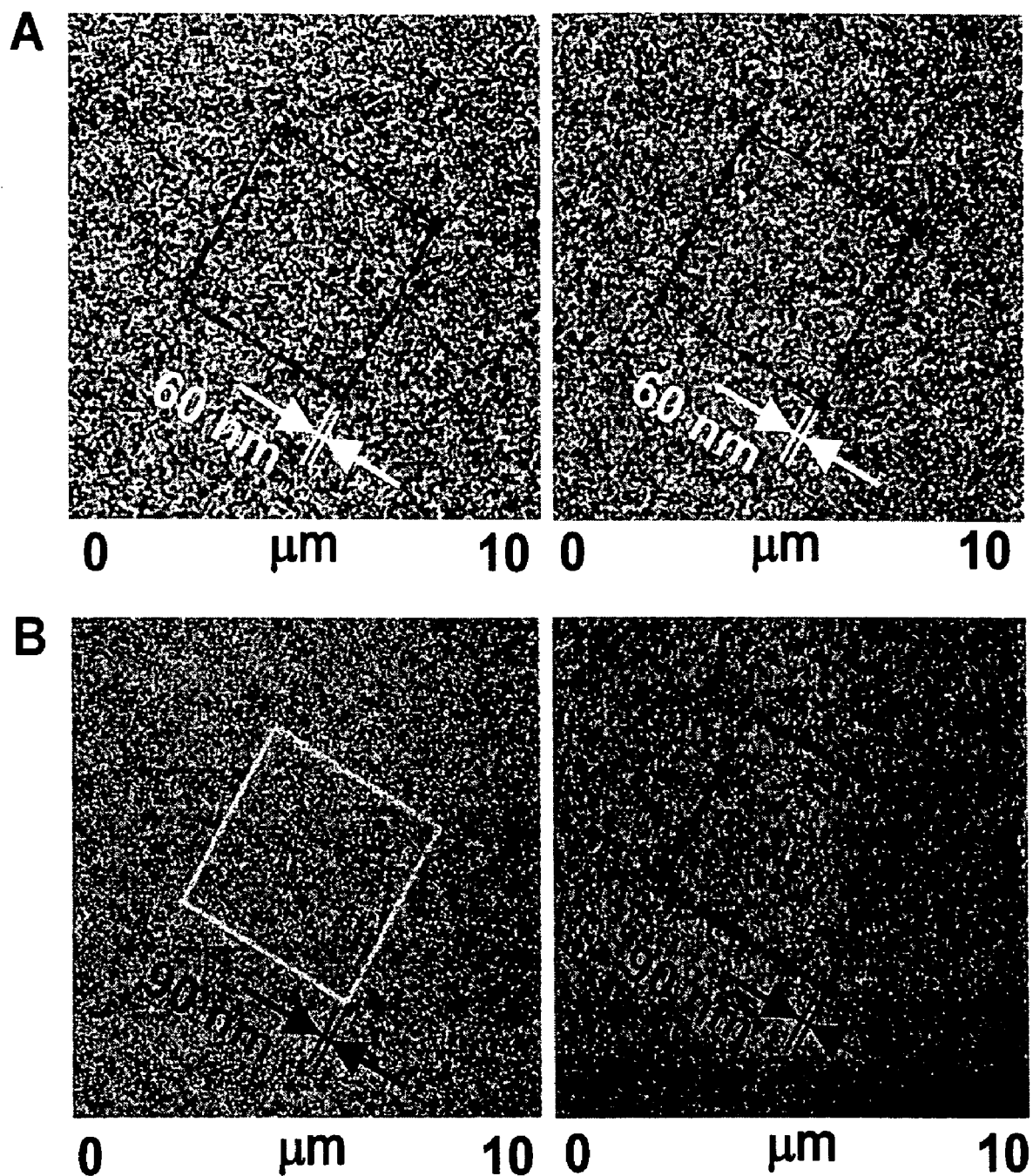
FIGS. 20A-B: Parallel DPN writing using two tips and a single feedback system.

The first demonstration of parallel writing involved two tips coated with the same ink, ODT (FIG. 20A). In this experiment, two one-molecule-thick nanostructures comprised of ODT were patterned onto a gold surface by moving the imaging tip along the surface in the form of a square (contact force~0.1 nN; relative humidity 30%; writing speed=0.6 μm/sec). Note that the line-widths are nearly identical and the nanostructure registration (orientation of the first square with respect to the second) is near-perfect.

Parallel patterning can be accomplished with more than one ink. In this case the imaging tip was placed in a rinsing well to remove the ODT ink and then coated with 16-mercaptohexadecanoic acid (MBA) by immersing it in an MBA ink well. The parallel multiple-ink experiment was then carried out in a manner analogous to the parallel single ink experiment under virtually identical conditions. The two resulting nanostructures can be differentiated based upon lateral force but, again, are perfectly aligned due to the rigid, fixed nature of the two tips (FIG. 20B). Interestingly, the line-widths of the two patterns were identical. This likely is a coincidental result since feature size and line width in a DPN experiment often depend on the transport properties of the specific inks and ink loading.

Figure 21:
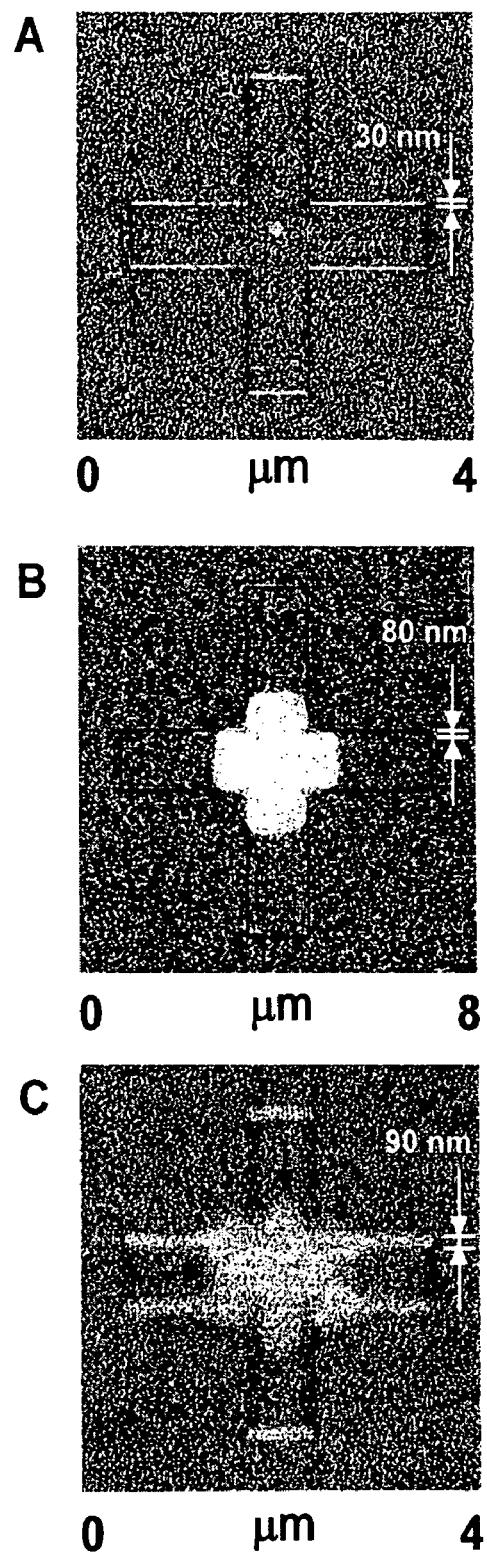
FIGS. 21A-C: Nanoplotter-generated patterns which consist of features comprised of two different inks, ODT and MHA. The patterns were generated without removing the multiple-pen cantilever from the instrument.

A remarkable feature of this type of nanoplotter is that, in addition to offering parallel writing capabilities, one can operate the system in serial fashion to generate customized nanostructures made of different inks. To demonstrate this capability, a cantilever array that had a tip coated with ODT and a tip coated with MHA was utilized. The laser was focused on the ODT coated tip, and the tilt stage was adjusted so that only this tip was in contact with the surface (FIG. 17). The ODT coated tip was then used to generate the vertical sides of a cross on a Au surface (contact force~0.1 nN; relative humidity~30%; writing speed=1.3 μm/second) (FIG. 21A). The laser was then moved to the MBA coated tip, and the tilt stage was readjusted so that only this tip was in contact with surface. The MHA tip was then used to draw the 30 nm wide horizontal sides of the nanostructure ("nano" refers to line width) (FIG. 21A). Microscopic ODT alignment marks deposited on the periphery of the area to be patterned were used to locate the initial nanostructure as described above (see also Example 4 and Hong et al., *Science,* 286:523 (1999)).

This type of multiple ink nanostructure with a bare gold interior would be impossible to prepare by stamping methodologies or conventional nanolithography methods, but was prepared in five minutes with the multiple-pen nanoplotter. Moreover, this tool and these types of structures can now be used to begin evaluating important-issues involving molecular diffusion on the nanometer length scale and across nanometer wide molecule-based barriers. As a proof-of-concept, the diffusion of MHA from a tip to the surface within this type of "molecule-based corral" was examined. As a first step, a cross shape was generated with a single ink, ODT (contact force~0.1 nN; relative humidity~30%; writing speed=0.5 μm/second). Then, an MHA coated tip was held in contact with the surface for ten minutes at the center of the cross so that MHA molecules were transported onto the surface and could diffuse out from the point of contact. Importantly, even 80 nm wide ODT lines acted as a diffusion barrier, and MBA molecules were trapped inside the ODT cross pattern (FIG. 21B). When the horizontal sides of the molecular corral are comprised of MHA barriers, the MHA molecules diffuse from tip onto the surface and over the hydrophilic MHA barriers. Interestingly, in this two component nanostructure, the MBA does not go over the MHA barriers, resulting in an anisotropic pattern (FIG. 21C). Although it is not known yet if the corral is changing the shape of the meniscus, which in turn controls ink diffusion, or alternatively, the ink is deposited and then migrates from the point of contact to generate this structure, this type of proof-of-concept experiment shows how one can begin to discover and study important interfacial processes using this new nanotechnology tool.

Figure 22:
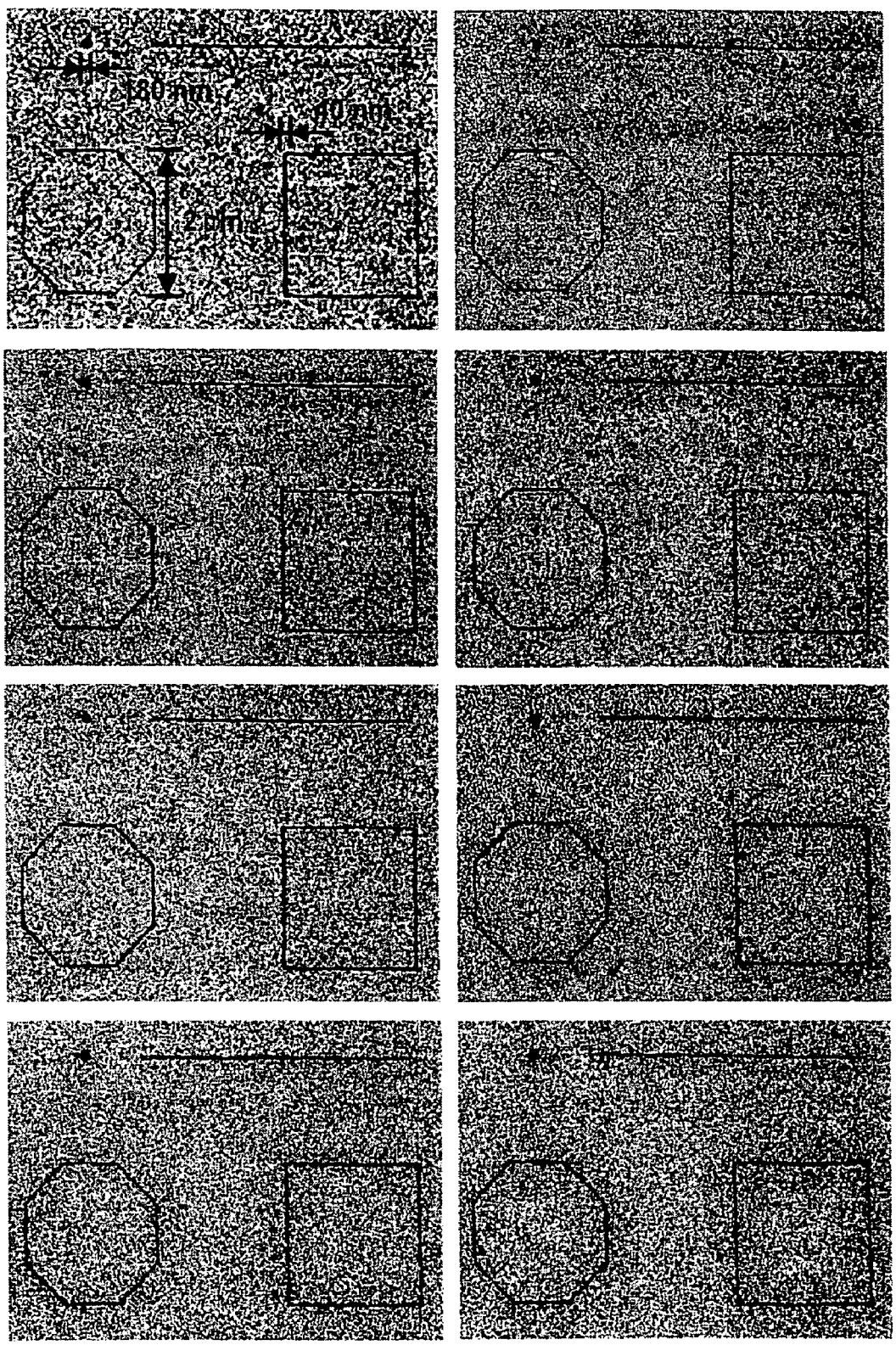
FIG. 22: Eight identical patterns generated with one imaging tip (which uses a feedback system) and seven writing tips (passive; do not use feedback systems separate from that of the imaging tip), all coated with ODT molecules.

The parallel nanoplotting strategy reported herein is not limited to two tips. Indeed, it has been shown that a cantilever array consisting of eight tips can be used to generate nanostructures in parallel fashion. In this case, each of the eight tips was coated with ODT. The outermost tip was designated as the imaging tip and the feedback laser was focused on it during the writing experiment. To demonstrate this concept, four separate nanostructures, a 180 nm dot (contact force~0.1 nN, relative humidity=26%, contact time=1 second), a 40 nm wide line, a square and an octagon (contact force~0.1 nN, relative humidity=26%, writing speed=0.5 μm/second) were generated and reproduced in parallel fashion with the seven passively following tips (FIG. 22). Note that there is a less than 10% standard deviation in line width for the original nanostructures and the seven copies.

In summary, DPN has been transformed from a serial to a parallel process and, through such work, the concept of a multiple-pen nanoplotter with both serial and parallel writing capabilities has been demonstrated. It is important to note that the number of pens that can be used in a parallel DPN experiment to passively reproduce nanostructures is not limited to eight. Indeed, there is no reason why the number of pens cannot be increased to hundreds or even a thousand pens without the need for additional feedback systems. Finally, this work will allow researchers in the biological, chemical, physics, and engineering communities to begin using DPN and conventional AFM instrumentation to do automated, large scale, moderately fast, high-resolution and alignment patterning of nanostructures for both fundamental science and technological applications.

Example 7

Use of DPN to Prepare Combinatorial Arrays

A general method for organizing micro- and nanoparticles on a substrate could facilitate the, formation and study of photonic band gap materials, make it possible to generate particle arrays for analysis of the relationship between pattern structure and catalytic activity, and enable formation of single protein particle arrays for proteomics research. While several methods have been reported for assembling collections of particles onto patterned surfaces (van Blaaderen et al., *Nature* 385:321-323 (1997); Sastry et al., *Langmuir* 16:3553-3 556 (2000); Tien et al., *Langmuir* 13:5349-5355 (1997); Chen et al., *Langmuir* 16:7825-7834(2000); Vossmeyer et al., *J Appl. Phys.* 84:3664-3670(1998); Qin et al., *Adv. Mater.* 11:1433-1437 (1999)), a major challenge lies in the selective immobilization of single particles into pre-determined positions with respect to adjacent particles.

A strategy for chemically and physically immobilizing a wide variety of particle types and sizes with a high degree of control over particle placement calls for a soft lithography technique capable of high-resolution patterning, but also with the ability to form patterns of one or more molecules with precision alignment registration. DPN is such a tool. This example demonstrates combinatorial arrays produced by DPN, focusing on the problem of particle assembly in the context of colloidal crystallization.

Recently, conventional sedimentation methods for preparing colloidal crystals consisting of close-packed layers of polymer or inorganic particles (Park et al., *Adv. Mater.* 10:1028-1032 (1998), and references cited therein; Jiang et al., *Chem. Mater.* 11:2132-2140 (1999)) have been combined with polymer templates, fabricated by e-beam lithography, to form high quality single-component structures (van Blaaderen et al., *Nature* 385:321-323 (1997)). However, sedimentation or solvent evaporation routes do not offer the element of chemical control over particle placement. Herein, a DPN-based strategy for generating charged chemical templates to study the assembly of single particles into two-dimensional square lattices is described.

Figure 23:
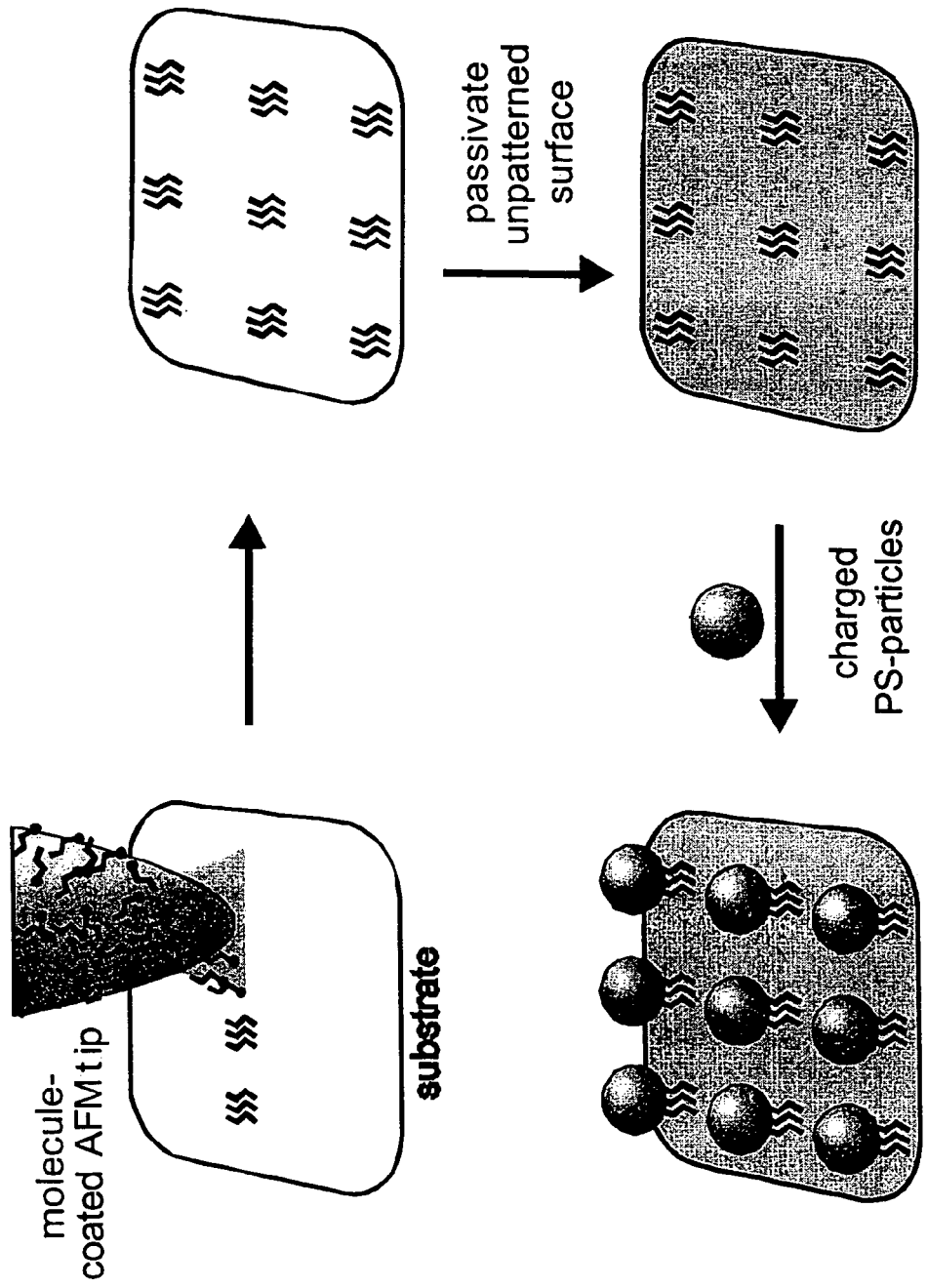
FIG. 23: A schematic representation of the DPN-based particle organization strategy.

The general method (outlined in FIG. 23) is to form a pattern on a substrate composed of an array of dots of an ink which will attract and bind a specific type of particle. For the present studies, MHA was used to make templates on a gold substrate, and positively-charged protonated amine- or amidine-modified polystyrene spheres were used as particle building blocks.

Gold coated substrates were prepared as described in Example 5. For in situ imaging experiments requiring transparent substrates, glass coverslips (Corning No. 1 thickness, VWR, Chicago, Ill.) were cleaned with Ar/O—, plasma for 1 minute, then coated with 2 nm of Ti and 15 nm of Au. The unpatterned regions of the gold substrate were passivated by immersing the substrate in a 1 mM ethanolic solution of another alkanethiol, such as ODT or cystamine. Minimal, if any, exchange took place between the immobilized MHA molecules and the ODT or cystamine in solution during this treatment, as evidenced by lateral force microscopy of the substrate before and after treatment with ODT.

The gold substrates were patterned with MHA to form arrays of dots. DPN patterning was carried out under ambient laboratory conditions (30% humidity, 23° C.) as described in Example 5. It is important to note that the carboxylic acid groups in the MHA patterns were deprotonated providing an electrostatic driving force for particle assembly. (Vezenov et al., *J. Am. Chem. Soc.* 119:2006-201 5 (1997))

Suspensions of charged polystyrene latex particles in water were purchased from either Bangs Laboratories (0.93 µm, Fishers, Ind.) or IDC Latex (1.0 µm and 190 nm, Portland, Oreg.). Particles were rinsed free of surfactant by centrifugation and redispersion twice in distilled deionized water (18.1 MΩ) purified with a Barnstead (Dubuque, Iowa) NANOpure water system. Particle assembly on the substrate was accomplished by placing a 20 µl droplet of dispersed particles (10% wt/vol in deionized water) on the horizontal substrate in a humidity chamber (100% relative humidity). Gentle rinsing with deionized water completed the process.

Optical microscopy was performed using the Park Scientific CP AFM optics (Thermomicroscopes, Sunnyvale, Calif.) or, for in situ imaging, an inverted optical microscope (Axiovert 100A, Carl Zeiss, Jena, Germany) operated in differential interference contrast mode (DIC). Images were captured with a Penguin 600 CL digital camera (Pixera, Los Gatos, Calif.). Intermittent-contact imaging of particles was performed with a Thermomicroscopes MS AFM using silicon ultralevers (Thermomicroscopes, spring constant=3.2 N/m). Lateral force imaging was carried out under ambient laboratory conditions (30% humidity, 23° C.) and as previously reported (Weinberger et al., *Adv. Mater.* 12:1600-1603 (2000)).

Figure 24C:
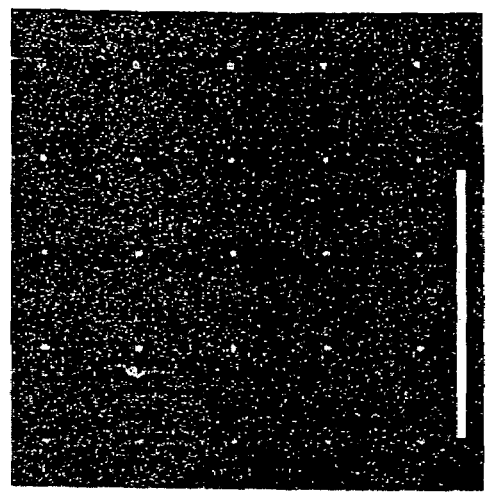
FIGS. 24A-C: Patterns generated on gold thin film by DPN, imaged by lateral force microscopy (MHA=light areas, ODT=dark areas). MHA dots [diameters 540 (FIG. 24A), 750 (FIG. 24B), and 240 nm (FIG. 24C), center-to-center distance 2 μm] deposited by holding the AFM tip at a series of x,y coordinates (5, 10, and 15 seconds). Scale bars represent 6 μm.
Figure 24B:
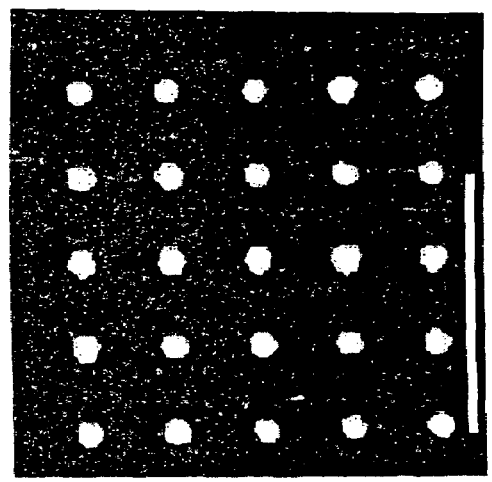
Figure 24A:
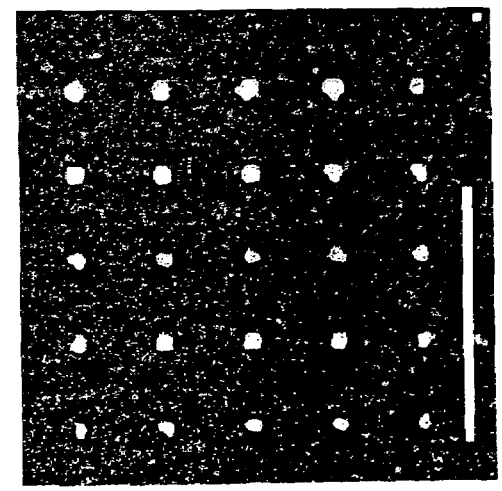
Figure 25:
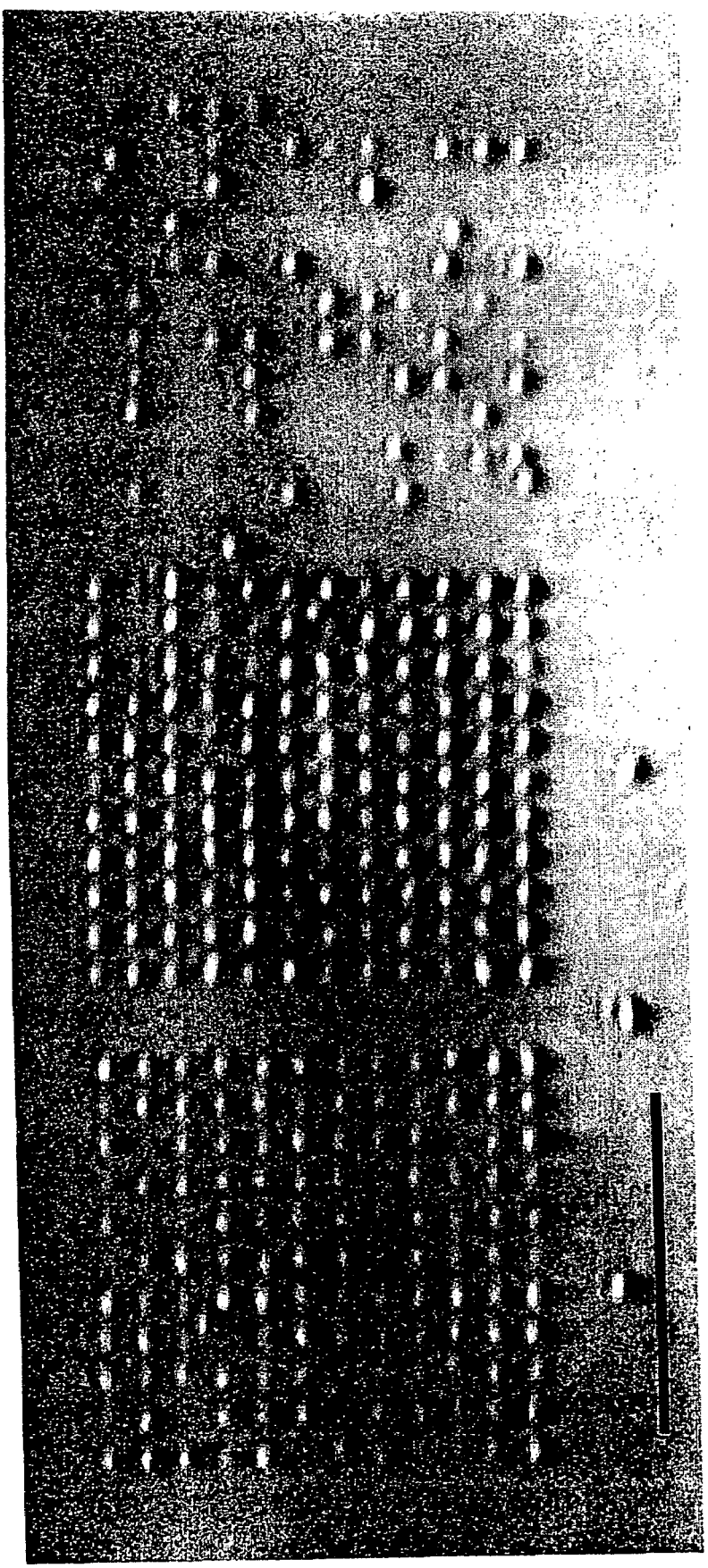
FIG. 25: Optical micrograph of particle arrays on a MHA-patterned substrate. Scale bar represents 20 μm.
Figure 26:
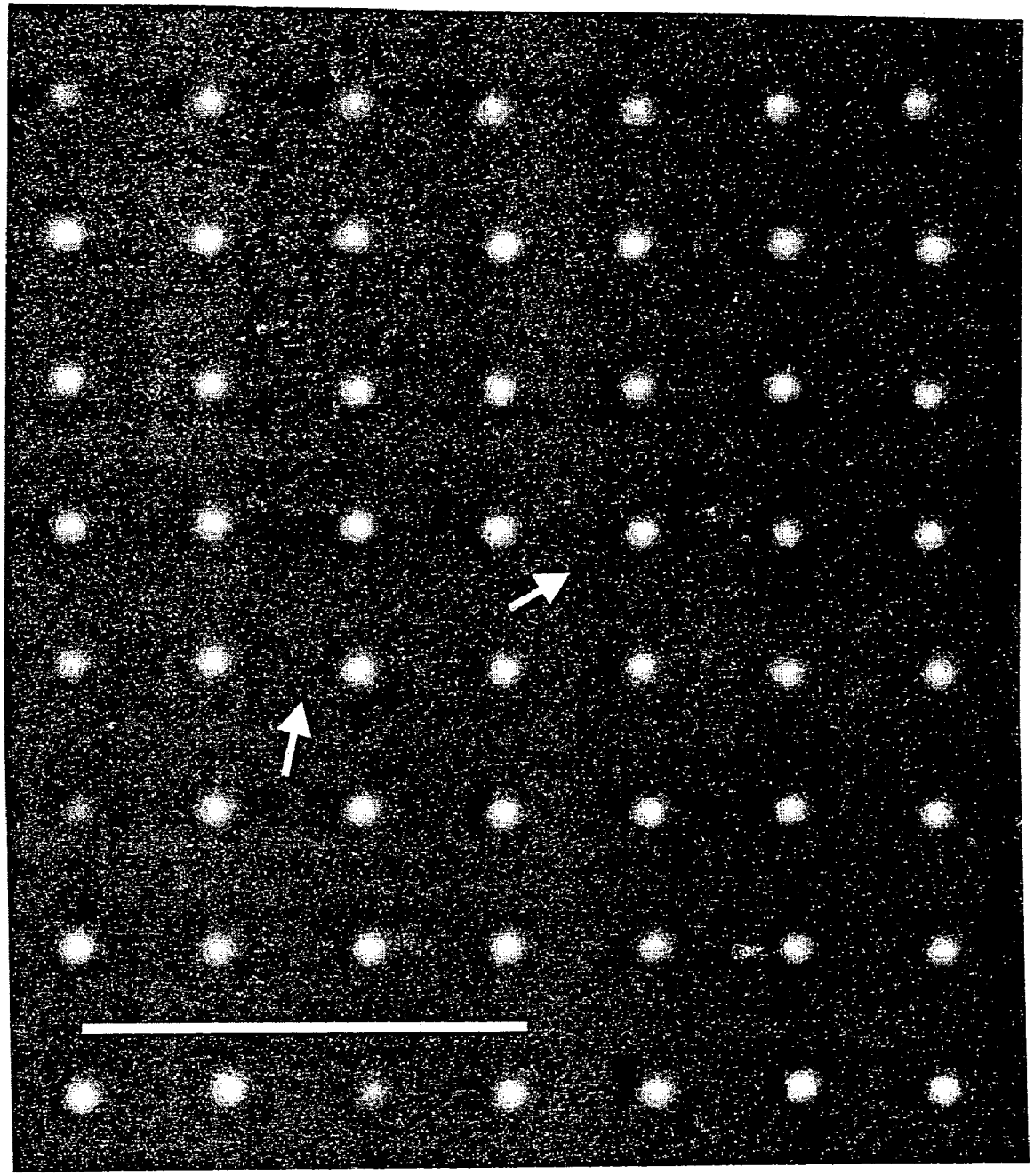
FIG. 26: In situ optical micrograph of 1.0 μm diameter amine-modified polystyrene particles organized into a square array with a lattice constant of 2 μm. Note the dark fuzzy dots, which are particles in solution that have not reacted with the template (white arrows). Scale bar represents 6 μm.

In a typical experiment involving 0.93 µm diameter particles, multiple templates were monitored simultaneously for particle assembly by optical microscopy. In these experiments, the template dot diameter was varied to search for optimal conditions for particle-template recognition, FIG. 24 (left to right). After 1 hour of particle assembly, the substrates were rinsed with deionized water, dried under ambient laboratory conditions, and then imaged by optical microscopy, FIG. 25. The combinatorial experiment revealed that the optimum size of the template pad with which to immobilize a single particle of this type in high registry with the pattern was approximately 500-750 nm. It is important to note that drying of the substrate tended to displace the particles from their preferred positions on the template, an effect that has been noted by others with larger scale experiments (Aizenberg et al., *Phys. Rev. Lett.* 84:2997-3000 (2000)). Indeed, evidence for better, in fact near-perfect, particle organization is obtained by in situ imaging of the surface after 1 µm amine-modified particles have reacted with the template for 1 hour, FIG. 26.

Single particle spatial organization of particles on the micron length-scale has been achieved by physical means, for instance using optical tweezers (Mio et a *Langmuir* 15:8565-8568 (1999)) or by sedimentation onto e-beam lithographically patterned polymer films (van Blaaderen et al., *Nature* 385:321-323 (1997)). However, the DPN-based method described here offers an advantage over previous methods because it provides flexibility of length scale and pattern type, as well as a means to achieve more robust particle array structures. For instance, DPN has been used to construct chemical templates which can be utilized to prepare square arrays of 190 nm diameter amidine-modified polystyrene particles. Screening of the dried particle arrays using non-contact AFM or SEM imaging revealed that 300 nm template dots of MHA, spaced 570 nm apart, with a surrounding repulsive monolayer of cystamine, were suitable for immobilizing single particles at each site in the array, FIG. 27A. However, MHA dots of diameter and spacing of 700 nm and 850 nm resulted in immobilization of multiple particles at some sites, FIG. 27B.

Similar particle assembly experiments conducted at pH<5 or >9 resulted in random, non-selective particle adsorption, presumably due to protonation of the surface acid groups or deprotonation of particle amine or amidine groups. These experiments strongly suggested that the particle assembly process was induced by electrostatic interactions between charged particles and patterned regions of the substrate.

In conclusion, it has been demonstrated that DPN can be used as a tool for generating combinatorial chemical templates with which to position single particles in two-dimensional arrays. The specific example of charged alkanethiols and latex particles described here will provide a general approach for creating two-dimensional templates for positioning subsequent particle layers in predefined crystalline structures that may be composed of single or multiple particle sizes and compositions. In a more general sense, the combinatorial DPN method will allow researchers to efficiently and quickly form patterned substrates with which to study particle-particle and particle-substrate interactions, whether the particles are the dielectric spheres which comprise certain photonic band-gap materials, metal, semiconductor particles with potential catalytic or electronic properties, or even living biological cells and macrobiomolecules.

APPENDIX

The program is written in the Microsoft Visual Basic.

This Form_DPNWrite is a core subroutine of the pattern interpreter. The processes which should be done before the execution of the subroutine are:

1) Users should design patterns utilizing the user-interface subroutine.
2) The patterns designed by the users should be converted into series of dots and lines via well-known subroutines. The dots and lines should be saved in the variables, MyDot(i) and MyLine(i), respectively.
3) The diffusion constant C should be measured or retrieved from the table for the current tip, substrate, substance and environmental conditions, and it should be saved in the variable, Diffusion.

The major functions of this subroutine are:

1) Calculate the holding time and speed for the basic patterns, dots and lines, respectively.
2) Save the corresponding command lines in the script file.
3) Ask the SPM software to run the script file to perform DPN writing. MyDot(i) is an array of DPNDot objects (class). Several important properties of the DPNDot object are X Y, Size, HoldTime. MyDot(i) represents a dot pattern with a radius of MyDot(i).Size at the position of (MyDot(i)X, MyDot(i). Y).

MyLine(i) is an array of DPNLine objects (class). Several important properties of the DPNLine objects are X1, Y1, X2, Y2, DPNWidth, Repeat, Speed. MyLine(i) represents a line pattern connecting between (X1, Y1) and (X2, Y2) with a linewidth of DPNWidth. Repeat is an optional parameter and its default value is 1. By specifying Repeat, users can specify whether the line will be drawn by one or multiple sweeps of the SPM tip.

Program starts here:

```
Public Sub Form DPNWrite( )
'Calculate the holding time for each dot and save it in
MyDot(i).HoldTime.'
For i = 1 To MyDotNum
MyDot(i).HoldTime = Round(3.14159 * MyDot(i).Size * MyDot(i).Size/
Diffusion,
5)
Next i
'Calculate the speed for each line and save it in MyLine(i).Speed.'
For i = 1 To MyLineNum
MyLine(i).Speed = Round(Diffusion * MyLine(i).Repeat / MyLine(i).
DPN-Width,
5)
Next i
'Create the script file which will store all the command lines which can be
recognized by SPM software'
Open "c:\dpnwriting\nanoplot.scr" For Output As #1
'In the following lines, Command 1~10 represent command lines specific
for each commercial system for the drawing system 2030, and
accordingly are dependent upon, e.g, the atomic force microscope system
utilized as the drawing system.'
'Add the command for the SPM system initialization to the script file.'
Print #1, "Command 1: Set up the Drawing System."
Print #1, "Command 2: Separate the tip from the substrate."
'Add the commands for dot patterns to the script file.'
For i = 1 To MyDotNum
    If MyDot(i).HoldTime> 0 Then
        Print #1, "Command 3: Move the tip to the position of the dot."
        Print #1, "Command 4: Approach the tip to make a contact with
the substrate."
        Print #1, "Command 5: Hold the tip for the period of
MyDot(i).Hold Time."
    End If
    Print #1, "Command 6: Separate the tip from the substrate."
Next i
'Add the commands for line patterns to the script file.'
For i = 1 To MyLineNum
    If MyLine(i).Speed >0 Then
        Print #1, "Command 7: Move the tip to the initial position,
(XI, YI)"
        Print #1, "Command 8: Approach the tip to make a contact with
the substrate."
        Print #1, "Command 9: Sweep the tip to (X2, Y2) with
MyLine(:).Speed."
    End If
    Print #1, "Command 10: Separate the tip from the substrate."
```

-continued

```
Next i
Close #1
'Have the drawing system 2030 execute the commands in the script file.'
'The method to have the AFM software drivers 2032 run the script file
depends on the commercial drawing system 2030 used. The following is
one example where Shell Visual Basic function is utilized.'
    DoDPN=Shell(" c:\spmsoftware\spmsoftware.exe-x c:\dpnwriting\-
nanoplot.scr", vbMinimizedFocus)
End Sub
```

We claim:

1. A method of nanolithography comprising:
providing a substrate on which a first patterning compound has been applied;
providing a scanning probe microscope tip;
coating the tip with a second patterning compound; and
using the coated tip to apply the second patterning compound to the first patterning compound on the substrate via a transport medium so as to produce a desired pattern of the second patterning compound,
wherein the second patterning compound reacts or combines with the first patterning compound.

2. The method of claim 1 wherein the first patterning compound has been applied to the substrate by immersing the substrate in a solution of the first patterning compound.

3. A method of nanolithography comprising:
providing a substrate, on which a first patterning compound has been applied;
providing a scanning probe microscope tip;
coating the tip with a second patterning compound; and
contacting the coated tip with the substrate so that the second patterning compound is applied to the substrate via a transport medium so as to produce a desired pattern, wherein the second patterning compound is capable of reacting or combining with the first patterning compound.

4. The method of claim 1, wherein both first and second patterning compounds are applied via a scanning probe microscope tip.

5. The method of claim 1, wherein the transport medium is disposed between the tip and the substrate.

6. The method of claim 5, wherein the transport medium comprises water, hydrocarbons or a solvent for the second patterning compound.

7. The method of claim 1, wherein the second patterning compound is delivered from a scanning probe microscope tip to the substrate surface via capillary transport.

8. The method of claim 1, wherein the scanning probe microscope tip is coated with a hydrophobic compound.

9. The method of claim 1, wherein an alignment mark is used to align at least one scanning probe microscope tip.

10. The method of claim 1, wherein at least one of the first and second patterning compounds comprises a protein.

11. The method of claim 1, wherein at least one of the first and second patterning compounds comprises a nucleic acid.

12. The method of claim 1, wherein the scanning probe microscope tip is one of a plurality of tips which are coated with the second patterning compound and used for applying the second patterning compound to the substrate.

* * * * *